(12) United States Patent
Ishizu

(10) Patent No.: US 9,583,177 B2
(45) Date of Patent: Feb. 28, 2017

(54) MEMORY DEVICE AND SEMICONDUCTOR DEVICE INCLUDING MEMORY DEVICE

(71) Applicant: Semiconductor Energy Laboratory Co., Ltd., Atsugi-shi, Kanagawa-ken (JP)

(72) Inventor: Takahiko Ishizu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/962,472

(22) Filed: Dec. 8, 2015

(65) Prior Publication Data

US 2016/0172021 A1    Jun. 16, 2016

(30) Foreign Application Priority Data

Dec. 10, 2014   (JP) .................................. 2014-250006

(51) Int. Cl.
*G11C 5/04*        (2006.01)
*G11C 11/4096*     (2006.01)
(Continued)

(52) U.S. Cl.
CPC .......... *G11C 11/4096* (2013.01); *G11C 11/24* (2013.01); *G11C 11/403* (2013.01);
(Continued)

(58) Field of Classification Search
CPC ..................................... G11C 5/14; G11C 5/06
(Continued)

(56) References Cited

U.S. PATENT DOCUMENTS 6,195,287 B1 * 2/2001 Hirano ................. G11C 11/5621
365/185.03
7,369,434 B2    5/2008  Radke
(Continued)

FOREIGN PATENT DOCUMENTS

JP    2011-187950 A    9/2011
JP    2014-199707 A    10/2014
(Continued)

*Primary Examiner* — Michael Tran
(74) *Attorney, Agent, or Firm* — Fish & Richardson P.C.

(57) ABSTRACT

A memory cell retains (N−1)-bit data (N is an integer of more than 1) and an error detection bit. The memory cell has $2^N$ data states A_1 to A_$2^N$. Error detection bits for the data states A_i (i is 1 and an even number more than or equal to 4 and less than or equal to $2^N$) among the $2^N$ data states are assigned "1" (normal), and the error detection bits for the other data states are assigned "0" (abnormal). The memory cell is brought to have the state A_i by a writing operation. During a reading operation, the error detection bit is not read out from the memory cell. The error detection bit together with the (N−1)-bit data is read out for refresh. If the error detection bit is "0", refresh for bringing the error detection bit back to data state with the error detection bit "1" is performed.

22 Claims, 37 Drawing Sheets

(51) Int. Cl.
*G11C 11/24* (2006.01)
*G11C 11/403* (2006.01)
*G11C 11/405* (2006.01)
*G11C 11/56* (2006.01)

(52) U.S. Cl.
CPC ............ *G11C 11/405* (2013.01); *G11C 11/56* (2013.01); *G11C 11/565* (2013.01)

(58) Field of Classification Search
USPC .................................................. 365/63, 226
See application file for complete search history.

(56) References Cited

U.S. PATENT DOCUMENTS

| | | | |
|---|---|---|---|
| 7,441,072 B2 * | 10/2008 | Kunori | G11C 11/5621 365/189.011 |
| 8,339,828 B2 | 12/2012 | Yamazaki et al. | |
| 8,363,452 B2 | 1/2013 | Yamazaki et al. | |
| 8,406,038 B2 | 3/2013 | Saito et al. | |
| 8,482,974 B2 | 7/2013 | Saito et al. | |
| 8,614,916 B2 | 12/2013 | Nagatsuka et al. | |
| 8,619,454 B2 | 12/2013 | Yamazaki et al. | |
| 8,659,935 B2 | 2/2014 | Yamazaki et al. | |
| 8,804,396 B2 | 8/2014 | Yamazaki et al. | |
| 9,001,563 B2 | 4/2015 | Atsumi et al. | |
| 9,001,566 B2 | 4/2015 | Yamazaki et al. | |
| 9,007,813 B2 | 4/2015 | Saito et al. | |
| 9,129,703 B2 | 9/2015 | Saito | |
| 9,171,630 B2 | 10/2015 | Nagatsuka et al. | |
| 2002/0114194 A1 * | 8/2002 | Kunori | G11C 11/5621 365/185.33 |
| 2008/0151661 A1 * | 6/2008 | Takai | G11C 29/028 365/201 |
| 2008/0205139 A1 * | 8/2008 | Futatsuyama | G11C 11/5628 365/185.03 |
| 2009/0052244 A1 * | 2/2009 | Kunori | G11C 11/5621 365/185.03 |
| 2010/0329013 A1 * | 12/2010 | Shikata | G11C 16/0483 365/185.18 |
| 2011/0089417 A1 | 4/2011 | Yamazaki et al. | |
| 2011/0101351 A1 | 5/2011 | Yamazaki | |
| 2012/0037972 A1 | 2/2012 | Yoneda | |
| 2012/0113722 A1 * | 5/2012 | Aritome | G11C 11/5628 365/185.18 |
| 2013/0235665 A1 * | 9/2013 | Khaef | G11C 11/5628 365/185.03 |
| 2013/0258773 A1 * | 10/2013 | Honma | G11C 16/10 365/185.03 |
| 2014/0167041 A1 | 6/2014 | Yamazaki et al. | |
| 2014/0269087 A1 * | 9/2014 | Rhie | G11C 16/26 365/185.18 |
| 2014/0269099 A1 | 9/2014 | Nagatsuka et al. | |
| 2014/0286073 A1 | 9/2014 | Onuki | |
| 2014/0340953 A1 | 11/2014 | Yamazaki et al. | |
| 2015/0154069 A1 * | 6/2015 | Tuers | G06F 11/1072 714/773 |
| 2015/0262642 A1 | 9/2015 | Koyama | |

FOREIGN PATENT DOCUMENTS

| | | |
|---|---|---|
| JP | 2014-199708 A | 10/2014 |
| JP | 2014-209402 A | 11/2014 |

* cited by examiner

310

14

15

FIG. 35A
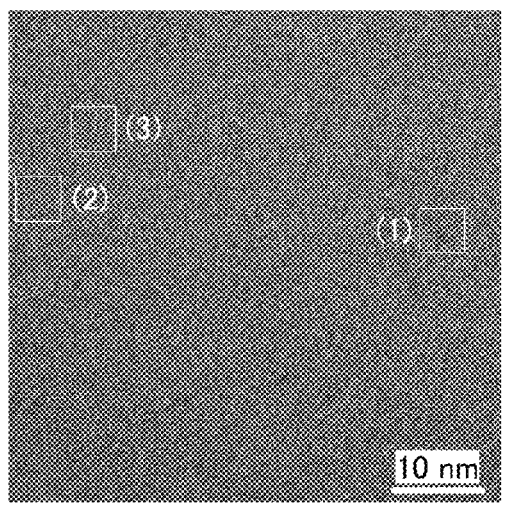
FIG. 35B FIG. 35C FIG. 35D
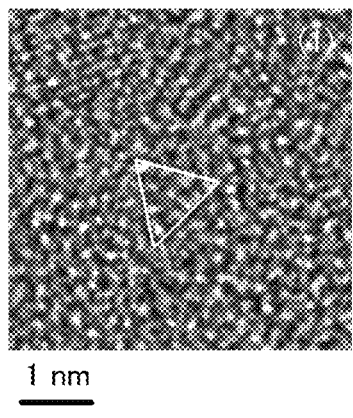 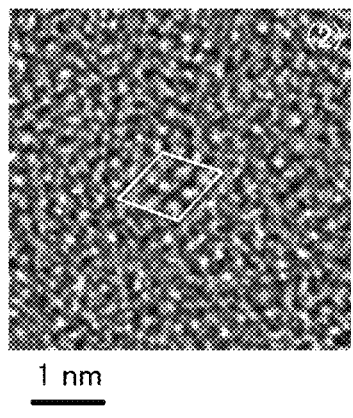 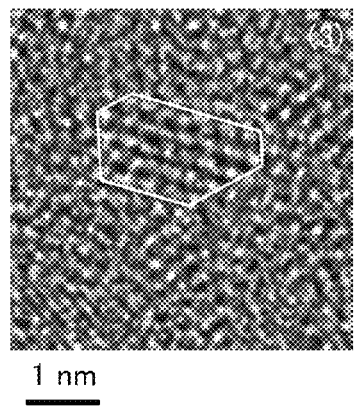

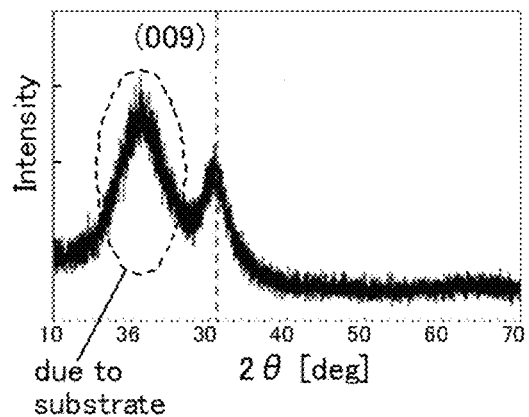
FIG. 36A out-of-plane method CAAC-OS
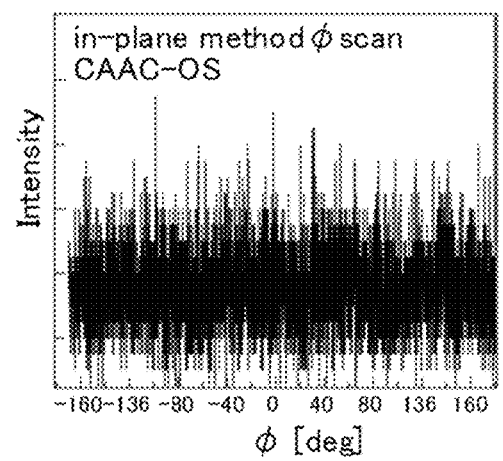
FIG. 36B
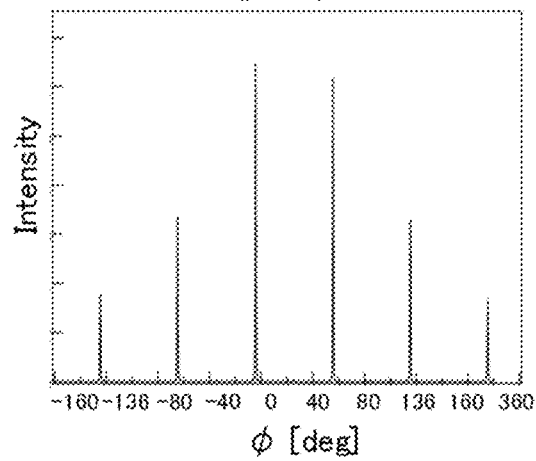
FIG. 36C in-plane method φ scan single crystal OS FIG. 37A
FIG. 37B
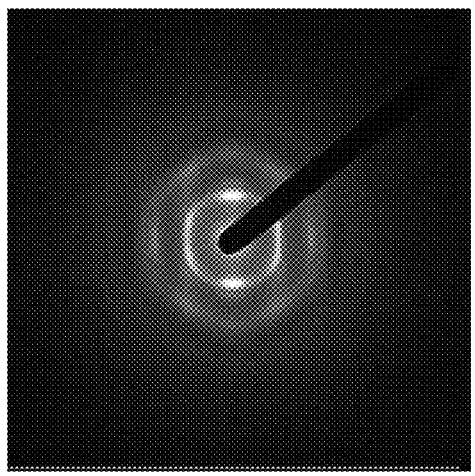
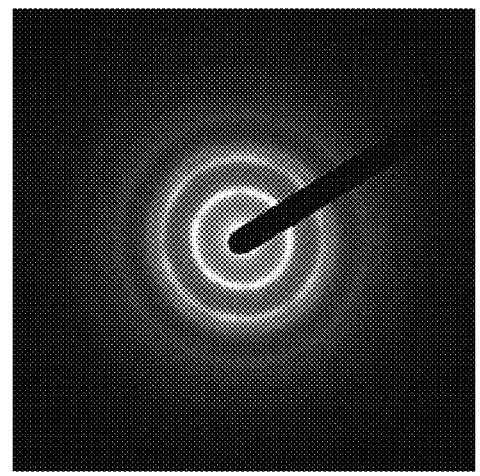

MEMORY DEVICE AND SEMICONDUCTOR DEVICE INCLUDING MEMORY DEVICE

BACKGROUND OF THE INVENTION

1. Field of the Invention

The specification, the drawings, and the scope of claims of the present application (hereinafter referred to as "this specification and the like") disclose a memory circuit, a logic circuit, a processing device, other semiconductor devices, a driving method thereof, a manufacturing method thereof, and the like. The technical field of one embodiment of the present invention is not limited thereto. For example, one embodiment of the present invention relates to a semiconductor device, a memory device, a processing device, an imaging device, a display device, a light-emitting device, a storage device, a driving method thereof, or a manufacturing method thereof.

2. Description of the Related Art

As memory cells used in random access memories (RAMs), 1T1C (one transistor-one capacitor)-type memory cells and 2T-type or 3T-type gain cells are known. Moreover, it has been proposed that a transistor whose channel in an active layer is formed of an oxide semiconductor (hereinafter also referred to as "an oxide semiconductor transistor" or "an OS transistor") is employed as a writing transistor in those memory cells.

For example, Patent Document 1 discloses a memory cell that can retain data even in the situation in which electric power is not supplied, by including the OS transistor as a writing transistor. For example, Patent Documents 2-4 disclose memory cells including an OS transistor and capable of multi-level data retention.

The microfabrication and storage of more levels of data of nonvolatile memory devices increase the possibility of errors. Therefore, an operation for detecting whether the retained data contains an error is performed. For example, in Patent Document 4, detection of an error is enabled by setting a memory cell to have more than $2^X$ data levels and making the memory cell retain X-bit data and an error bit. In a reading operation, $2^X$ levels of data are decoded and the confidence coefficient of the X-bit data is determined with the use of the error bit.

REFERENCE

Patent Document

[Patent Document 1] Japanese Published Patent Application No. 2011-187950
[Patent Document 2] Japanese Published Patent Application No. 2014-199707
[Patent Document 3] Japanese Published Patent Application No. 2014-199708
[Patent Document 4] Japanese Published Patent Application No. 2014-209402
[Patent Document 5] U.S. Pat. No. 7,369,434

SUMMARY OF THE INVENTION

An object of one embodiment of the present invention is to provide a novel semiconductor device, a method for operating the novel semiconductor device, and the like. An object of one embodiment of the present invention is to prevent the occurrence of an error bit, improve reliability, prevent an increase in delay time, reduce the area, suppress an increase in power consumption, and the like.

Note that the description of a plurality of objects does not mutually preclude the existence. One embodiment of the present invention does not necessarily achieve all of the objects described above. Objects other than those listed above are apparent from the description of the specification, drawings, claims, and the like and also such objects could be an object of one embodiment of the present invention.

One embodiment of the present invention is a memory device including a memory cell and a circuit. In the memory device, the memory cell is configured to retain (N−1)-bit data (N is an integer of more than 1) and an error detection bit. The memory cell has $2^N$ data states $A\_1$ to $A\_2^N$. The error detection bits for the data states $A\_i$ (i is 1 and an even number more than or equal to 4 and less than or equal to $2^N$) among the $2^N$ data states are assigned "1" (normal), and the error detection bits for the other data states are assigned "0" (abnormal). The circuit is electrically connected to the memory cell so as to write and read the (N−1)-bit data into/from the memory cell. In writing the (N−1)-bit data, the circuit brings the memory cell into the state $A\_i$. The circuit reads out the error detection bit together with the (N−1)-bit data and, if the error detection bit is "0", brings the memory cell back to the data state with the error detection bit "1". During a reading operation, the circuit does not read out the error detection bit from the memory cell.

Another embodiment of the present invention is a memory device which includes a memory cell and a circuit. In the memory device, the memory cell is configured to retain 1-bit data of "0" or "1", and the memory cell is in any of four data states which are a state $A\_1$, a state $A\_2$, a state $A\_3$, and a state $A\_4$. $V\_1$, $V\_2$, and $V\_3$ are voltages. A threshold level of the state $A\_1$ is lower than $V\_1$, a threshold level of the state $A\_2$ is higher than $V\_1$ and lower than $V\_2$, a threshold level of the state $A\_3$ is higher than $V\_2$ and lower than $V\_3$, and a threshold level of the state $A\_4$ is higher than $V\_3$. The circuit is electrically connected to the memory cell so as to write 1-bit data into the memory cell and read out 1-bit data from the memory cell. The circuit is configured to: bring the memory cell into the state $A\_1$ at the time of writing "0" into the memory cell and bring the memory cell into the state $A\_4$ at the time of writing "1" into the memory cell; make a first determination whether a threshold of the memory cell is lower than $V\_1$, make a second determination whether the threshold of the memory cell is lower than $V\_2$, make a third determination whether the threshold of the memory cell is lower than $V\_3$, make the second determination and read out 1-bit data from the memory cell, make the first to third determinations and, if the memory cell is in the state $A\_2$, bring the memory cell into the state $A\_1$, and make the first to third determinations and, if the memory cell is in the state $A\_3$, bring the memory cell into the state $A\_4$.

In the above-described embodiment, the memory cell may include a capacitor configured to hold a voltage of a storage node and a transistor configured to control charging and discharging of the storage node. An active layer of the transistor is preferably include an oxide semiconductor.

One embodiment of the present invention enables a novel semiconductor device or a method for operating the novel semiconductor device to be provided. One embodiment of the present invention enables prevention of the occurrence of an error bit, an improvement in reliability, prevention of an increase in delay time, a reduction in the area, suppression of an increase in power consumption, and the like.

Note that the description of the plurality of effects does not disturb the existence of other effects. In one embodiment of the present invention, there is no need to achieve all of the effects described above. In one embodiment of the present invention, an object other than the above-described objects, an effect other than the above-described effects, and a novel feature will be apparent from the description of the specification and the drawings.

BRIEF DESCRIPTION OF THE DRAWINGS

In the accompanying drawings:

FIGS. 35A to 35D are Cs-corrected high-resolution TEM images of a plane of a CAAC-OS;

FIGS. 36A to 36C show structural analysis by XRD of a CAAC-OS and a single crystal oxide semiconductor;

FIGS. 37A and 37B show electron diffraction patterns of a CAAC-OS; and

DETAILED DESCRIPTION OF THE INVENTION

Figure 1A:
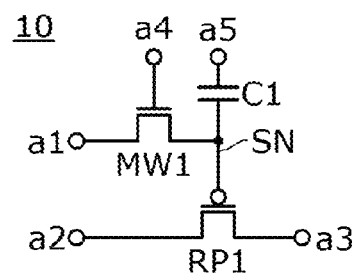
FIGS. 1A to 1D are circuit diagrams showing structure examples of a memory cell.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, a chip including an integrated circuit, and an electronic component obtained by incorporating a chip in a package are all semiconductor devices. Moreover, a memory device, a display device, a light-emitting device, a lighting device, an electronic device, and the like themselves might be semiconductor devices, or might each include a semiconductor device.

For example, in this specification and the like, a description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Here, X and Y each denote an object (e.g., a device, an element, a circuit, a wiring, an electrode, a terminal, a conductive film, and a layer).

A transistor is an element having three terminals: a gate, a source, and a drain. The gate can serve as a control node for controlling the on/off state of the transistor. Depending on the type of the transistor or levels of potentials applied to the terminals, one of two input/output terminals functioning as a source and a drain functions as the source and the other functions as the drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductive layer, a conductor, an impurity region, or the like in accordance with a circuit configuration, a device structure, and the like. Furthermore, a terminal, a wiring, and the like can be referred to as a node.

A voltage usually refers to a potential difference between a given potential and a reference potential (e.g., a ground potential (GND) or a source potential). Thus, a voltage can be referred to as a potential. Note that the potential indicates a relative value. Accordingly, "ground potential" does not necessarily mean 0 V.

Note that in this specification, the terms "film" and "layer" can be interchanged depending on the case or circumstances. For example, a term "conductive layer" can be replaced with a term "conductive film" in some cases. For example, a term "insulating film" can be replaced with a term "insulating layer" in some cases.

In this specification and the like, ordinal numbers such as "first", "second", and "third" may be used to indicate the order. Furthermore, ordinal numbers may be used to avoid confusion among components; in this case, the terms do not limit the components numerically or do not limit the order. Moreover, for example, it is possible to replace the term "first" with the term "second" or "third" in describing one embodiment of the present invention.

In this specification and the like, a power supply voltage VDD may be abbreviated to a voltage VDD, VDD, or the like, for example. The same applies to other components (e.g., signal, voltage, potential, circuit, element, electrode, and wiring).

Furthermore, when the same reference numerals need to be distinguished from each other, a symbol for identification such as "_1", "_2", "[n]", "[m, n]", or the like may be added to the reference numerals. For example, in the case where a plurality of wirings WWL in a memory cell array are distinguished from each other, the second wiring WWL may be expressed as the wiring WWL_2 using an address number (row number) in the memory cell array.

In the drawings, the size, the thickness of a layer, or a region is sometimes exaggerated for simplicity. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over" and "under," are used for convenience for describing the positional relationship between components with reference to drawings in some cases. Furthermore, the positional relation between components is changed as appropriate in accordance with the direction in which the components are described. Thus, the positional relation is not limited to that described with the terms used in this specification and can be explained with other terms as appropriate depending on the situation.

Note that the layout of circuit blocks in a block diagram illustrated in a drawing specifies the positional relation for description. Thus, even when a drawing shows that different functions are achieved in different circuit blocks, an actual circuit block may be configured so that the different functions are achieved in the same circuit block. Furthermore, functions of circuit blocks are specified for description, and even when a diagram shows one circuit block performing given processing, a plurality of circuit blocks may be actually provided to perform the processing.

Embodiments of the present invention will be described below. Note that the embodiments can be combined as appropriate. In addition, in the case where a plurality of structure examples (including operation examples and manufacturing method examples) are given in one embodiment, any of the structure examples can be combined as appropriate. Furthermore, the present invention can be implemented in various different modes, and it will be readily apparent to those skilled in the art that various changes and modifications in modes and details thereof can be made without departing from the purpose and scope of the present invention. Thus, the present invention should not be interpreted as being limited to the following description of the embodiments.

Embodiment 1

In this embodiment, a memory device is described as an example of a semiconductor device.

<<Structure Example of Memory Cell>>

FIG. 1A illustrates a structure example of a memory cell of a memory device. A memory cell 10 illustrated in FIG. 1A includes a transistor MW1, a transistor RP1, a capacitor C1, a node SN, and nodes a1 to a5. The memory cell 10 is what is called a 2T-type gain cell.

The node SN is a data storage node and can be brought into an electrically floating state. The capacitor C1 can function as a storage capacitor that holds the voltage of the node SN. The capacitor C1 is electrically connected to the node SN and the node a5. The node a1 is a data input node, and the node a2 is a data output node. Depending on the structure of the memory cell array, the node a1 and the node a2 may be electrically connected to the same wiring or different wirings. The nodes a3 to a5 are electrically connected to different wirings from one another. Fixed voltages or signals for driving the memory cell 10 are input to the wirings electrically connected to the nodes a1 to a5. For example, the node a3 can function as a data input node by employing a certain driving method of the memory cell 10.

The transistor MW1 is a pass transistor that controls a conduction state between the node a1 and the node SN. The transistor MW1 is a writing transistor, and is turned on during a writing operation. When the transistor MW1 is on, a voltage of the node a1 is written into the node SN. Then, the transistor MW1 is turned off to bring the node SN into an electrically floating state and thereby the memory cell 10 into a data retention state.

The transistor RP1 is a reading transistor. A gate of the transistor RP1 is electrically connected to the node SN, and a source-drain current (hereinafter referred to as "drain current") of the transistor RP1 changes depending on the voltage of the node SN. In a reading operation, after being precharged at a predetermined voltage, the node a2 is brought into an electrically floating state. Depending on the drain current of the transistor RP1, the node a2 is charged or discharged. In accordance with the change in the voltage of the node a2, the drain current of the transistor RP1 is decreased, and when the voltage between the node SN and the node a2 exceeds a threshold of the transistor RP1, the drain current stops flowing. By detecting the voltage of the node a2, data written into the memory cell 10 can be found.

The memory cell 10 can perform multi-level ($2^N$-level, where N is an integer of more than 1) retention such as four-, eight-, and sixteen-level retention as well as two-level retention, by adjusting the voltage written into the node SN. In other word, by setting at least $2^N$ (N is an integer of more than 1) data states in the memory cell 10, the memory cell 10 can perform $2^{(N-1)}$-level data retention.

In order to increase the retention time of the memory cell 10, it is preferable to suppress a variation in the voltage (particularly, a voltage drop) of the node SN in an electrically floating state as much as possible. One means of achieving this is to use a transistor with extremely low drain current in an off state (off-state current) as the transistor MW1.

To reduce the off-state current of a transistor, an active layer of the transistor may contain a semiconductor with a wide energy gap, for example. The energy gap of the semiconductor is preferably greater than or equal to 2.5 eV, greater than or equal to 2.7 eV, or greater than or equal to 3 eV. An example of such a semiconductor is an oxide semiconductor. For example, an OS transistor whose active layer contains an oxide semiconductor is used as the transistor MW1. The leakage current of an OS transistor normalized by the channel width can be lower than or equal to $10 \times 10^{-21}$ A/μm (10 zA/μm) with a source-drain voltage of 10 V at room temperature (approximately 25° C.). It is preferable that the leakage current of the OS transistor used as the transistor MW1 be lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the leakage current is preferably lower than or equal to $1 \times 10^{-15}$ A, lower than or equal to $1 \times 10^{-18}$ A, or lower than or equal to $1 \times 10^{-21}$ A at 85° C.

Thus, by using an OS transistor as the transistor MW1, a variation in the voltage of the node SN in an electrically floating state can be suppressed. Therefore, the memory cell 10 can retain data for a long time and can operate as a nonvolatile memory circuit.

Note that during the period in which the node SN is in an electrically floating state, a voltage that makes the transistor MW1 completely in an off state keeps being input to a gate of the transistor MW1, in some cases. Alternatively, in the case where a back gate is provided in the transistor MW1, a voltage that makes the transistor MW1 in a normally-off state keeps being input to the back gate, in some cases. In these cases, although a voltage is supplied to the memory cell 10, a current hardly flows and little power is consumed in the memory cell 10. Since substantially zero electric power is consumed for data retention in the memory cell 10 even when a voltage is supplied, the memory cell 10 can be regarded as a nonvolatile memory circuit.

An oxide semiconductor is a semiconductor which has a large energy gap and in which electrons are unlikely to be excited and the effective mass of a hole is large. Accordingly, an avalanche breakdown and the like are less likely to occur in an OS transistor than in a generally-used transistor using silicon or the like. Since hot-carrier degradation or the like due to the avalanche breakdown is inhibited, the OS transistor has high drain withstand voltage and can be driven at high drain voltage. Accordingly, the use of the OS transistor as the transistor MW1 can provide a wide margin for driving conditions such as the voltage level of a signal and input timing. For example, the memory cell 10 can be driven such that the voltage of the node SN is high in the data retention state.

The active layer of the OS transistor preferably includes an oxide that contains one or more elements selected from In, Ga, Sn, and Zn as constituent element(s). Examples of such an oxide are an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, and a Zn oxide. In addition, the oxide may contain an element or a compound other than the constituent elements of the oxide and may be, for example, an oxide semiconductor containing $SiO_2$.

Since an OS transistor includes an active layer formed of an oxide semiconductor with a wide band gap, short-channel effects are unlikely to occur. Even when a gate insulating layer is formed thick to have, for example, an equivalent oxide thickness of more than or equal to 11 nm and less than or equal to 15 nm and the channel length is set to be as short as, for example, more than or equal to 20 nm and less than or equal to 60 nm, the OS transistor can have tremendously favorable off-state current characteristics and subthreshold characteristics. Since a gate insulating layer in the OS transistor can be thicker than that in a Si transistor generally used in a logic circuit, a leakage current through the gate insulating layer can be reduced and a variation in electric characteristics due to a variation in the thickness of the gate insulating layer can be suppressed. Details of the OS transistor are described in Embodiment 3.

Figure 1B:
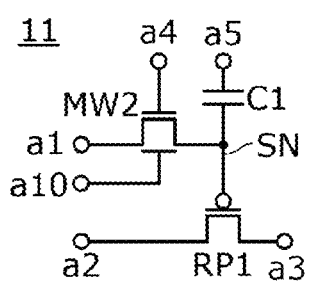
Figure 1C:
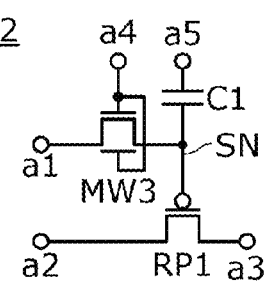

The transistor MW1 may be provided with a back gate. Examples of such a case are illustrated in FIGS. 1B and 1C. A memory cell 11 illustrated in FIG. 1B and a memory cell 12 illustrated in FIG. 1C are variations of the memory cell 10.

In the memory cell 11, a back gate of a transistor MW2 is electrically connected to a node a10. A fixed voltage or a signal is input to the node a10. A threshold voltage of the transistor MW2 can be controlled with a voltage of the node a10. For example, the off-state current of the transistor MW2 can be decreased by controlling the threshold voltage, whereby the memory cell 11 can have higher retention characteristics. In the memory cell 12, a gate and a back gate of a transistor MW3 are electrically connected to each other, and this improves a current driving capability of the writing transistor (the transistor MW3) of the memory cell 12, leading to a reduction in writing time.

Figure 1D:
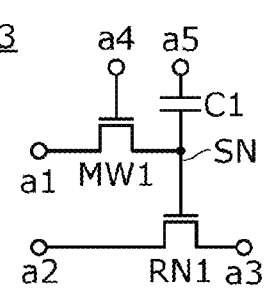

The transistor RP1 is not particularly limited and may be a general transistor, for example, a transistor whose active layer contains a Group 14 element (Si, Ge, C). A typical example of such a transistor is a transistor whose active layer contains silicon (Si transistor). For the purpose of improving the mobility of a Si transistor or for other purposes, a distortion transistor where Ge is added to an active layer containing Si may be used. An n-type reading transistor RN1 may be used as in a memory cell 13 illustrated in FIG. 1D.

The memory cells 10 to 13 illustrated in FIGS. 1A to 1D are capable of multi-level data ($2^N$-level data, where N is an integer of more than 1) retention. In other words, the memory cells 10 to 13 have $2^N$ or more data states (also referred to as bit states). In this embodiment, by utilizing the multi-level data retention performance, a data state in which an error bit is likely to occur can be detected and the memory cell can be refreshed to return to a normal or stable data state. With this structure example, the occurrence of an error bit can be effectively reduced and the reliability of the memory device can be improved. This will be described below taking the memory cell 10 as an example.

<<Example 1 of Threshold Correction Method of Memory Cell>>

Figure 2:
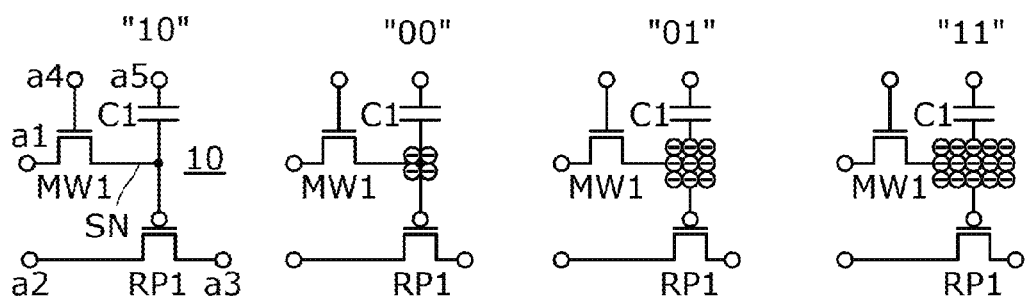
FIG. 2 schematically shows four data states of a memory cell.

FIG. 2 schematically shows data states of the memory cell 10. The threshold voltage (also referred to as "threshold") of the memory cell 10 varies depending on the quantity of accumulated charges in the node SN. In other words, the threshold of the memory cell 10 is determined by the voltage of the node SN. Here, the memory cell 10 has four data states called data sates A to D. The quantity of accumulated charges in the node SN increases in the order of the data states A, B, C, and D. It is assumed here that the node SN in the data state A has no accumulated charge.

Figure 3A:
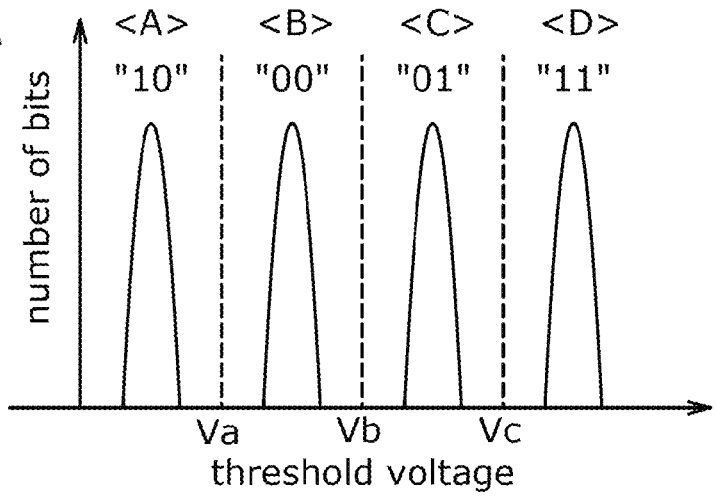
FIGS. 3A to 3C schematically show distributions of threshold voltages of a memory cell.
Figure 3B:
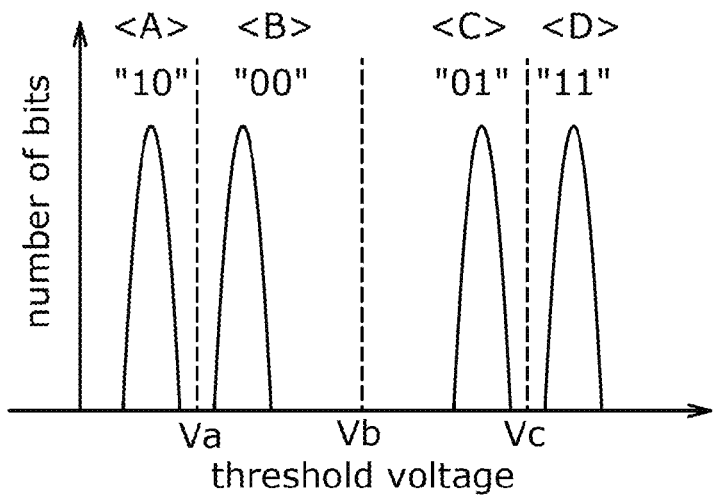
Figure 3C:
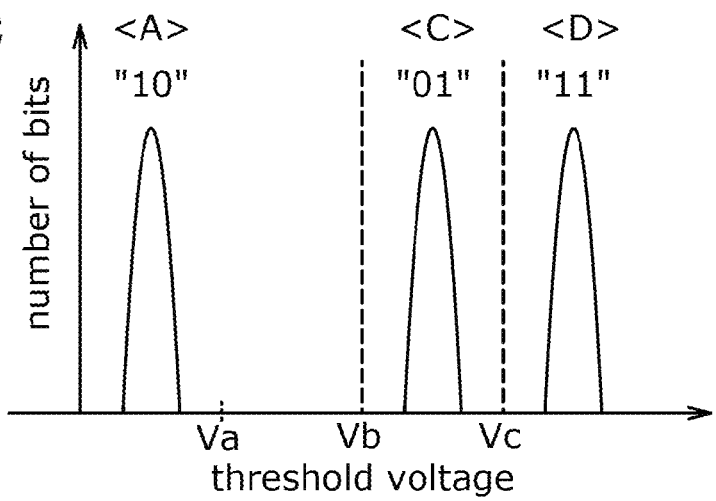

FIGS. 3A to 3C schematically show distributions of threshold voltages of the memory cell 10. Considering the process variation, the thresholds of the memory cell 10 each have a distribution width. Three voltages Va, Vb, and Vc are set to distinguish the four data states from one another. Note that Va, Vb, and Vc are boundary values of the threshold levels for distinguishing the adjacent data states from each other, and in addition can be used as reading voltages for reading the four-level (2-bit) data.

By defining one-to-one correspondences between the states A to D and the 2-bit data, the memory cell 10 can perform four-level retention. Here, the states A, B, C, and D correspond to 2-bit data "10", "00", "01", and "11", respectively. The high-order bit of the 2-bit data is used as an error detection bit, and the low-order bit thereof is used as a data bit. That is, the error detection bits for the data states A and D having the maximum and minimum threshold levels are assigned "1" (normal), and the error detection bits for the data states B and C having middle threshold levels are assigned "0" (abnormal).

For example, an error bit occurs in the memory cell 10 in the following manner. In the memory cell 10 in the data state D, after a certain period of time has passed, accumulated charges in the node SN leak, causing a threshold decrease. When the threshold becomes lower than Vc, the memory cell 10 changes from the data state D to the data state C. Moreover, in the memory cell 10 in the data state A, charges may be unintentionally injected to the node SN by read disturb or the like, causing a threshold increase in the memory cell 10. When the threshold becomes higher than Va, the memory cell 10 changes from the data state A to the data state B.

(Threshold Correction Operation)

In consideration of these situations, the threshold of the memory cell 10 is corrected on a regular or irregular basis. Specifically, whether the data state in the memory cell 10 is normal or abnormal (the state in which an error bit is likely to occur) is determined using the error detection bit, and the threshold of the memory cell 10 is corrected in accordance with the determination result.

The 1/0 determination of the error detection bit is performed by reading the error detection bit from the memory cell 10 and determining whether it is "1" (normal) or "0" (abnormal). If the 1/0 determination result is "0", rewriting (refresh) is performed. Refresh is performed on at least the memory cell 10 from which "0" is detected, and refresh may be performed on the word, page, or the like containing the memory cell 10. By this refresh, the data state B of the memory cell 10 is returned to the data state A, and the data state C is returned to the data state D.

The 1/0 determination of the error detection bit can be performed by, for example, reading out four-level data from the memory cell 10. To read the four-level data, Va, Vb, and Vc are used as reading voltages. Which of the data states A to D the memory cell 10 falls into is determined from the read out four-level data. In the case where the memory cell 10 is in the data state B ("00"), the data state is changed back to the data state A ("10"), and in the case where the memory cell 10 is in the data state C ("01"), the data state is changed back to the data state D ("11"). In the case where refresh is performed on the basis of a word, page, or the like, the read out four-level data is written back to the memory cell 10 from which the error detection bit "1" (normal) is read out.

Thus, when the error detection bit of the read out four-level data is "0", four-level data with the error detection bit modified to "1" is written back to the memory cell 10, and when the error detection bit is "1", the read out four-level data is written back to the memory cell 10. Since data writing into the memory cell 10 is performed by charging the capacitor C1, electric power necessary for data writing is small, compared with that of a flash memory. Furthermore, degradation is not caused by writing in principle; accordingly, there is substantially no limitation on the number of rewriting cycles. Therefore, the memory cell 10 is capable of refresh with little electric power. Moreover, the memory cell 10 is not degraded by refresh.

(Writing Operation)

In this example, the memory cell 10 functions as a single-level cell (SLC) that retains two-level (1-bit) data and stores "0" or "1". For storage of "0", a writing voltage for bringing the memory cell 10 into the data state A is input to the node a1. For storage of "1", a writing voltage for bringing the memory cell 10 into the data state D is input to the node a1. By turning on the transistor MW1, the voltage of the node a1 is written into the node SN, so that the memory cell 10 is brought into the data state A or D. As the writing voltages, the voltages for bringing the memory cell 10 into the state with the error detection bit "1" are set.

(Reading Operation)

In a reading operation, the value of the data bit is detected. Here, the error detection bit is not detected. In this example, the least significant bit is read out. By using only Vb as the reading voltage, whether the read out data is "0" or "1" can be determined. To read out the data bit, Vb is input to the node a3 or the node a2, and a change in the voltage of the node a2 is detected.

That is, in the reading operation, the memory cell 10 in the data state B or the data state C is regarded as a memory cell in the "normal" data state retaining the data bit "0" or "1". In this way, the margin in the reading operation is increased. Since the error detection bit is not read out, the reading operation can be performed at high speed.

In the above-described example, the substantial storage capacity of the memory cell 10 is 2 values (1 bit) per cell, which is the same as that of an SLC. Because a standard SLC performs 1/0 determination of a data bit using one determination threshold, even when the threshold varies and becomes close to the determination threshold, it is impossible to detect the closeness and leaving this state causes the occurrence of an error bit. In contrast, in this embodiment, by the 1/0 determination of the error detection bit, the memory cell 10 in the data state in which an error bit is likely to occur can be detected. Moreover, since the detected threshold of the memory cell 10 is set back to the normal value (initial value), an error bit can be prevented from occurring. Thus, by using the memory cell of this embodiment, a highly reliable memory device can be provided.

In this embodiment, the memory cell 10 having a high possibility of causing an error bit is predicted by making the data to which the error detection bit is added be retained in the memory cell 10. That is, the 1/0 determination of the error detection bit is not the detection of whether an error bit is occurring but the prediction of the occurrence of an error bit. The error detection bit can also be referred to as an error prediction bit. For example, there is a case in which the threshold of the memory cell 10 is lowered to bring the memory cell 10 from the data state D into the date state C and then further lowered to bring it from the date state C into the data state B. An error bit does not occur until the memory cell 10 is brought into the data state B. In this embodiment, the detection of the data state C prevents an error bit from occurring in the memory cell 10. Therefore, to certainly prevent the occurrence of an error bit, the cycle of the 1/0 determination of the error detection bit (refresh cycle) is determined in consideration of the retention time of the memory cell 10.

Since the transistor MW1 is an OS transistor, the memory cell 10 can retain data for more than one year. For example, by setting the refresh cycle at one time per day, one time per hour, or one time per minute, the occurrence of an error bit can be prevented in a memory device including the memory cell 10. For example, refresh may be performed at the time when a main power supply for this memory device is turned on or off.

<<Retention Time of Memory Cell>

Taking the memory cell 10 as an example, the long-term data retention capability, for example, a 10-year data retention capability under a 85° C. environment, which is enabled by the usage of an OS transistor as a writing transistor, will be described.

In the case where the storage capacity of the memory cell 10 is 1 bit, under conditions where the power supply voltage is higher than or equal to 2 V and lower than or equal to 3.5 V, the capacity of the capacitor C1 (storage capacity of the node SN) is 21 fF, and the allowable variation in the retention voltage is less than 0.5 V, the leakage current from the node SN needs to be less than $33 \times 10^{-24}$ A in order to achieve the 10-year variation in the retention voltage of less than 0.5 V at 85° C. In the case where the leakage from other places is smaller and only the transistor MW1 (writing transistor) is a substantial leakage point, when the channel width of the transistor MW1 is 350 nm, the leakage current per unit area of the transistor MW1 is preferably lower than $93 \times 10^{-24}$ A/μm. With the above-described structure, the memory cell 10 can retain data for 10 years at 85° C.

In the case where the storage capacity of the memory cell 10 is 4 bits, under conditions where the power supply voltage is higher than or equal to 2 V and lower than or equal to 3.5 V, the capacity of the capacitor C1 is 0.1 fF, the interval between threshold distributions of the memory cell 10 is less than 30 mV, and the allowable variation in the retention voltage is less than 80 mV, the leakage current from the node SN needs to be less than $0.025 \times 10^{-24}$ A in order to achieve the 10-year variation in the retention voltage of less than 80 mV at 85° C. In the case where the leakage from other places is smaller and only the transistor MW1 is a substantial leakage point, when the channel width of the transistor MW1 is 60 nm, the leakage current per unit area of the transistor MW1 is preferably lower than $0.423 \times 10^{-24}$ A/μm. With the above-described structure, the memory cell 10 can retain data for 10 years at 85° C.

In the case where the storage capacity of the memory cell 10 is 8 bits, under conditions where the power supply voltage is higher than or equal to 2 V and lower than or equal to 3.5 V, the capacity of the capacitor C1 is 0.1 fF, the interval between threshold distributions of the memory cell 10 is less than 2 mV, and the allowable variation in the retention voltage of the node SN is less than 5 mV, the leakage current from the node SN needs to be less than $0.0016 \times 10^{-24}$ A in order to achieve the 10-year variation in the retention voltage of less than 5 mV at 85° C. In the case where the leakage from other places is smaller and only the transistor MW1 is a substantial leakage point, when the channel width of the transistor MW1 is 60 nm, the leakage current per unit area of the transistor MW1 is preferably lower than $0.026 \times 10^{-24}$ A/μm. With the above-described structure, the memory cell 10 can retain data for 10 years at 85° C.

<Other Examples of Threshold Distribution>

FIG. 3A shows a non-limiting example in which the interval between threshold distributions of the data states A to D is constant. By the threshold distribution, reliability of a writing operation and a reading operation can be improved. Other examples of the threshold distribution of the memory cell 10 are shown in FIGS. 3B and 3C.

FIG. 3B shows an example in which the interval between threshold distributions of the data states A to D is not constant. The interval between the threshold distribution of the data state B and that of the data state C is the longest, which increases the margin in reading a data bit, improving the reliability of the reading operation. The interval between the threshold distribution of the data state A and that of the data state B and the interval between the threshold distribution of the data state C and that of the data state D correspond to margins in reading an error detection bit. By setting a short interval between the threshold distribution of the data state A and that of the data state B, the data state B can be detected before a change from the data state A to the data state C is caused. Furthermore, by setting a short interval between the threshold distribution of the data state C and that of the data state D, the data state C can be detected before a change from the data state D to the data state B is caused. Thus, such short intervals between the threshold distributions of the data states A and B and between the threshold distributions of the data states C and D can improve the reliability of the 1/0 determination of an error detection bit, resulting in an improvement in the reliability of the reading operation. Therefore, the reliability of a memory device including the memory cell 10 can be improved.

FIG. 3C shows an example in which the number of data states in the memory cell 10 is three. The data state A is the state in which no charge is accumulated in the node SN (FIG. 2). In the retention state, the threshold of the memory cell 10 in the data state A is not decreased by the leakage of the accumulated charges from the node SN. In this state, if an increase in threshold by read disturb or the like is negligible, only the error detection bit "1" (normal) may be assigned for the data bit "0".

As shown in FIG. 3C, the data states of the memory cell 10 can be reduced to three data states A, C, and D. Thresholds (reading voltages) used for the 1/0 determination of an error detection bit are Vb and Vc. By reducing the number of data states, time for refresh (threshold correction operation) can be shortened. In addition, since the number of operating voltages can be reduced, the scale of a peripheral circuit for driving the memory cell 10 can be reduced.

Although an example of the threshold correction method in the case where 1 data bit is used has been described here, the data bit can be more than 1 bit. An example of the threshold correction method in the case where 2 data bits are used will be described below.

<<Example 2 of Threshold Correction Method of Memory Cell>>

Figure 4A:
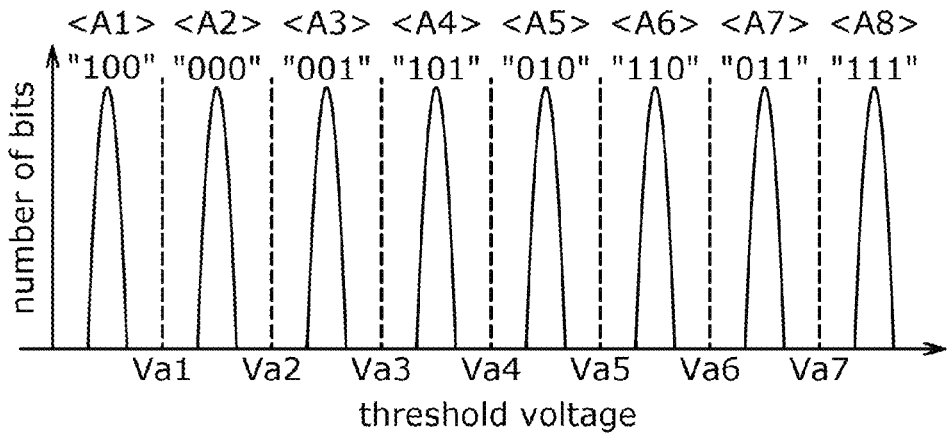
FIGS. 4A to 4C schematically show distributions of eight threshold voltages of a memory cell.

Here, an example of the threshold correction method in the case where 2 data bits are used is described. In this case, eight data states are defined in the memory cell 10 for 8-level (3-bit) retention. These eight data states are referred to as data states A1 to A8. FIG. 4A schematically shows the distribution of threshold voltages of the memory cell 10.

To each of the data states A1 to A8, 3-bit data is assigned. In the 3-bit data, the most significant bit is the error detection bit, and the remaining two bits are data bits. A pair of adjacent data states (e.g., A1 and A2) have the same data bits assigned. The error detection bit is assigned "1" (normal) or "0" (abnormal) alternately from the data state A8 having the highest threshold level, with an exception in the data state A1 having the lowest threshold level assigned "1" (normal) and the data state A2 assigned "0" (abnormal).

To read out 3-bit data, seven reading voltages Va1 to Va7 are set. Note that Va1 to Va7 are boundary values of the threshold for distinguishing the adjacent data states from each other.

(Writing Operation)

The memory cell 10 functions as a multi-level cell (MLC) that retains 2-bit data. The data written into the memory cell 10 is 2-bit data. For example, for storage of "00", a writing voltage for bringing the memory cell 10 into the data state A1 is input to the node a1. For storage of "10", a writing voltage for bringing the memory cell 10 into the data state A6 is input to the node a1. By turning on the transistor MW1, the voltage of the node a1 is written into the node SN. When 2-bit data "00", "01", "10", and "11" are written, 3-bit data "100", "101", "110", and "111" are stored in the memory cell 10, respectively.

(Reading Operation)

In the reading operation, the two low-order bits of the 3-bit data stored in the memory cell 10 are read out, and the 1/0 determination of the error detection bit is not performed. Thus, three voltages Va2, Va4, and Va6 are used as reading voltages. The data read out from the memory cell 10 is 2-bit data.

(Threshold Correction Detection Operation)

In the threshold correction detection operation, which of the data states A1 to A8 the memory cell 10 falls into is detected. Using the seven voltages Va1 to Va7 as reading voltages, 3-bit data is read out from the memory cell 10. When the most significant bit of the read out data being "0" is detected, the corresponding memory cell 10 is refreshed or the word or page containing the memory cell 10 is refreshed.

<Other Examples of Threshold Distribution>

Figure 4B:
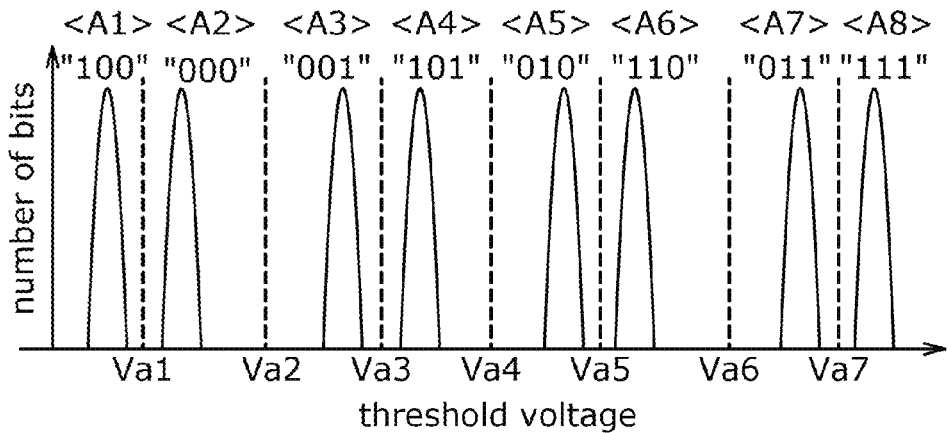

FIG. 4A shows a non-limiting example in which the interval between threshold distributions of the data states A1 to A8 is constant. FIG. 4B shows an example in which the interval between threshold distributions of the data states A1 to A8 is not constant. The interval between a threshold distribution and an adjacent threshold distribution having the same data bit is shorter than the interval between the threshold distribution and the other adjacent threshold distribution having a different data bit. For example, the interval between the data states A1 and A2 is shorter than the interval between the data states A2 and A3. By having the threshold distribution shown in FIG. 4B, the memory cell 10 can have an increased margin in reading an error detection bit and data bits; accordingly, the reliability of the threshold correction operation and the reading operation can be improved.

Figure 4C:
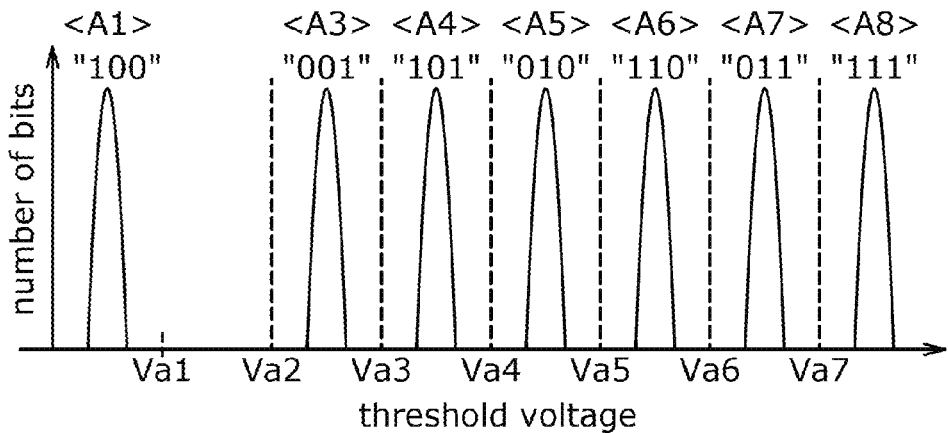

If an increase in threshold by read disturb or the like is negligible, only the error detection bit "1" (normal) may be assigned for "00". In this case, as shown in FIG. 4C, seven data states A1 and A3 to A8 can be set in the memory cell 10. Six reading voltages Va2 to Va7 are used to read an error detection bit, and three reading voltages Va2, Va4, and Va6 are used to read data bits.

The storage capacity of the memory cell 10 is not limited to 2 bits ($2^2$ values) or 3 bits ($2^3$ values). In the case where the memory cell 10 retains (N−1)-bit data (N is an integer of more than 1), $2^N$ data states A1 to A$2^N$ are set so that the memory cell 10 can retain N-bit ($2^N$-value) data.

The N-bit data retained in the memory cell 10 is composed of an error detection bit which is the most significant bit and data bit(s) which is/are the low-order (N−1) bit(s). A pair of adjacent data states have the same data bit(s) assigned. The error detection bit is assigned "1" (normal) or "0" (abnormal) alternately from the data state having the highest threshold level, with an exception in the data state A1 having the lowest threshold level assigned "1" (normal) and the data state A2 having the second lowest threshold level assigned "0" (abnormal).

To distinguish $2^N$ data states A1 to A$2^N$ from each other, ($2^N$−1) voltages Va1 to Va($2^N$−1) are set. The threshold level of the data state A1 is lower than Va1, and the threshold level of the data state A$2^N$ is higher than Va($2^N$−1). The threshold level of the data state Ah (h is an integer more than or equal to 2 and less than or equal to ($2^N$−1)) is higher than Va(h−1) and lower than Vah.

For data bit writing, $2^{(N-1)}$ writing voltages each of which brings the memory cell 10 into any one of the data states Aj (j is 1 and an even number more than or equal to 4 and less than or equal to $2^N$) are used. For data bit reading, ($2^{(N-1)}$−1) voltages Vak (k is an even number of more than or equal to 2 and less than or equal to ($2^N$−2)) are used as reading voltages. For error detection bit reading, ($2^N$−1) voltages Va1 to Va($2^N$−1) are used as reading voltages.

As described above, the data state A2 is not necessarily set in the memory cell 10. In this case, the voltage Va2 is not set. For error detection bit reading, ($2^N$−2) voltages Va1 and Va3 to Va($2^N$−1) are used as reading voltages, and the determination whether the threshold of the memory cell 10 is lower than Va1 is not performed.

<<Structure Example 1 of Memory Device>>

Figure 5:
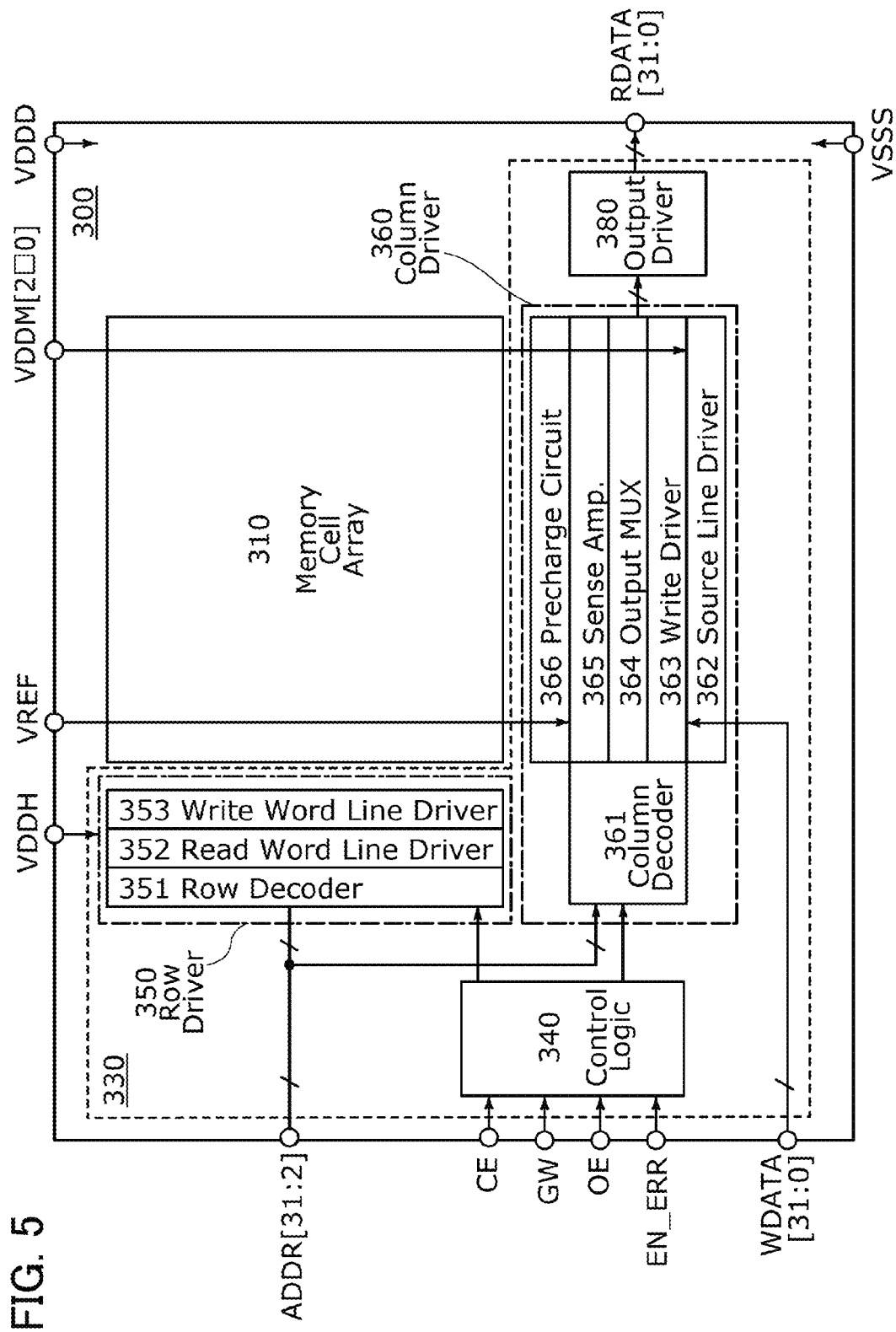
FIG. 5 is a block diagram illustrating a structure example of a memory device.

FIG. 5 illustrates a structure example of a memory device. A memory device 300 illustrated in FIG. 5 can be used as a random access memory and includes a memory cell array 310 and a peripheral circuit 330. The memory cell array 310 and the peripheral circuit 330 can be provided on one chip.

FIG. 5 illustrates an example in which the processing data is 32 bits. ADDR is address data whose two low-order bits of the address space are used for an offset address. WDATA is writing data, and RDATA is read out data.

Further, VDDD, VSSS, VREF, VDDH, and VDDM[2:0] are fixed voltages input from the outside. Note that VDDD is a high-level power supply voltage, and VSSS is a low-level power supply voltage.

<Memory Cell Array>

Figure 6:
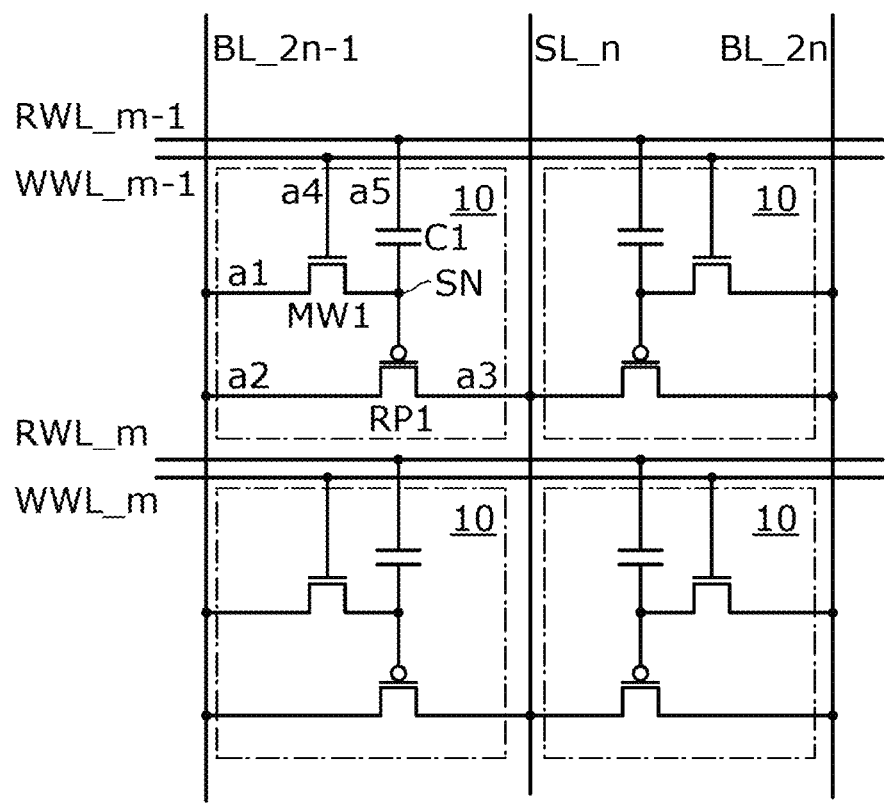
FIG. 6 is a circuit diagram illustrating a structure example of a memory cell array.

FIG. 6 is a circuit diagram illustrating a structure example of the memory cell array 310. The memory cell array 310 includes a plurality of memory cells 10 and a plurality of wirings WWL, RWL, BL, and SL. The plurality of memory cells 10 are arranged in a two-dimensional array. The plurality of wirings WWL, RWL, BL, and SL are provided in accordance with the arrangement of the plurality of memory cells 10. The wirings WWL and RWL are provided in rows and the wirings BL and SL are provided in columns. Each of the memory cells 10 is electrically connected to the wirings WWL and RWL in the corresponding row and the wirings SL and BL in the corresponding column. FIG. 6 illustrates four memory cells 10 arranged in two rows and two columns. Note that m and n in FIG. 6 each represent an integer of 2 or more.

Here, the wiring WWL is a write word line, and the wiring RWL is a read word line. The wiring BL is a bit line, and the wiring SL is a source line. Although an example in which one wiring SL is shared between adjacent two columns is illustrated in FIG. 6, the wiring SL may be provided in each column. Furthermore, one bit line may be divided into a write bit line and a read bit line; in this case, the write bit line (wiring WBL) is electrically connected to the node a1 and the read bit line (wiring RBL) is electrically connected to the node a2.

In the memory device 300, the memory cell 10 of the memory cell array 310 substantially performs 2-level retention. In the memory cell 10, four data states A to D shown in FIG. 3A or 3B are set. VDDM[2:0] are reading voltages and are input to a source line driver 362. VDDM[0] to VDDM[2] are Va, Vb, and Vc. In the case where three data states A, C, and D in FIG. 3C are set, VDDM[1] and VDDM[2] are input to the memory device 300.

<Peripheral Circuit>

The peripheral circuit 330 includes a control logic 340, a row driver 350, a column driver 360, and an output driver 380. The peripheral circuit 330 has a function of driving the memory cell array 310.

The control logic 340 processes signals input from the outside (e.g., CE, GW, OE, and EN_ERR) and generates a control signal for the row driver 350 and the column driver 360. For example, the control logic 340 generates a write enable signal WE, a read enable signal RE, a signal ERR, and the like.

CE is a chip enable signal, GW is a global write enable signal, and OE is an output enable signal. EN_ERR is a read enable signal for the error detection bit and serves as a refresh trigger. The signals processed by the control logic 340 are not limited to these signals; another signal may be input or any of the aforementioned signals may not be input.

The row driver 350 has a function of driving the wirings WWL and RWL, a function of selecting a row (memory cell 10) to be accessed, and the like. The row driver 350 includes a row decoder 351, a read word line driver 352, and a write word line driver 353.

The column driver 360 has a function of driving the wirings BL and SL and the like. The column driver 360 includes a column decoder 361, the source line driver 362, a write driver 363, an output multiplexer (MUX) 364, a sense amplifier 365, and a precharge circuit 366.

The source line driver 362 has a function of driving the wirings SL. Any one of the voltages VDDM[2:0] is input to each wiring SL by the source line driver 362. WDATA[31:0] is input to the write driver 363. The write driver 363 has a function of inputting a writing voltage corresponding to one-bit data among WDATA[31:0] to one wiring BL. The precharge circuit 366 has a function of precharging the wirings BL. The sense amplifier 365 has a function of comparing the voltages of the wirings BL with the voltage VREF. The output MUX 364 has a function of selecting a plurality of output data of the sense amplifier 365 and transferring the selected data to the output driver 380. The output driver 380 processes data input from the output MUX 364 and outputs RDATA[31:0].

<Example of Operation Method>

Figure 7:
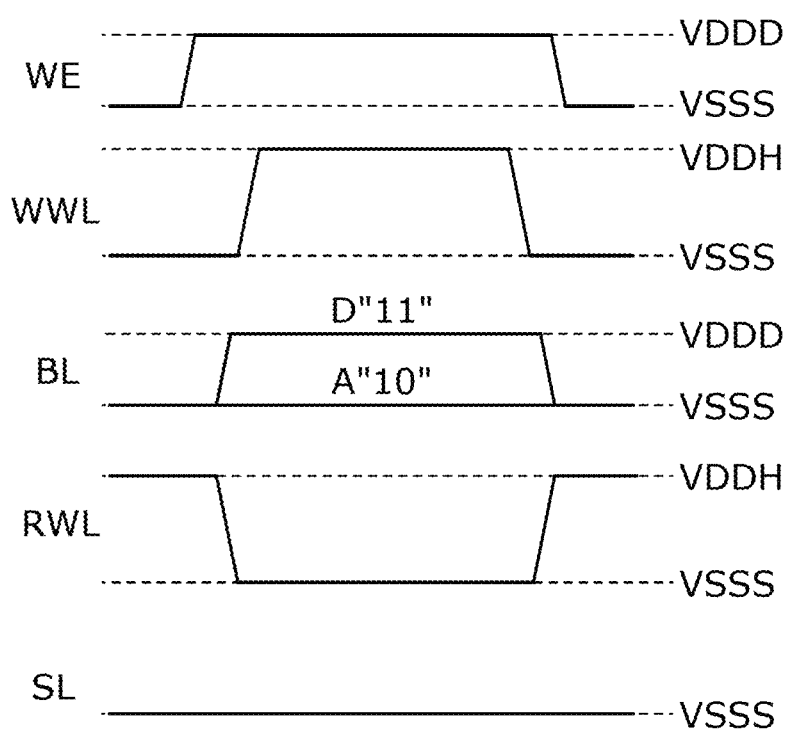
FIG. 7 is a timing chart showing an operation example of a memory device.
Figure 8:
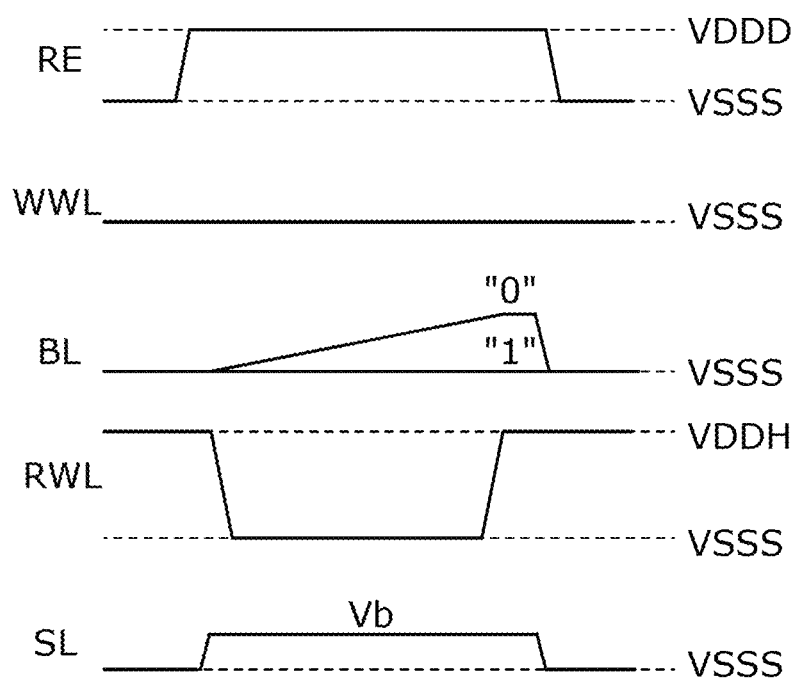
FIG. 8 is a timing chart showing an operation example of a memory device.
Figure 9:
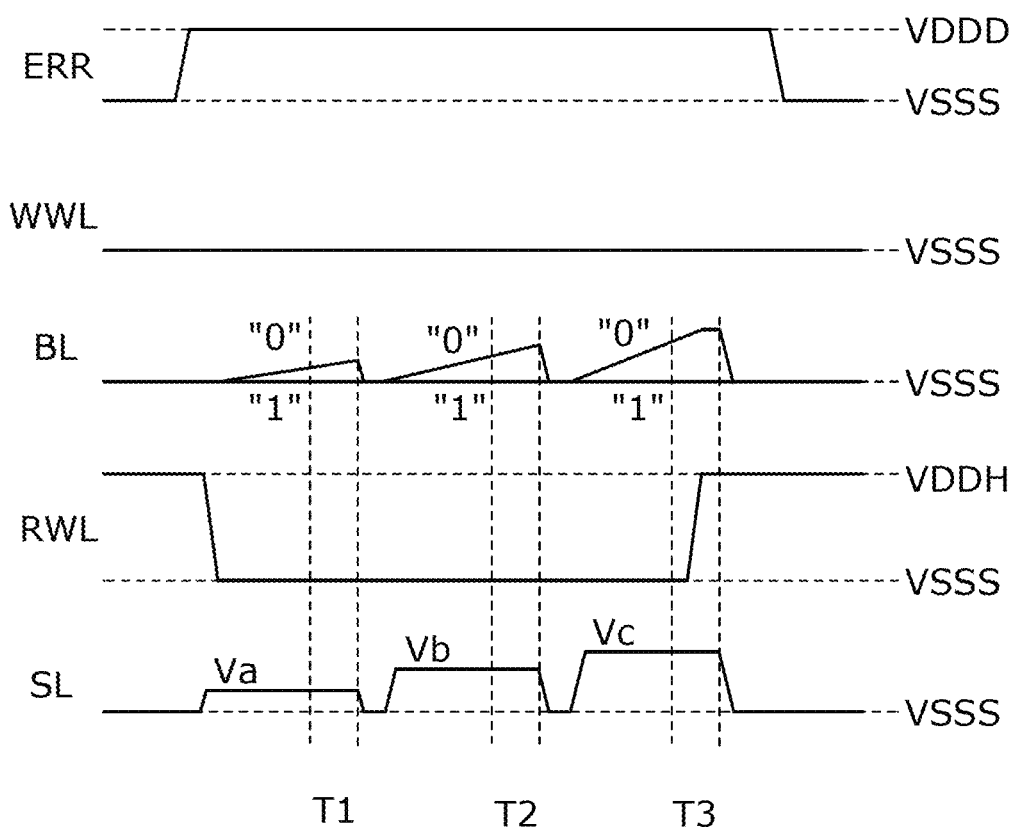
FIG. 9 is a timing chart showing an operation example of a memory device.

FIG. 7, FIG. 8, and FIG. 9 are timing charts of an operation method example of the memory device 300, showing voltage changes in the wirings WWL, BL, RWL, and SL and the wirings to which the signals WE, RE, and ERR are output. In FIG. 7, FIG. 8, and FIG. 9, low-level voltages of those wirings are VSSS. VSSS can be a ground potential. High-level voltages of the wirings WWL and RWL are VDDH, and those of the other wirings are VDDD.

(Data Writing Operation)

FIG. 7 is a timing chart showing a writing operation example. The writing operation is performed during a period in which the signal WE is at the high level ("H").

A writing voltage is input to the wiring BL. If the writing data is "0", VSSS is input to the wiring BL so as to bring the memory cell 10 into the data state A ("10"). If the writing data is "1", VDDD is input to the wiring BL so as to bring the memory cell 10 into the data state D ("11"). For the period during which the writing voltage is input to the wiring BL, the wiring WWL and the wiring RWL are set at "H" and "L", respectively. During the writing operation, the wiring SL is set at "L". By setting WWL at "H", the transistor MW1 is turned on and the voltage of the wiring BL is written into the node SN.

By setting the wiring WWL back to "L", the transistor MW1 is turned off and the memory cell 10 is brought into the data retention state. By changing the voltage of the wiring RWL from "L" to "H", the voltage of the node SN can made higher than the writing voltage owing to the capacitive coupling between the node SN and the wiring RWL. This way of controlling the voltage of the wiring RWL can surely turn off the transistor RP1 in the unselected memory cell 10 and can prevent a flow of a drain current therein.

Note that during the data retention, in order to keep the off state of the transistor MW1, the low-level voltage of the wiring WWL may be set at a voltage VSSL that is lower than the low-level voltage VSSS. In that case, VSSL is input to the write word line driver 353. In the case where a bit line (wiring BL) is divided into the writing wiring WBL and the reading wiring RBL, a writing voltage is input to the wiring WBL and the wiring RBL is set at "L".

(Data Reading Operation)

FIG. 8 is a timing chart showing a read operation example. The period from the time when the signal RE starts to rise to the time when it is set to "L" is a reading operation period. In the reading operation, the least significant bit (data bit) of the data retained in the memory cell 10 is read out. During the reading operation, the wiring WWL is at "L" and the transistor MW1 is kept in the off state.

After the wiring BL is precharged at VSSS, it is brought into an electrically floating state. Then, a reading voltage is input to the wiring SL. Here, Vb (VDDM[1]) is a reading voltage. After the wiring SL is set at Vb, the wiring RWL is set at "L".

If the threshold of the memory cell 10 exceeds Vb, the transistor RP1 is in an off state and the voltage of the wiring BL does not change. If the threshold of the memory cell 10 is lower than Vb, the transistor RP1 is in an on state. When the transistor RP1 is turned on, the voltage of the wiring BL increases because of a drain current of the transistor RP1. After a certain period of time from the time when the wiring RWL is set at "L", the sense amplifier 365 is set active. In that case, the wiring BL is electrically disconnected from the sense amplifier 365. After that, RWL is set at "H" to bring the transistor RP1 into an off state.

In the sense amplifier 365, whether the voltage of the wiring BL is higher than VREF is determined. The lowest voltage among VDDM[2:0] is used as VREF; Va is used here. If the voltage of the wiring BL is higher than VREF, the read out data is "0". If the voltage of the wiring BL is not higher than VREF, the read out data is "1". After the wiring SL is set at "L", the wiring BL is precharged at VSSS to bring the memory cell 10 back to the retention state.

(Error Detection Bit Determination Operation)

FIG. 9 is a timing chart showing an example of an error detection bit determination operation. When the signal EN_ERR is input to the control logic 340, the signal ERR is output to the row driver 350 and the column driver 360, so that determination of an error detection bit is performed. During a period in which the signal ERR is at "H", the 1/0 determination of an error detection bit is performed.

An error detection bit reading operation is similar to the data reading operation except that three reading voltages VDDM[0], VDDM[1], and VDDM[2] (Vc, Vb, and Va) are input to the wiring SL. Whether the voltage of the wiring BL is higher than VREF is determined for each of the three reading voltages. That is, 2-bit data is read out from the memory cell 10.

When the reading voltage input to the wiring SL is changed, the wiring BL is precharged at VSSS to be brought into an electrically floating state. The sense amplifier 365 performs 1/0 determination on the read out data in each of determination periods T1 to T3. Here, in the case where the wiring BL is higher than VSSS, the determination result is "0", and in the case where the wiring BL is not higher than VSSS, the determination result is "1". The 1/0 determination results by the sense amplifier 365 are noted in the order of the results obtained in the latter determination period (in the order of T3, T2, and T1).

By the 1/0 determination results ("0", "0", "0"), it is determined that the threshold of the memory cell 10 is lower than Va and the data state is A. By the 1/0 determination results ("0", "0", "1"), it is determined that the threshold of the memory cell 10 is higher than Va and lower than Vb and the data state is B. By the 1/0 determination results ("0", "1", "1"), it is determined that the threshold of the memory cell 10 is higher than Vb and lower than Vc and the data state is C. By the 1/0 determination results ("1", "1", "1"), it is determined that the threshold of the memory cell 10 is higher than Vc and the data state is D.

In the case where the determination results by the sense amplifier 365 are ("0", "0", "1") or ("0", "1", "1"), the corresponding memory cell 10 is refreshed. Here, the memory cells 10 for one word (one row) including the corresponding memory cell 10 are refreshed. Note that 1-bit data for rewriting can be determined by the determination result by the sense amplifier 365 in the determination period T2. If the result is "1", the writing voltage is VDDD, and if the result is "0", the writing voltage is VSSS.

In the case where the bit line is divided into the writing wiring WBL and the reading wiring RBL, a writing voltage is input to the wiring WBL and the wiring RBL is set at "L" in the writing operation. In the reading operation and the error detection bit 1/0 determination operation, a reading voltage is input to the wiring RBL and the wiring WBL is set at "L".

<<Structure Example 2 of Memory Device>>

Figure 10:
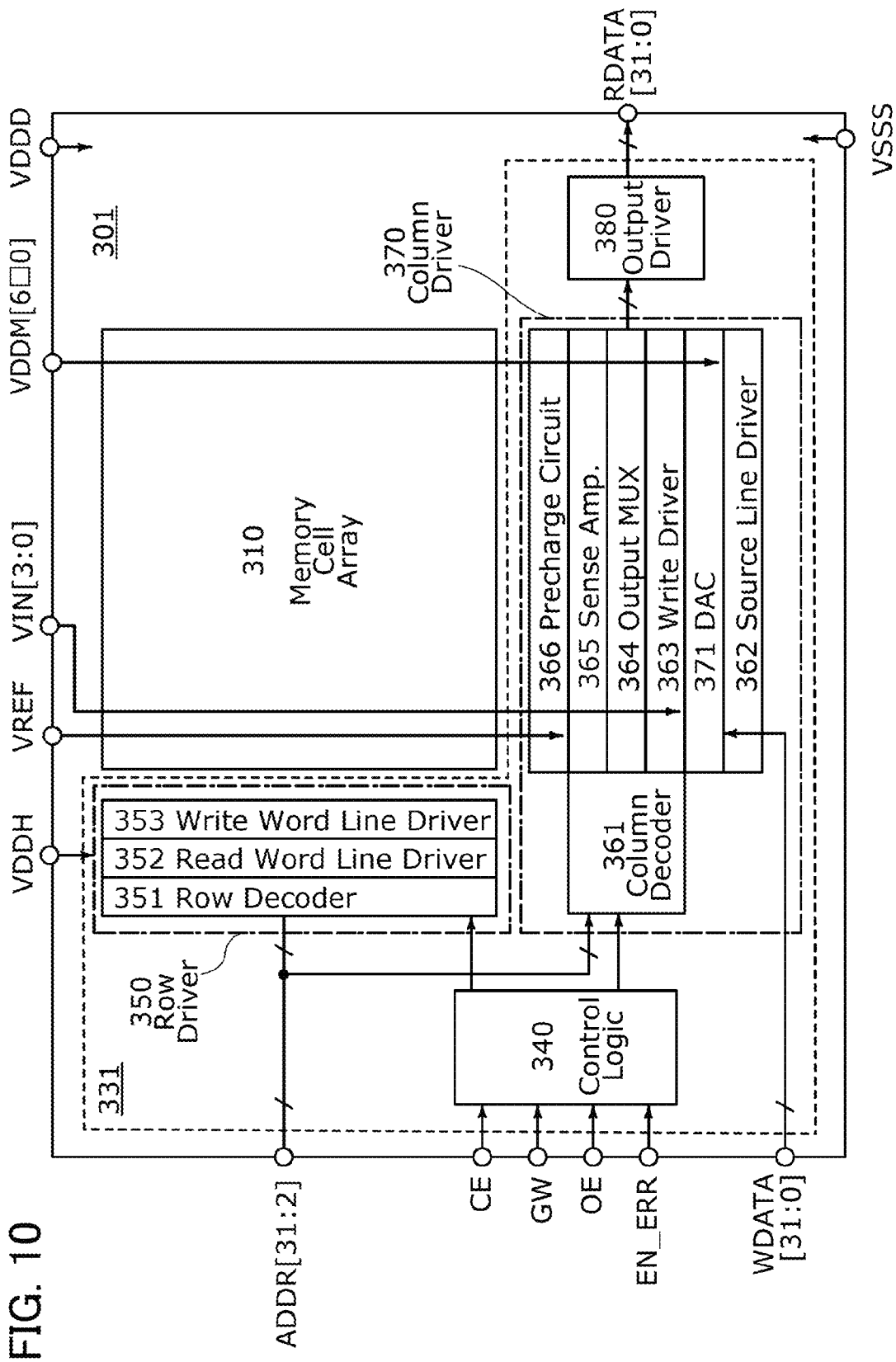
FIG. 10 is a block diagram illustrating a structure example of a memory device.

FIG. 10 illustrates a structure example of a memory device. A memory device 301 illustrated in FIG. 10 is a variation of the memory device 300 and includes the memory cell array 310 and a peripheral circuit 331. The memory device 301 has a circuit structure for retaining 3-bit (8-level) data in the memory cell 10.

In the memory device 301, the memory cell 10 of the memory cell array 310 substantially functions as an MLC that performs 4-level retention. In the memory cell 10, eight data states A1 to A8 shown in FIG. 4A or 4B are set. VDDM[0] to VDDM[6] are Va1 to Va1. In the case where seven data states A1 and A2 to A8 shown in FIG. 4C are set, VDDM[6:1] are input to the memory device 300.

The peripheral circuit 331 includes a column driver 370 instead of the column driver 360. The column driver 370 has a function of writing 2-bit data and a function of reading out 3-bit data. The column driver 370 is formed by addition of a digital-analog converter (DAC) 371 to the column driver 360. The DAC 371 has a function of generating four writing voltages (analog voltages) for writing 2-bit data into the memory cell 10. A reference voltage VIN[3:0] is input to the DAC 371, and the DAC 371 generates an analog voltage per 2 bits of WDATA[31:0]. The write driver 363 has a function of inputting the analog voltage generated by the DAC 371 to the wirings BL. To employ a driving method in which a writing voltage is input to the wirings SL, the write driver 363 is electrically connected to the memory cell array 310 in such a manner that an analog voltage can be input to the wirings SL.

<Example of Operation Method>

Figure 11:
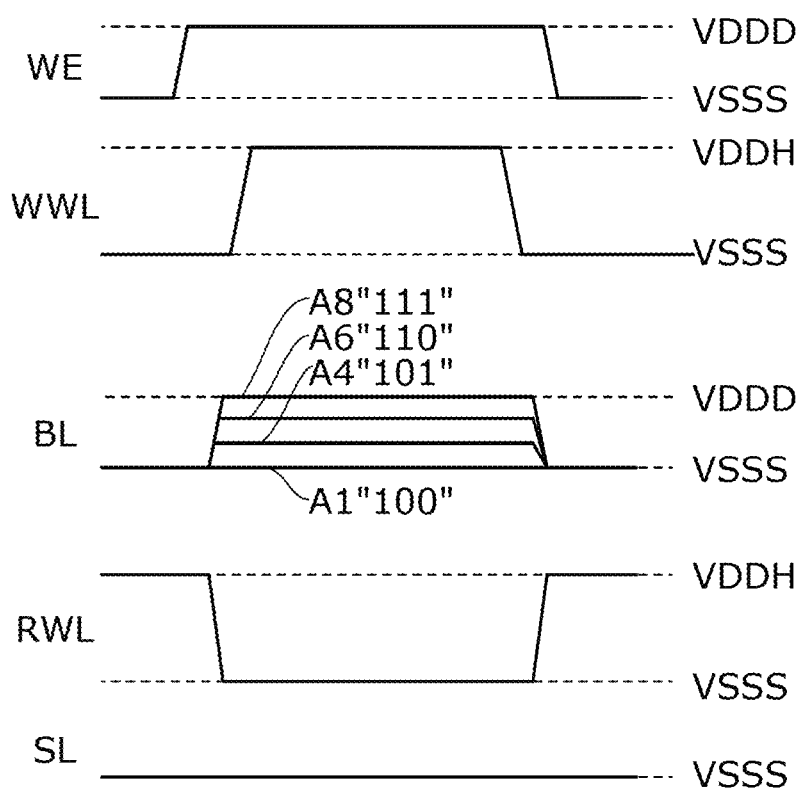
FIG. 11 is a timing chart showing an operation example of a memory device.
Figure 12:
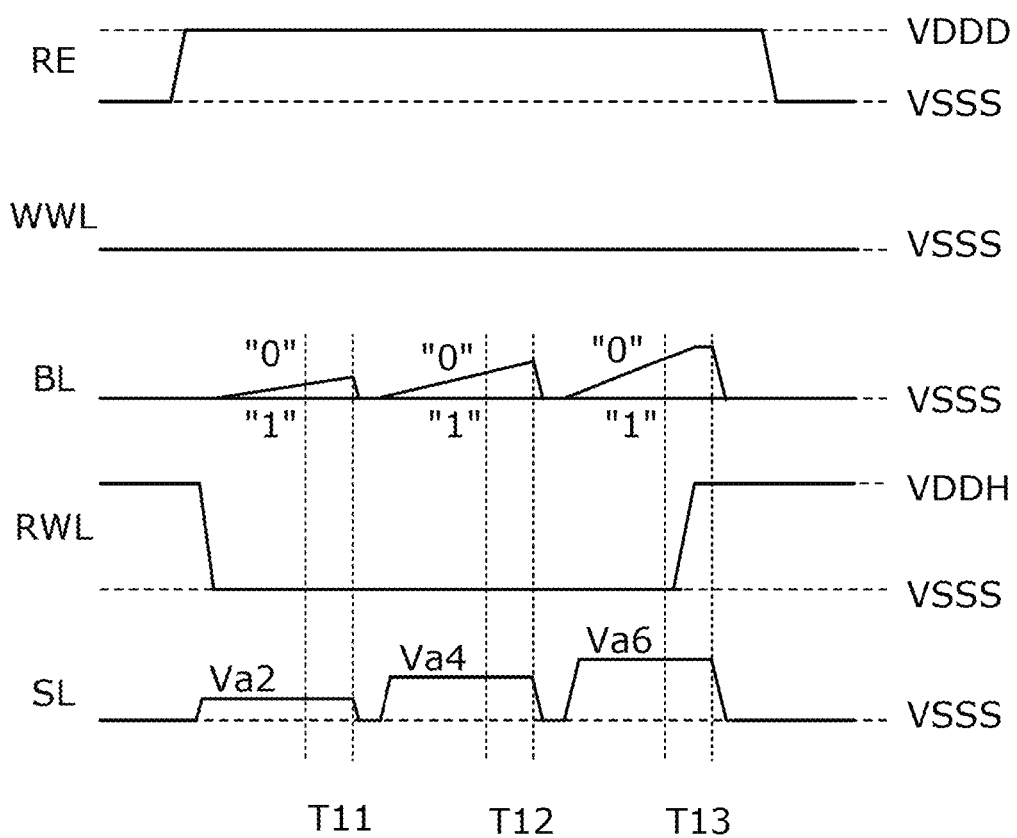
FIG. 12 is a timing chart showing an operation example of a memory device.
Figure 13:
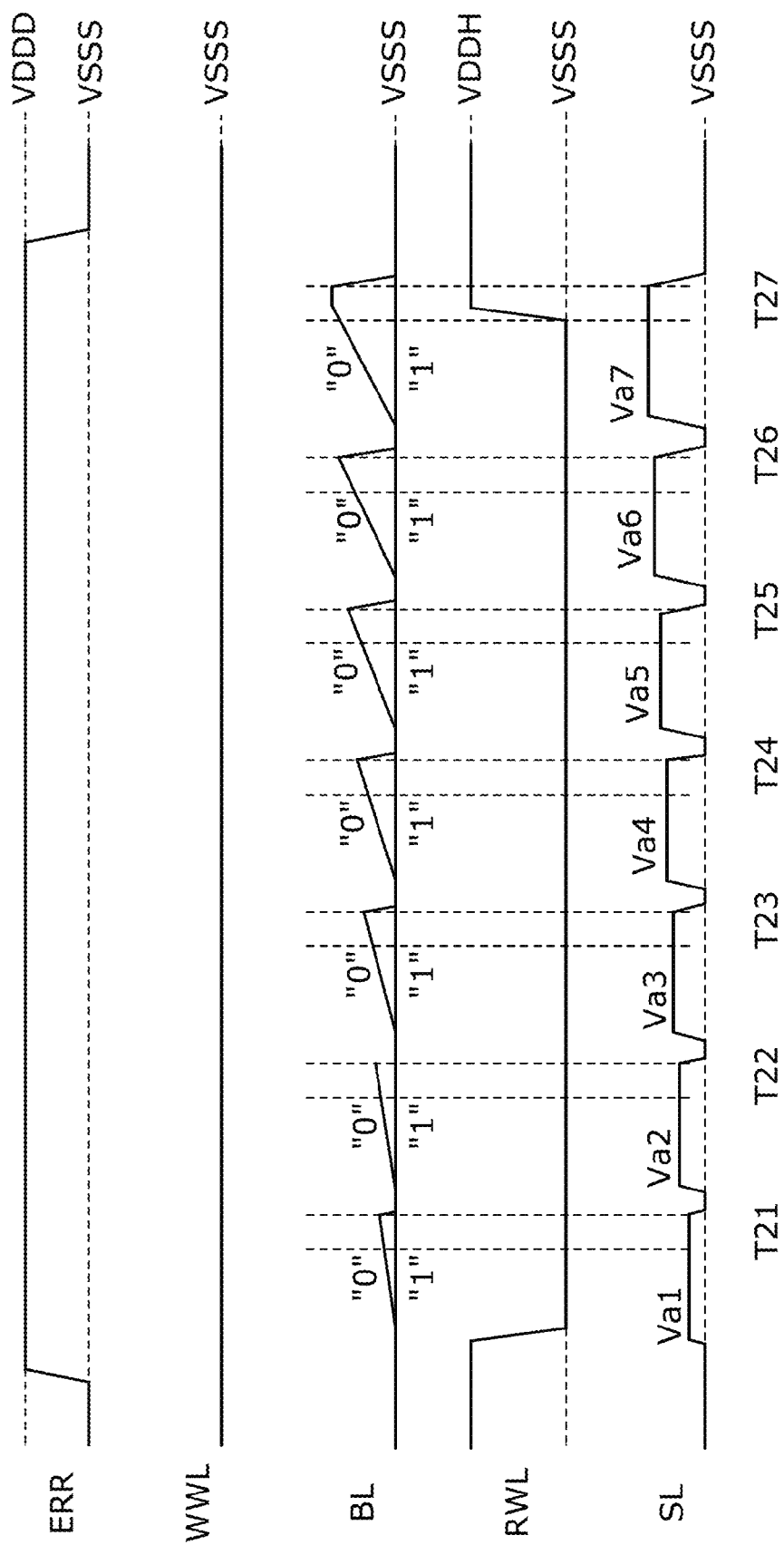
FIG. 13 is a timing chart showing an operation example of a memory device.

FIG. 11, FIG. 12 and FIG. 13 are timing charts of an operation method example of the memory device 301, showing voltage changes in the wirings WWL, BL, RWL, and SL and the wirings to which the signals WE, RE, and ERR are input. In FIG. 11, FIG. 12, and FIG. 13, low-level voltages of those wirings are VSSS. High-level voltages of the wirings WWL and RWL are VDDH, and those of the other wirings are VDDD.

(Writing Operation)

FIG. 11 is a timing chart showing a writing operation example. The writing operation is similar to that of the memory device 300. A writing voltage to bring the memory cell 10 into the data state A1, A4, A6, or A8 is input to the wiring BL.

(Reading Operation)

FIG. 12 is a timing chart showing a data reading operation example. Since 2-bit data is read out, the reading operation is similar to the error detection bit determination operation of the memory device 300 (FIG. 9).

Reading voltages Va2, Va4, and Va6 are sequentially input to the wiring SL. The sense amplifier 365 performs 1/0 determination in each of determination periods T11 to T13. The 1/0 determination results ("0", "0", "0"), ("0", "0", "1"), ("0", "1", "1"), and ("1", "1", "1") by the sense amplifier mean the read out data "00", "01", "10", and "11", respectively.

(Error Detection Bit Determination)

FIG. 13 is a timing chart showing an example of an error detection bit determination operation. This determination operation can be performed in a manner similar to that of the error detection bit determination operation of the memory device 300 (FIG. 9) except that seven reading voltages Va1 to Va7 are input to the wiring SL.

The reading voltages Va1 to Va7 are sequentially input to the wiring SL. The sense amplifier 365 performs 1/0 determination in each of determination periods T21 to T27.

By the determination results ("0", "0", "0", "0", "0", "0", "0"), ("0", "0", "0", "0", "1", "1", "1"), ("0", "0", "1", "1", "1", "1", "1"), and ("1", "1", "1", "1", "1", "1", "1") by the sense amplifier, it is determined that the memory cell 10 is in the data states A1, A4, A6, and A8 having the error detection bit "1" (normal), respectively.

By the determination results ("0", "0", "0", "0", "0", "0", "1"), ("0", "0", "0", "0", "0", "1", "1"), ("0", "0", "0", "1", "1", "1", "1"), and ("0", "1", "1", "1", "1", "1", "1") by the sense amplifier, it is determined that the memory cell 10 is in the data states A2, A3, A5, and A7 having the error detection bit "0" (abnormal), respectively.

When the memory cell 10 having the error detection bit "0" (abnormal) is detected, the memory cell 10 is refreshed. Here, the memory cells 10 for one word (one row) including the memory cell 10 are refreshed. Rewriting data is determined by the 1/0 determination results by the sense amplifier 365 in the determination periods T22, T24, and T26. When the 1/0 determination results in the determination periods T22, T24, and T26 are ("0", "0" "0"), ("0", "0" "1"), ("0", "1", "1"), or ("1", "1", "1"), a writing voltage for bringing the memory cell 10 into the data state A1, A4, A6, or A8 is input to the wiring BL, respectively.

Here, a structure example and an operation example in which 2-bit data is retained in the memory cell 10 of the memory device 301 are described. As described above, by setting $2^N$ data states in the memory cell 10, (N−1)-bit data can be retained. The peripheral circuit 331 has a circuit structure capable of inputting reading voltages and writing voltages corresponding to the $2^N$ data states to the memory cell array 310.

As described above, without the need for an error checking and correcting (ECC) circuit, the memory device of this embodiment can determine whether a memory cell is in the data state in which an error bit is likely to occur, with the use of a peripheral circuit inside the memory device and, if needed, correct the threshold of the memory cell (refresh the memory cell) depending on the determination result. In the writing operation, data can be written without performing the process for adding the error detection bit (e.g., encoding process); accordingly, a delay due to the addition of the error detection bit is not caused. Furthermore, in the reading operation, the error detection bit is not read out; accordingly, a delay due to the addition of the error detection bit is not substantially caused.

<<Different Structure Examples of Memory Cell and Memory Cell Array>>

Figure 14A:
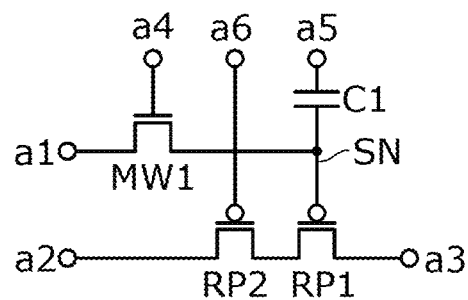
FIGS. 14A and 14B are circuit diagrams illustrating structure examples of a memory cell.
Figure 14B:
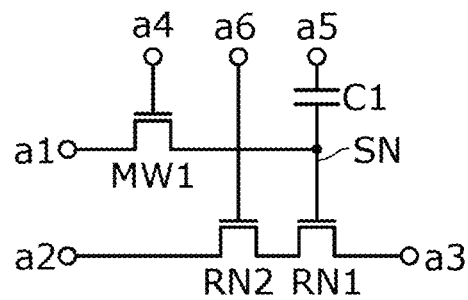

In a memory cell array of this embodiment, a 3T-type gain cell can be employed. FIGS. 14A and 14B illustrate structure examples of the memory cell.

A memory cell 14 illustrated in FIG. 14A corresponds to the memory cell 10 to which a transistor RP2 is added. A memory cell 15 illustrated in FIG. 14B corresponds to the memory cell 13 to which a transistor RN2 is added. Instead of the transistor MW1 in the memory cell 14, the transistor MW2 or MW3 may be provided. The same can apply to the memory cell 15.

In the memory cell 14, the transistor RP2 can function as a reading transistor. In the memory cell 14, the transistor RP2 is in an on state in a reading operation and in an off state in a writing operation and a data retention state. The same can apply to the transistor RN2 of the memory cell 15. In the case where the memory cell 14 is included in a memory cell array, a read word line (RWL) is electrically connected to a node a6 and a wiring CNL for the capacitor C1 is electrically connected to the node a5, for example. The same applies to the memory cell 15.

Figure 15:
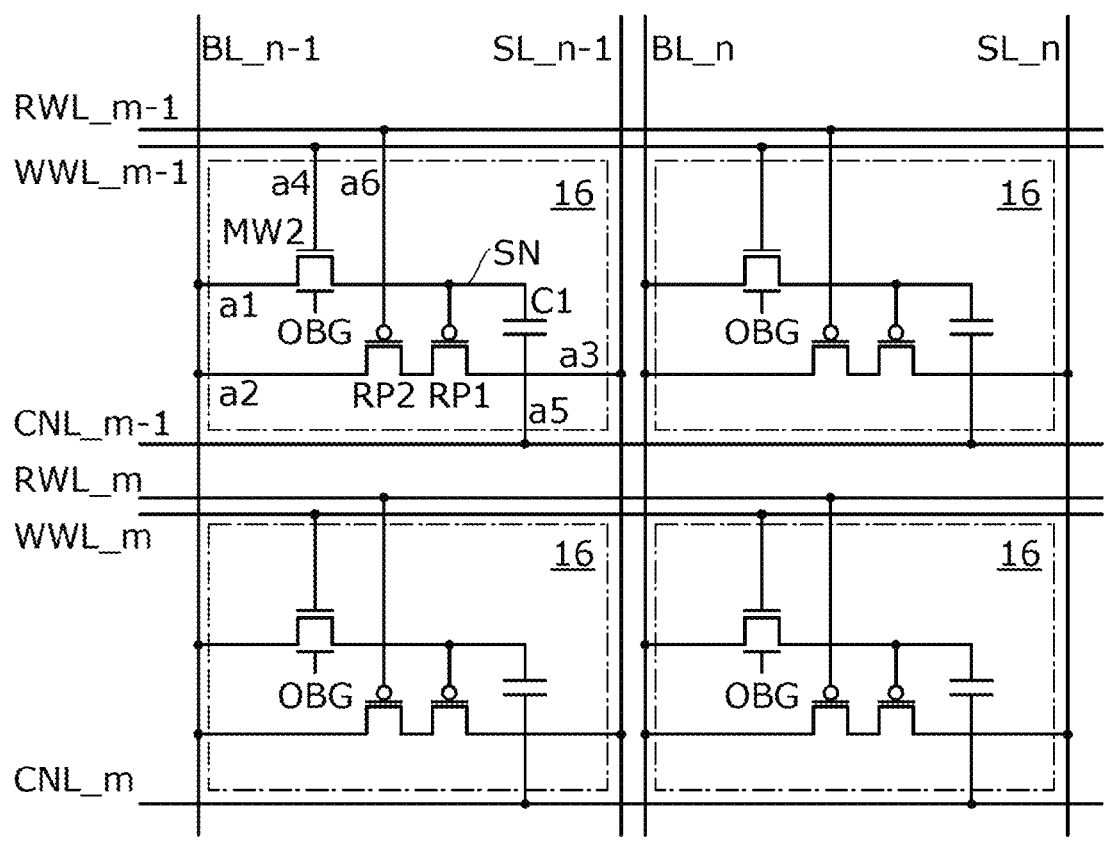
FIG. 15 is a circuit diagram illustrating a structure example of a memory cell array.

FIG. 15 illustrates a structure example of a memory cell array. A memory cell array 311 illustrated in FIG. 15 includes a plurality of memory cells 16 and a plurality of wirings WWL, RWL, BL, SL, and CNL. The plurality of memory cells 16 are arranged in a two-dimensional array. The memory cell 16 is a modification example of the memory cell 14, including the transistor MW2 instead of the transistor MW1. The plurality of wirings WWL, RWL, BL, SL, and CNL are provided in accordance with the arrangement of the plurality of memory cells 16. The wirings WWL, RWL, and CNL are provided in each row and the wirings BL and SL are provided in each column. Each of the plurality of memory cells 16 is electrically connected to the wirings WWL, RWL, and CNL in the corresponding row and the wirings SL and BL in the corresponding column. The back gate of the transistor MW2 is electrically connected to a wiring OBG.

As in the memory cell array 310 in FIG. 6, the wiring SL may be shared between adjacent columns. In the case where the bit line is divided into the wiring WBL and the wiring RBL, the node a1 is electrically connected to the wiring WBL and the node a2 is electrically connected to the wiring RBL. In the memory cell array 311, the memory cell 16 may be replaced by the memory cell 15.

<Operation Example>

Figure 16:
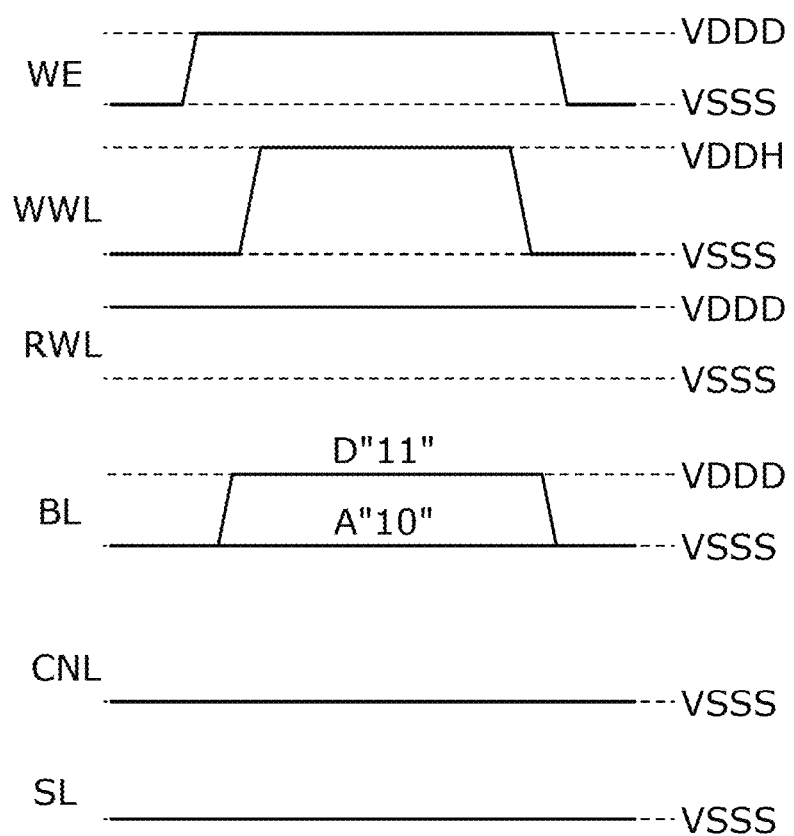
FIG. 16 is a timing chart showing an operation example of a memory device.
Figure 17:
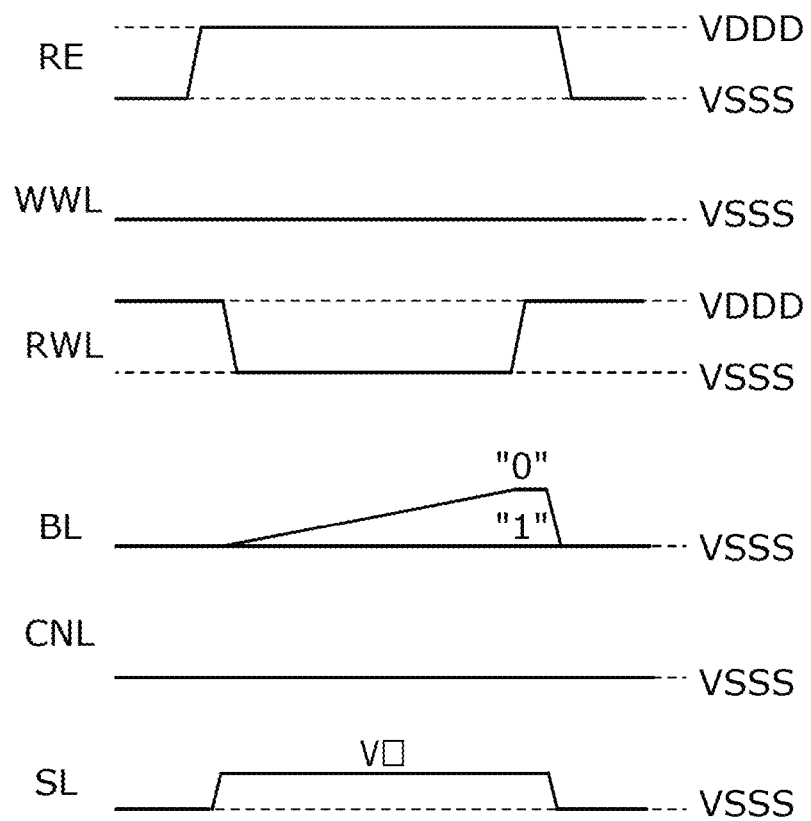
FIG. 17 is a timing chart showing an operation example of a memory device.
Figure 18:
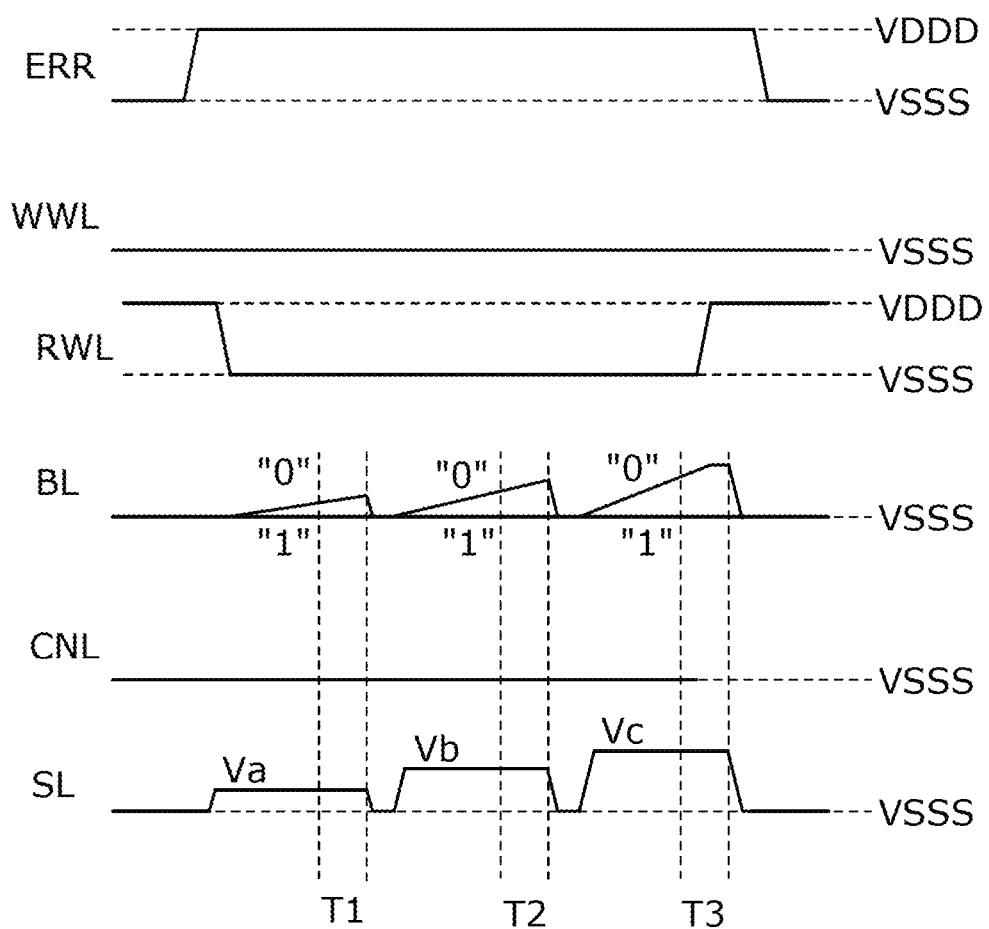
FIG. 18 is a timing chart showing an operation example of a memory device.

FIG. 16, FIG. 17, and FIG. 18 are timing charts of a memory device including the memory cell array 311. In this example, the memory cell 16 of the memory cell array 311 substantially performs 2-level retention. In the memory cell 16, four data states A to D shown in FIG. 3A or 3B are set. Three voltages VDDM[0] to VDDM[2] are Va, Vb, and Vc. This memory device can operate in a manner similar to that of the memory device 300. Here, points different from those of the operation example of the memory device 300 (FIG. 7 to FIG. 9) are chiefly described.

(Writing Operation)

FIG. 16 is a timing chart showing a writing operation example and is different from FIG. 7 in that the wiring RWL is at "H" for making the transistor RP2 in an off state and VSSS is input to the wiring CNL. Note that VSSS can be a ground potential.

(Reading Operation)

FIG. 17 is a timing chart showing a reading operation example. VSSS is input to the wiring CNL. The wiring RWL is set at "L" so as to turn on the transistor RP2. When the transistor RP2 is turned on, the voltage of the wiring BL changes owing to a drain current of the transistor RP1.

(Error Detection Bit Determination Operation)

FIG. 18 is a timing chart showing an error detection bit determination operation example. The error detection bit determination operation in FIG. 18 is similar to the reading operation in FIG. 17 except that three reading voltages Va, Vb, and Vc are input to the wiring SL.

In a nonvolatile memory device typified by a flash memory, an error bit occurs by read disturb, program disturb, data retention, or the like. In general, in the nonvolatile memory device, error bit detection and correction are performed by an ECC circuit with the use of an error correction code. The microfabrication and storage of more levels of data of nonvolatile memory devices increase the possibility of an error bit and lowers the reliability. As a countermeasure, the number of bits of the error correction code is increased; however, the increase in the number of bits of the error correction code makes the following problems come to the surface: an increase in the area of the ECC circuit, an increase in the delay time and power consumption due to encoding and decoding of the error correction code, an increase in the chip area, and the like.

This embodiment can suppress the above problems such as an increase in the chip area and an increase in the delay time and power consumption due to encoding and decoding of the error correction code because an ECC circuit is not necessary. Naturally, the threshold correction of this embodiment and the error correction by the ECC circuit may be employed in combination; in such a case, the reliability of the memory device can be further increased. Since the memory device of this embodiment can ensure the reliability thanks to the threshold correction, the redundancy of the ECC circuit can be reduced.

Embodiment 2

In this embodiment, a semiconductor device which includes a memory device, an electronic component and an electronic device which include the semiconductor device, and the like are described as examples of the semiconductor device.

Figure 19:
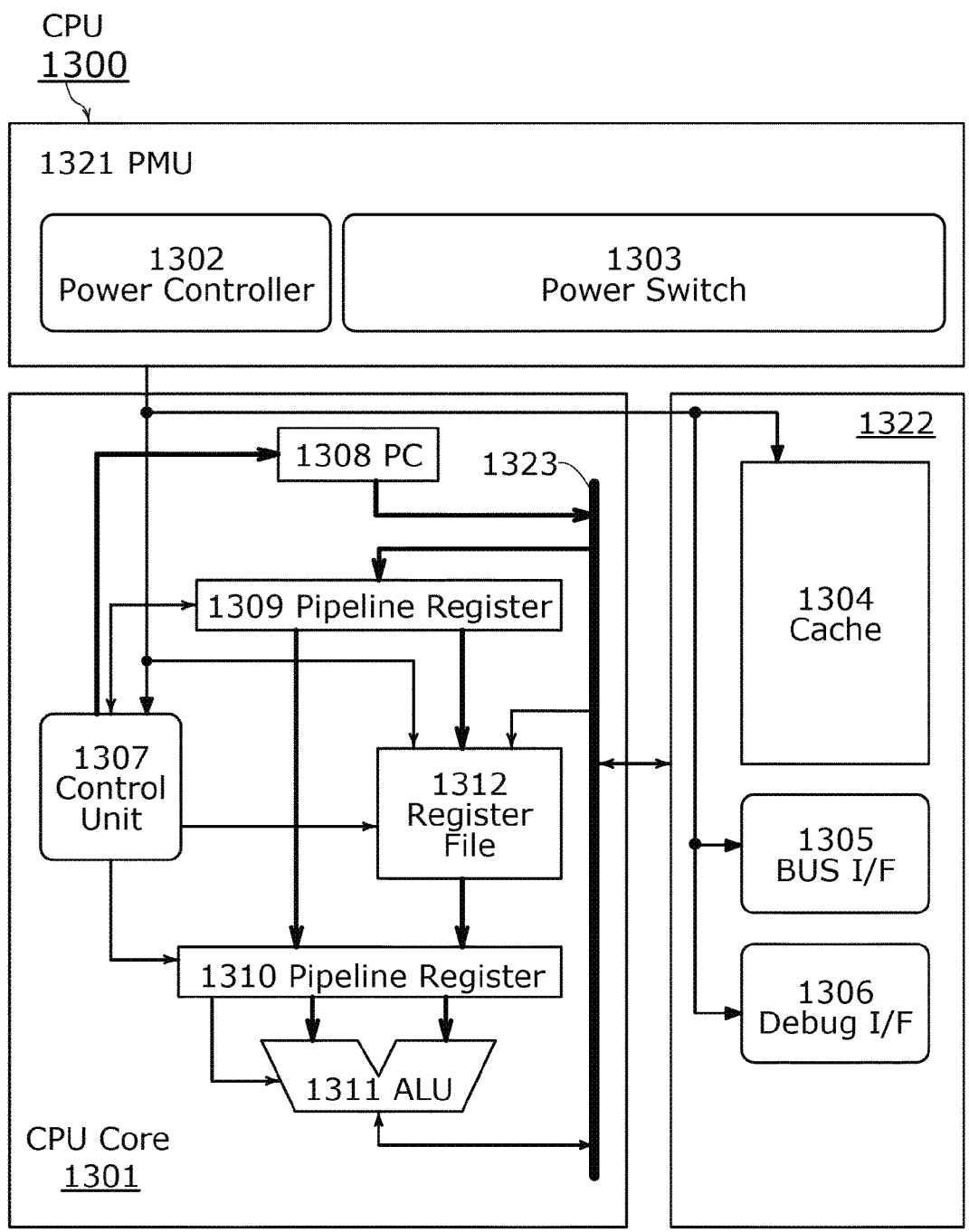
FIG. 19 is a block diagram illustrating a structure example of a processing unit (CPU)
Figure 20:
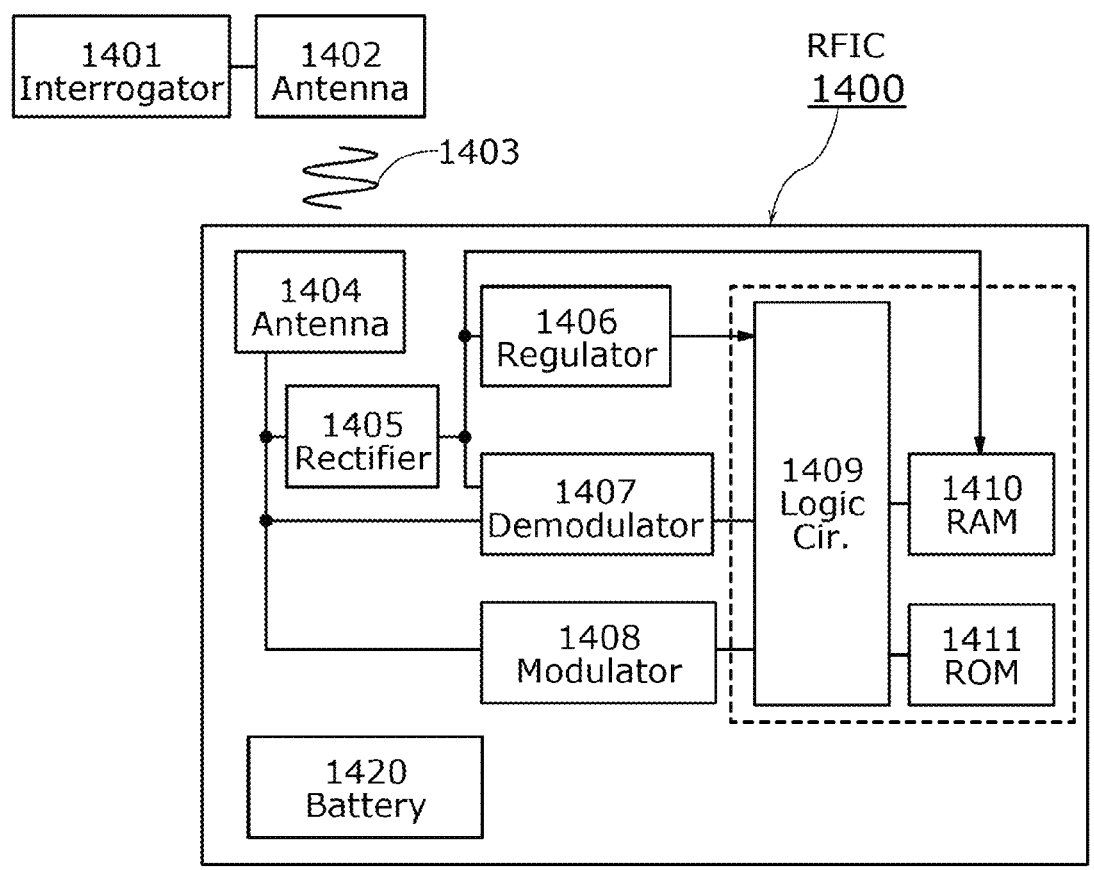
FIG. 20 is a block diagram illustrating a structure example of a processing unit (RFIC)

A memory device is incorporated in a processing device (typically, a CPU) and retains data (including an instruction) necessary for the operation of the processing device. FIG. 19 and FIG. 20 illustrate structure examples of the processing device.

<<CPU>>

FIG. 19 illustrates a CPU structure example. A CPU 1300 illustrated in FIG. 19 includes a CPU core 1301, a power management unit (PMU) 1321, and a peripheral circuit 1322. The PMU 1321 includes a power controller 1302 and a power switch 1303. The peripheral circuit 1322 includes a cache 1304 including cache memory, a bus interface (BUS I/F) 1305, and a debug interface (Debug I/F) 1306. The CPU core 1301 includes a data bus 1323, a control unit 1307, a program counter (PC) 1308, a pipeline register 1309, a pipeline register 1310, an arithmetic logic unit (ALU) 1311, and a register file 1312. Data is transmitted between the CPU core 1301 and the peripheral circuit 1322 via the data bus 1323.

Since the memory device of Embodiment 1 can retain data for a long time even without power supply, it can be provided in a power domain on which power gating is performed. The memory device of Embodiment 1 can be used in the cache 1304, which allows the reliability of the cache 1304 to be improved without an increase in the circuit scale and an error bit in the cache 1304 to be prevented from occurring without disturbing the operation of the CPU 1300. The power consumption of the CPU 1300 can be reduced.

The control unit 1307 has functions of decoding and executing instructions contained in a program such as inputted applications by controlling the overall operations of the PC 1308, the pipeline registers 1309 and 1310, the ALU 1311, the register file 1312, the cache 1304, the bus interface 1305, the debug interface 1306, and the power controller 1302.

The ALU 1311 has a function of performing a variety of arithmetic operations such as four arithmetic operations and logic operations. The cache 1304 has a function of temporarily storing frequently used data. The PC 1308 is a register having a function of storing an address of an instruction to be executed next. Although not illustrated in FIG. 19, the cache 1304 includes a cache controller for controlling the operation of the cache memory.

The pipeline register 1309 has a function of temporarily storing instruction data. The register file 1312 includes a plurality of registers including a general purpose register and can store data that is read from the main memory, data obtained as a result of arithmetic operations in the ALU 1311, or the like. The pipeline register 1310 has a function of temporarily storing data used for arithmetic operations performed in the ALU 1311, data obtained as a result of arithmetic operations in the ALU 1311, or the like.

The bus interface 1305 functions as a path for data between the CPU 1300 and devices outside the CPU 1300. The debug interface 1306 functions as a path of a signal for inputting an instruction to control debugging to the CPU 1300.

The power switch 1303 has a function of controlling supply of the power supply voltage to circuits other than the power controller 1302 in the CPU 1300. These circuits belong to several different power domains. The power switch 1303 controls whether the power supply voltage is supplied to circuits in the same power domain. The power controller 1302 has a function of controlling the operation of the power switch 1303. With such a structure, the CPU 1300 can perform power gating. An example of the flow of the power gating operation is described.

First, the CPU core 1301 sets the timing for stopping the supply of the power supply voltage in a register of the power controller 1302. Next, an instruction to start power gating is sent from the CPU core 1301 to the power controller 1302. Then, the registers and the cache 1304 in the CPU 1300 start data storing. Subsequently, the power switch 1303 stops the supply of the power supply voltage to the circuits other than the power controller 1302 in the CPU 1300. Then, an interrupt signal is input to the power controller 1302, thereby starting the supply of the power supply voltage to the circuits included in the CPU 1300. Note that a counter may be provided in the power controller 1302 to be used to determine the timing of starting the supply of the power supply voltage regardless of input of an interrupt signal. Next, the registers and the cache 1304 start data restoration. After that, execution of an instruction is resumed in the control unit 1307.

This power gating can be performed in the entire processor or one or more logic circuits included in the processor. The supply of power can be stopped even for a short time. Accordingly, power consumption can be reduced at a fine granularity in space or time.

<<RFIC>>

An RFIC is described as an example of a processing unit. The RFIC is referred to as an RFID, a wireless chip, a wireless ID chip, and the like. The RFIC includes a memory circuit, stores necessary data in the memory circuit, and transmits and receives data to/from the outside by using contactless means, for example, wireless communication. With these features, the RFIC can be used for an individual authentication system in which an object or the like is recognized by reading the individual information, for example.

FIG. 20 is a block diagram illustrating an example of an RFIC. An RFIC 1400 illustrated in FIG. 20 includes an antenna 1404, a rectifier circuit 1405, a constant voltage circuit 1406, a demodulation circuit 1407, a modulation circuit 1408, a logic circuit 1409, a RAM 1410, a read-only memory (ROM) 1411, and a battery 1420. Note that decision whether each of these circuits is provided or not can be made as appropriate as needed. For example, although the RFIC 1400 is of an active type, it may be of a passive type without the battery 1420.

The memory device of Embodiment 1 can be used in the RAM 1410, which leads to an improvement in the reliability of the RFIC 1400. The memory device according to Embodiment 1 has a device structure capable of employing a combined memory. Therefore, in the RFIC 1400, circuits other than the antenna 1404 can be incorporated in one IC chip without complicating the manufacturing process. The antenna 1404 whose performance corresponds to the communication zone is mounted on the IC chip. Note that as data transmission methods, the following methods can be given: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFIC 1400 described in this embodiment.

The antenna 1404 exchanges a radio signal 1403 with an antenna 1402 which is connected to a communication device 1401. The rectifier circuit 1405 generates an input voltage by rectification, for example, half-wave voltage doubler rectification of an input alternating signal generated by reception of a radio signal at the antenna 1404 and smoothing of the rectified signal with a capacitor provided in a later stage in the rectifier circuit 1405. Note that a limiter circuit may be provided on the input side or the output side of the rectifier circuit 1405. The limiter circuit controls electric power so that electric power which is higher than or equal to a certain level of electric power is not input to a circuit in a later stage if the amplitude of the input alternating signal is high and an internal generation voltage is high.

The constant voltage circuit 1406 generates a stable power supply voltage from an input voltage and supplies it to each circuit. Note that the constant voltage circuit 1406 may include a reset signal generation circuit. The reset signal generation circuit is a circuit which generates a reset signal of the logic circuit 1409 by utilizing the rise of the stable power supply voltage.

The demodulation circuit 1407 demodulates the input alternating signal by envelope detection and generates the demodulated signal. Furthermore, the modulation circuit 1408 performs modulation in accordance with data to be output from the antenna 1404.

The logic circuit 1409 decodes and processes the demodulated signal. The RAM 1410 holds the input data and includes a row decoder, a column decoder, a driver, a memory region, and the like. Furthermore, the ROM 1411 stores an identification number (ID) or the like and outputs it in accordance with processing.

In the circuits other than the RAM 1410, the OS transistors described in Embodiment 2 can be used as n-channel transistors. Since the OS transistors have low off-state currents and high on-state currents, both a low leakage current and high-speed operation can be achieved. Furthermore, the OS transistors may be used as elements having a rectifying function included in the demodulation circuit 1407. Since the OS transistors have low off-state currents, the reverse currents of the elements having a rectifying function can be made low, leading to excellent rectification efficiency. Furthermore, since the OS transistors can be formed through the same process, high performance of the RFIC 1400 can be achieved without an increase in process cost.

<<Structure Example of Wireless Sensor>>

Figure 21:
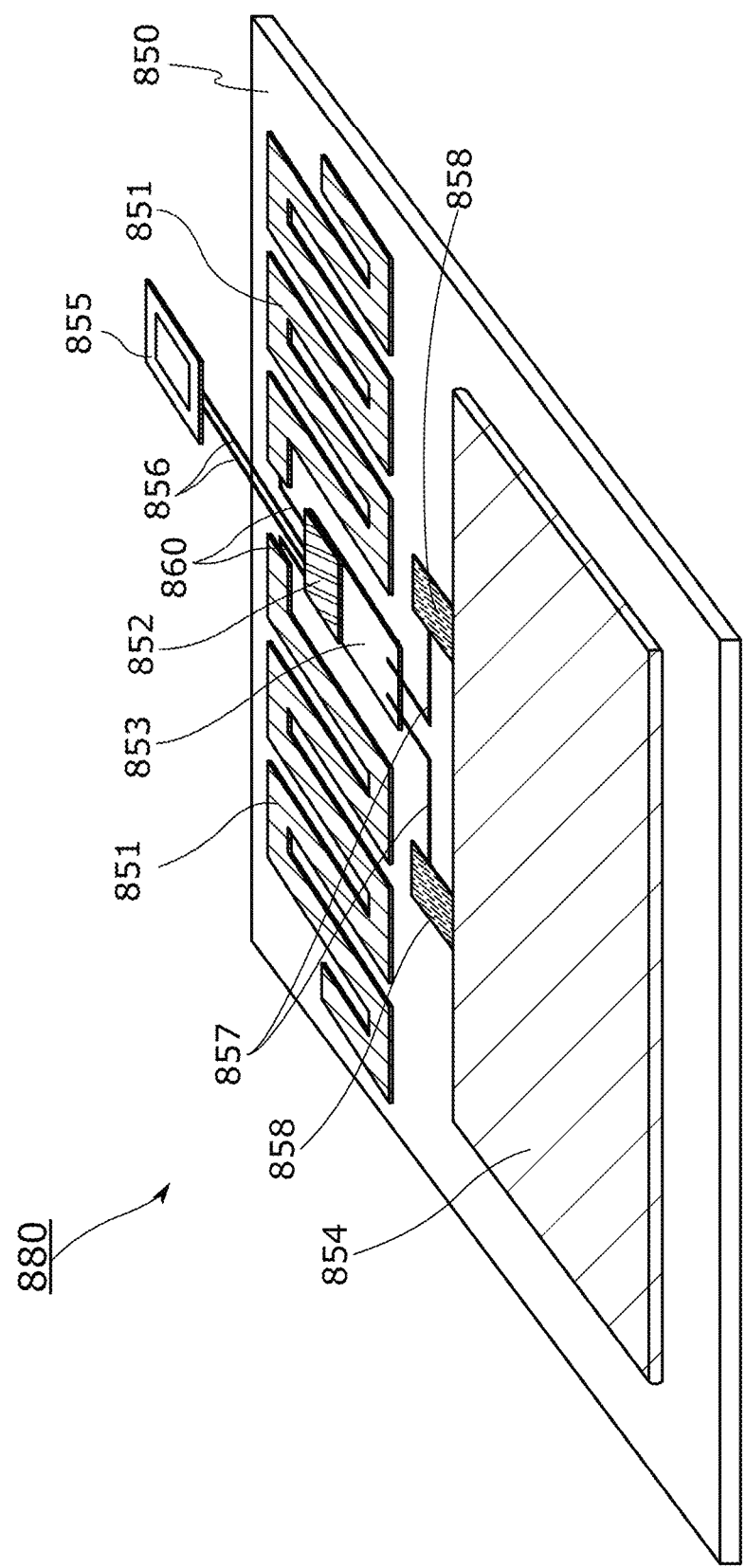
FIG. 21 shows outward appearances of a structure example of a wireless sensor.

An RFIC and a sensor device may be combined to form a wireless sensor. FIG. 21 is an external view illustrating a structural example of a wireless sensor 880. The wireless sensor 880 includes a support 850, an antenna 851, an integrated circuit 852, a circuit board 853, a sensor 855, and a battery 854.

The circuit board 853 is provided with the integrated circuit 852. The integrated circuit 852 includes a circuit portion of the RFIC. The antenna 851 is connected to the integrated circuit 852 through the wiring 860. The sensor 855 is connected to the integrated circuit 852 through the wiring 856. Furthermore, the sensor 855 is formed either outside the support 850 or over the support 850. The sensor 855 is a circuit having a function of outputting various kinds of data such as thermal data, mechanical data, and electromagnetic data, as analog data.

The battery 854 includes a pair of terminal 858 (a positive electrode terminal, a negative electrode terminal). The pair of terminals 858 are connected to the integrated circuit 852 through a wiring 857 and the circuit board 853. The battery 854 may be provided as appropriate in accordance with the operation power of the wireless sensor.

The support 850 can be formed using glass, quartz, plastic, metal, stainless steel foil, tungsten foil, a flexible substrate, an attachment film, a base film, paper including a fibrous material, or wood, for example. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

The wireless sensor 880 is preferably thin. In particular, the thickness of the wireless sensor 880 including the thicknesses of the battery 854 and the support 850 is larger than or equal to 0.1 mm and smaller than or equal to 5 mm, preferably larger than or equal to 0.1 mm and smaller than or equal to 3 mm, further preferably larger than or equal to 0.1 mm and smaller than or equal to 1 mm. The wireless sensor 880 having the above structure can be embedded in paper such as a poster or corrugated cardboard.

Furthermore, the wireless sensor 880 is preferably flexible. In particular, the support 850 and the battery 854 are preferably able to be changed in their forms with a curvature radius of 30 mm or more, preferably 10 nm or more. The wireless sensor 880 having the above structure can be worn on clothing or a human body.

In order to obtain the above structure, the battery 854 is preferably thin and flexible. As an exterior body of the battery 854, for example, a film having a three-layer structure of a first thin film, a second thin film, and a third thin film formed in this order may be used. Note that the third thin film has a function as the outer surface of the exterior body. Examples of a material for the first thin film include polyethylene, polypropylene, polycarbonate, ionomer, and polyamide. Examples of a material for the second thin film include a highly flexible thin metal film of aluminum, stainless steel, copper, nickel, or the like. Examples of a material for the third thin film include an insulating synthetic resin film of a polyamide-based resin, a polyester-based resin, or the like.

<<Semiconductor Device Including Wireless Sensor>>

Figure 22:
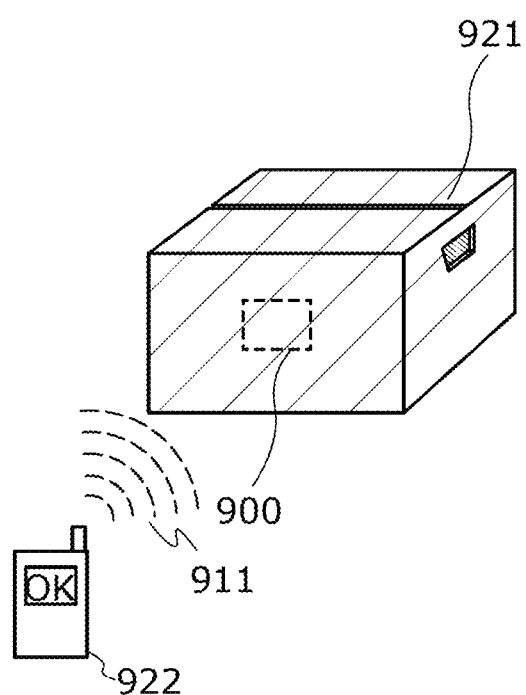
FIG. 22 schematically illustrates an application example of a wireless sensor.

A semiconductor device including a wireless sensor is described. As application examples of the wireless sensor, there is an individual identification tag, for example. FIG. 22 schematically illustrates an individual identification system with the use of a wireless sensor. A wireless sensor 900 is attached to, or incorporated in an article 921, and a radio signal 911 is sent from an external reader 922. The wireless sensor 900 having received the radio signal 911 can obtain data on the temperature or the like without a touch of the article 921 but with the sensor, and send the data to the external reader 922.

Figure 23A:
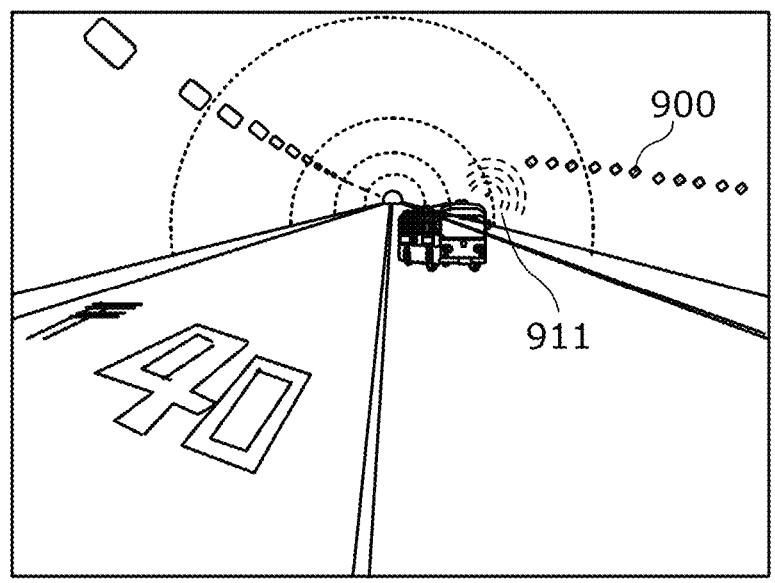
FIGS. 23A and 23B schematically illustrate application examples of a wireless sensor.

Another application form of the wireless sensor is described with a schematic view of FIG. 23A. For example, the wireless sensor 900 is embedded in a tunnel wall surface, and a radio signal 911 is sent externally. The wireless sensor 900 having received the radio signal 911 can obtain data on the tunnel wall surface by the sensor and send the data.

Figure 23B:
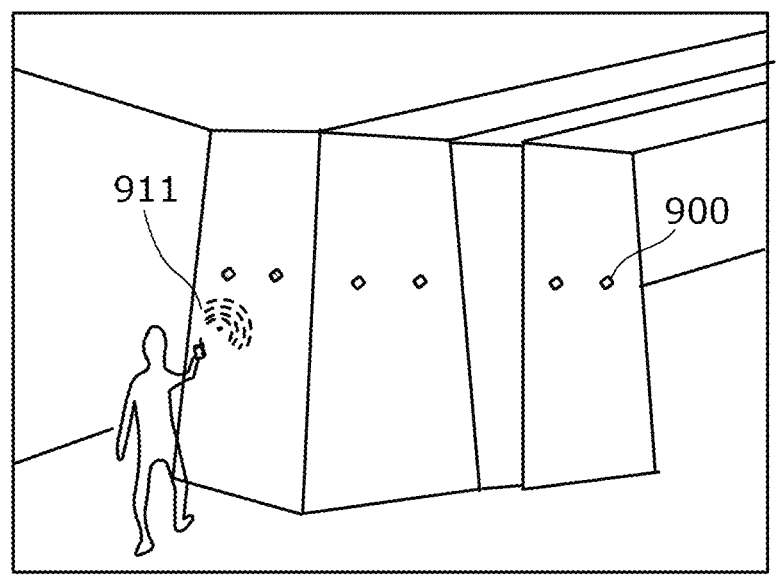

Another application form of the wireless sensor can be described with a schematic view of FIG. 23B. For example, the wireless sensor 900 is embedded in a wall surface of a pillar of a bridge, and the radio signal 911 is sent externally. The wireless sensor 900 having received the radio signal 911 can obtain data in the pillar of the bridge by the sensor and send the data.

Figure 24:
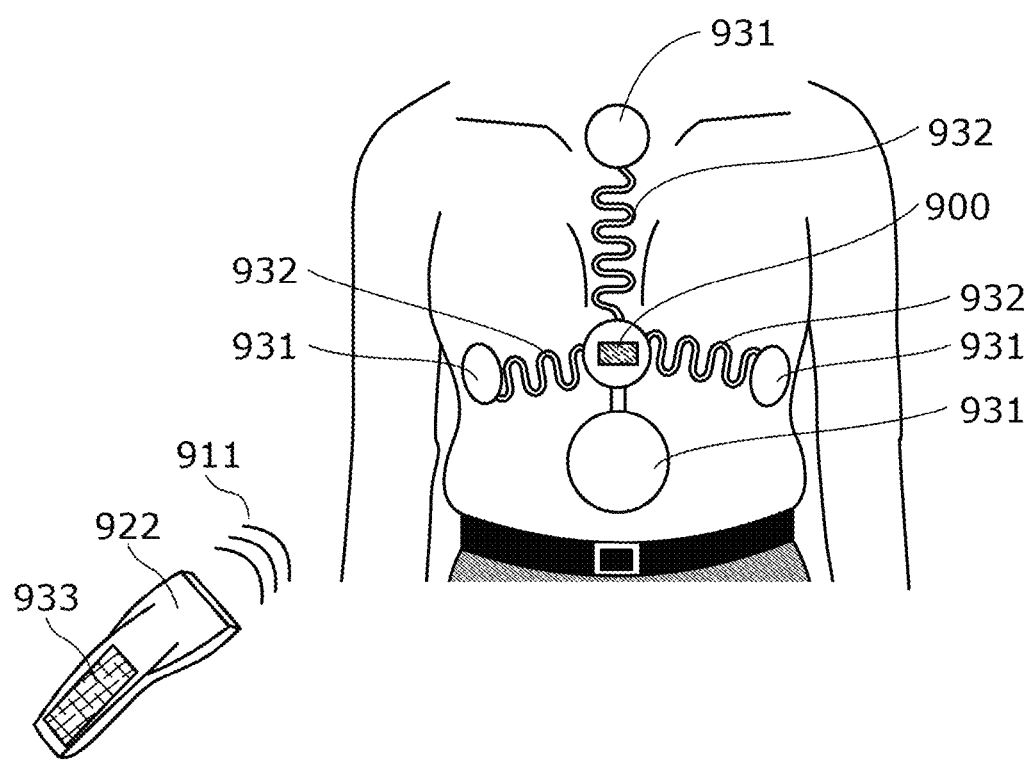
FIG. 24 schematically illustrates an application example of a wireless sensor.

The wireless sensor can be used for healthcare devices, an example of which is illustrated in FIG. 24. For example, the wireless sensor 900 is attached to a human body with the use of a bond pad or the like, and the radio signal 911 is sent from the external reader 922. The wireless sensor 900 having received the radio signal 911 can obtain data such as biological data by supplying a signal to an electrode 931 or the like attached to the human body through a wiring 932, and send the data. The obtained data can be checked on a display 933 of the external reader 922.

Although the CPU and the RFIC are described here as examples of a processing unit, the memory device of one embodiment of the present invention can be used for a variety of processing units. For example, the memory device of one embodiment of the present invention can also be used for a graphics processing unit (GPU), a programmable logic device (PLD), a digital signal processor (DSP), a microcontroller unit (MCU), and a custom LSI.

<<Manufacturing Method Example and Structure Example of Electronic Component>>

Figure 25A:
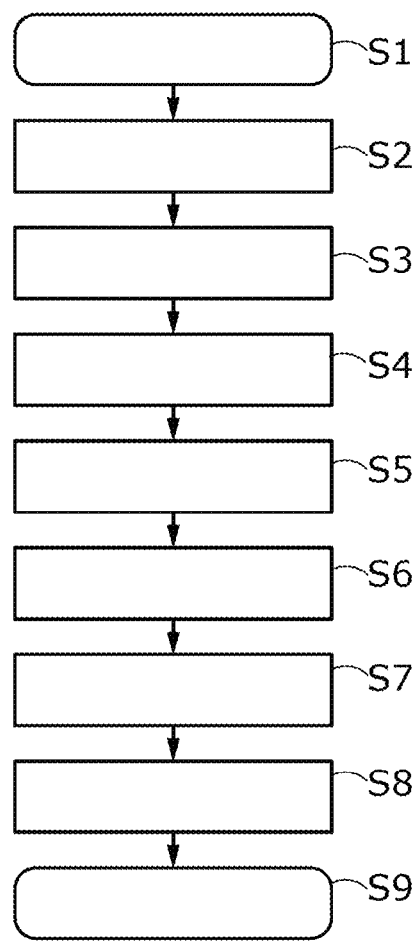
FIG. 25A is a flow chart showing an example of a manufacturing method of an electronic component.

Here, an electronic component and an electronic device or the like including a memory device or the electronic component will be described as examples of a semiconductor device. FIG. 25A is a flow chart showing an example of a method for manufacturing an electronic component. The electronic component is also referred to as a semiconductor package, an IC package, or a package. This electronic component has various standards and names corresponding to the direction and the shape of terminals. Therefore, an example of the electronic component will be described in this embodiment.

A semiconductor device including a transistor is completed by integrating detachable components on a printed board through an assembly process (post-process). The post-process can be completed through the steps in FIG. 25A. Specifically, after an element substrate is completed in a pre-process (Step S1), a dicing step in which the substrate is divided into a plurality of chips is performed (Step S2). Before the substrate is divided into a plurality of pieces, the substrate is thinned to reduce warpage or the like of the substrate caused in the pre-process and to reduce the size of the component.

The chip is picked up, mounted on a lead frame, and bonded thereto in a die bonding step (Step S3). In the die bonding step, the chip may be bonded to the lead frame by an appropriate method depending on the product, for example, with a resin or a tape. As the bonding method, a method suitable for the product may be selected. In the die bonding step, the chip may be mounted on an interposer and bonded thereto. In a wire bonding step, a lead of the lead frame and an electrode on the chip are electrically connected to each other with a metal wire (Step S4). As the metal wire, a silver wire or a gold wire can be used. The wire bonding may be either ball bonding or wedge bonding.

A molding step is performed to seal the wire-bonded chip with an epoxy resin or the like (Step S5). After being plated, the lead of the lead frame is cut and processed (Step S6). The plating process prevents rust of the lead and facilitates soldering at the time of mounting on a printed board in a later step. Printing (marking) is performed on the package surface (Step S7). After a testing step (Step S8), the electronic component is completed (Step S9). An electronic component including the semiconductor device described in the above embodiment can achieve low power consumption and a small size.

Figure 25B:
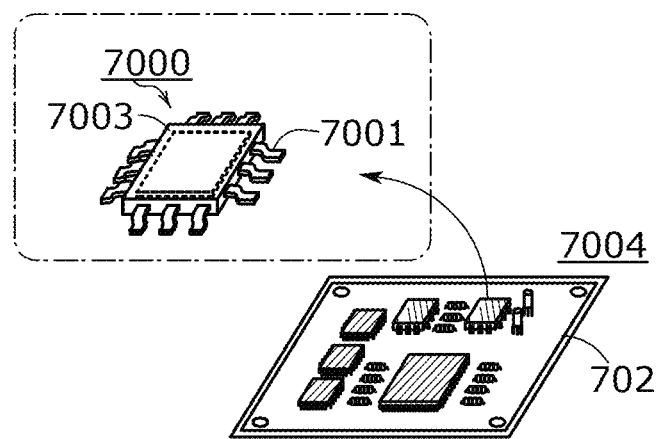
FIG. 25B is a schematic perspective view illustrating a structure example of an electronic component.

FIG. 25B is a perspective schematic view of the completed electronic component. As an example, FIG. 25B illustrates a quad flat package (QFP). In FIG. 25B, an electronic component 7000 includes a lead 7001 and a circuit portion 7003. In the circuit portion 7003, for example, semiconductor devices such as the memory device of Embodiment 1 and the processing unit of this embodiment are provided. The electronic component 7000 is mounted on a printed board 7002, for example. A plurality of electronic components 7000 which are combined and electrically connected to each other over the printed board 7002 can be mounted on an electronic device. A completed circuit board 7004 is provided in an electronic device or the like. The electronic component 7000 can be used as, for example, a random access memory that stores data or a processing unit that executes various kinds of processing, such as a CPU, a microcontroller unit (MCU), an FPGA, or a wireless IC. When an electronic device includes the electronic component 7000, the power consumption of the electronic device can be reduced, or a size reduction of the electronic device can be easily achieved.

The electronic component 7000 can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Such an electronic device can be used for display devices, personal computers (PC), image reproducing devices provided with recording media (devices which reproduce the content of recording media such as DVDs, Blu-ray discs, flash memories, and HDDs and have display portions for displaying images), cellular phones, game machines including portable game machines, portable data terminals, e-book readers, cameras (e.g., video cameras and digital still cameras), wearable display devices (e.g., head mounted display devices, goggle-type display devices, glasses-type display devices, armband-type display devices, bracelet-type display devices, and necklace-type display devices), navigation systems, audio reproducing devices (e.g., car audio systems and digital audio players), copiers, facsimiles, printers, multifunction printers, automated teller machines (ATM), and vending machines. FIGS. 26A to 26H illustrate specific examples of these electronic devices.

<<Electronic Device>>

FIGS. 26A to 26F illustrate examples of an electronic device which includes a display portion and is driven by a battery.

Figure 26A:
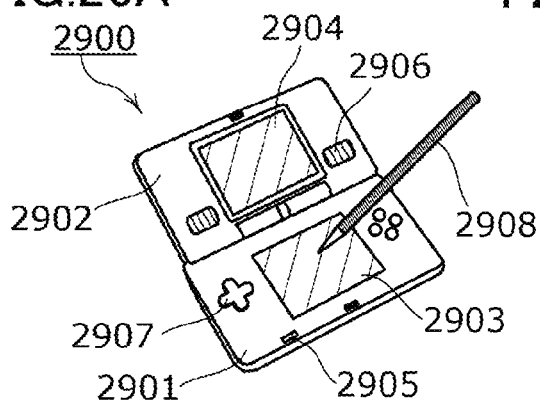
FIGS. 26A to 26H illustrate examples of an electronic device.

A portable game machine 2900 illustrated in FIG. 26A includes a housing 2901, a housing 2902, a display portion 2903, a display portion 2904, a microphone 2905, a speaker 2906, an operation key 2907, and the like. The display portion 2903 is provided with a touch screen as an input device, which can be handled with a stylus 2908 or the like.

Figure 26B:
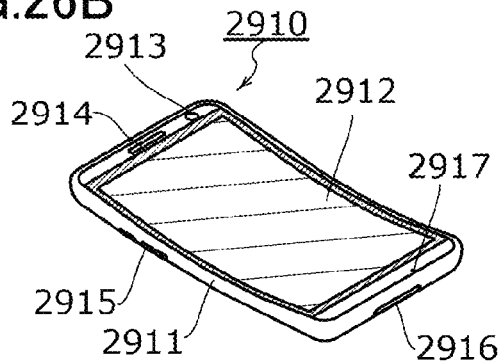

An information terminal 2910 illustrated in FIG. 26B includes a housing 2911, a display portion 2912, a microphone 2917, a speaker portion 2914, a camera 2913, an external connection portion 2916, an operation button 2915, and the like. A display panel that uses a flexible substrate and a touch screen are provided in the display portion 2912. The information terminal 2910 can be used as, for example, a smartphone, a mobile phone, a tablet information terminal, a tablet PC, or an e-book reader.

Figure 26C:
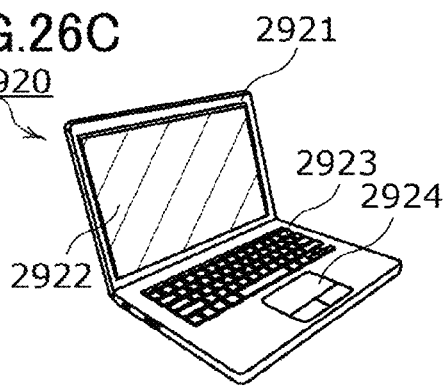

A notebook PC 2920 illustrated in FIG. 26C includes a housing 2921, a display portion 2922, a keyboard 2923, a pointing device 2924, and the like.

Figure 26D:
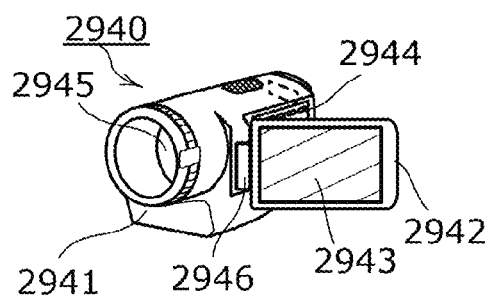

A video camera 2940 illustrated in FIG. 26D includes a housing 2941, a housing 2942, a display portion 2943, operation keys 2944, a lens 2945, a joint 2946, and the like. The operation keys 2944 and the lens 2945 are provided in the housing 2941, and the display portion 2943 is provided in the housing 2942. The housings 2941 and 2942 are connected to each other with the joint 2946, and the angle between the housings 2941 and 2942 can be changed with the joint 2946. The direction of an image on the display portion 2943 may be changed and display and non-display of an image may be switched depending on the angle between the housings 2941 and 2942.

Figure 26E:
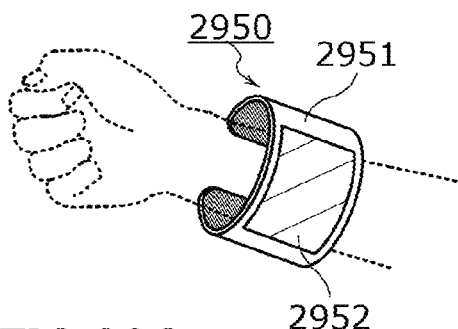

FIG. 26E illustrates an example of a bangle-type information terminal. An information terminal 2950 includes a housing 2951, a display portion 2952, and the like. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 26F:
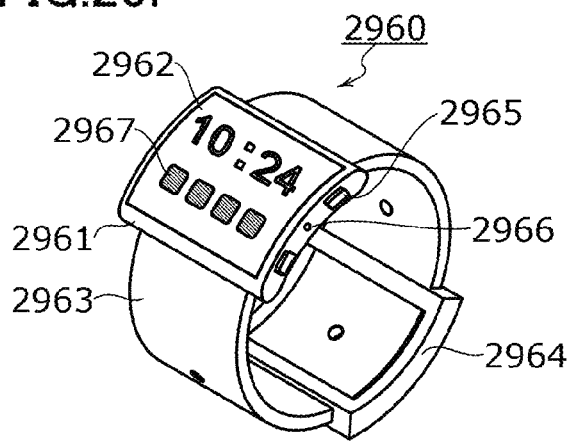

FIG. 26F illustrates an example of a watch-type information terminal. An information terminal 2960 includes a housing 2961, a display portion 2962, a band 2963, a buckle 2964, an operation button 2965, an input/output terminal 2966, and the like. The information terminal 2960 is capable of executing a variety of applications such as mobile phone calls, e-mailing, viewing and editing texts, music reproduction, Internet communication, and computer games.

The display surface of the display portion 2962 is bent, and images can be displayed on the bent display surface. Further, the display portion 2962 includes a touch sensor, and operation can be performed by touching the screen with a finger, a stylus, or the like. For example, by touching an icon 2967 displayed on the display portion 2962, an application can be started. With the operation button 2965, a variety of functions such as time setting, power ON/OFF, ON/OFF of wireless communication, setting and cancellation of silent mode, and setting and cancellation of power saving mode can be performed. For example, the functions of the operation button 2965 can be set by setting the operating system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 26G:
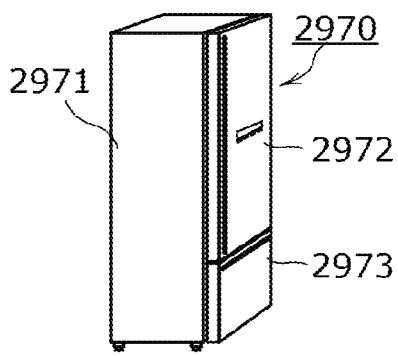

FIG. 26G illustrates an electric refrigerator-freezer as an example of a home electric appliance. An electric refrigerator-freezer 2970 includes a housing 2971, a refrigerator door 2972, a freezer door 2973, and the like.

Figure 26H:
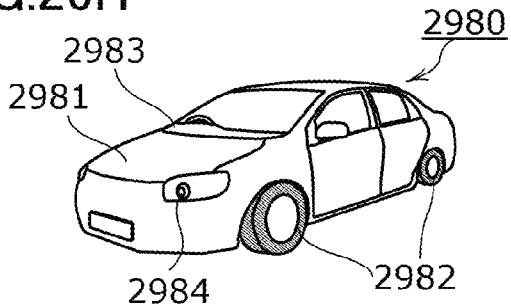

FIG. 26H is an external view illustrating a structure example of a motor vehicle. A motor vehicle 2980 includes a car body 2981, wheels 2982, a dashboard 2983, lights 2984, and the like.

An electronic component including the semiconductor device described in the above embodiment is provided in the electronic devices described in this embodiment.

Thus, stable operation can be achieved.

Embodiment 3

In this embodiment, an OS transistor including an oxide semiconductor is described.

<<Structure Example 1 of OS Transistor>>

Figure 27A:
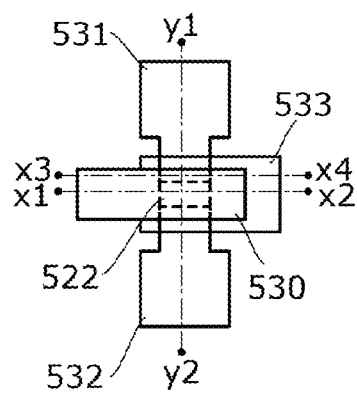
FIGS. 27A, 27B, 27C, and 27D are a top view, a cross-sectional view along a line y1-y2, a cross-sectional view along a line x1-x2, and a cross-sectional view along a line x3-x4, respectively, illustrating a structure example of an OS transistor.
Figure 27B:
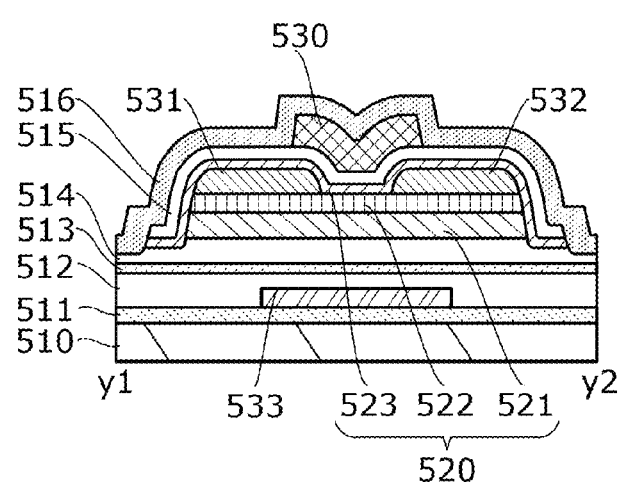
Figure 27C:
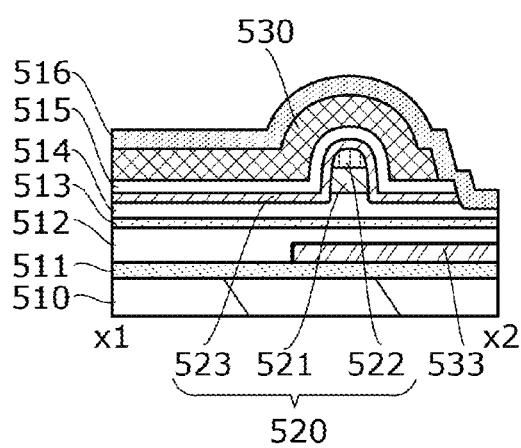
Figure 27D:
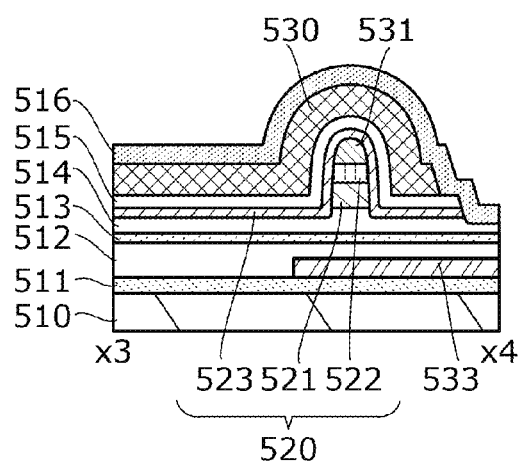

FIGS. 27A to 27D illustrate a structure example of an OS transistor. FIG. 27A is a top view illustrating a structure example of an OS transistor. FIG. 27B is a cross-sectional view taken along line y1-y2. FIG. 27C is a cross-sectional view taken along line x1-x2. FIG. 27D is a cross-sectional view taken along line x3-x4. In some cases, the direction of line y1-y2 is referred to as a channel length direction, and the direction of line x1-x2 is referred to as a channel width direction. Accordingly, FIG. 27B illustrates a cross-sectional structure of the OS transistor in the channel length direction, and FIGS. 27C and 27D each illustrate a cross-sectional structure of the OS transistor in the channel width direction. Note that to clarify the device structure, FIG. 27A does not illustrate some components.

An OS transistor 501 is formed over an insulating surface, here, over an insulating layer 511. The insulating layer 511 is formed over a surface of a substrate 510. The OS transistor 501 is covered with an insulating layer 516. Note that the insulating layer 516 can be regarded as a component of the OS transistor 501. The OS transistor 501 includes an insulating layer 512, an insulating layer 513, an insulating layer 514, an insulating layer 515, semiconductor layers 521 to 523, a conductive layer 530, a conductive layer 531, a conductive layer 532, and a conductive layer 533. Here, the semiconductor layers 521 to 523 are collectively referred to as a semiconductor region 520.

The conductive layer 530 functions as a gate electrode, and the conductive layer 533 functions as a back gate electrode. The conductive layers 531 and 532 function as a source electrode and a drain electrode. The insulating layer 511 has a function of electrically isolating the substrate 510 from the conductive layer 533. The insulating layer 515 serves as a gate insulating layer, and the insulating layers 513 and 514 serve as gate insulating layers on the back-channel side.

The channel length refers to, for example, a distance between a source (a source region or a source electrode) and a drain (a drain region or a drain electrode) in a region where a semiconductor (or a portion where current flows in a semiconductor when the transistor is on) and a gate electrode overlap with each other or in a region where a channel is formed in a top view of the transistor. In one transistor, channel lengths in all regions do not necessarily have the same value. In other words, the channel length of one transistor is not fixed to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when the transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Accordingly, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, the term "channel width" may denote a surrounded channel width or an apparent channel width. Alternatively, the term "channel width" may denote an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used in calculating field-effect mobility, a current value per channel width, and the like of a transistor. In this case, the obtained value is sometimes different from the value obtained by using an effective channel width for the simulation.

As illustrated in FIGS. 27B and 27C, the semiconductor region 520 includes a region where the semiconductor layer 521, the semiconductor layer 522, and the semiconductor layer 523 are stacked in that order. The insulating layer 515 covers this stack region. The conductive layer 530 overlaps with the stack region with the insulating layer 513 positioned therebetween. The conductive layers 531 and 532 are provided over the stack formed of the semiconductor layers 521 and 523 and are in contact with a top surface of this stack and a side surface positioned in the channel length direction of the stack. The stack of the semiconductor layers 521 and 522 and the conductive layers 531 and 532 are formed by etching using the same mask.

The semiconductor layer 523 is formed to cover the semiconductor layers 521 and 522 and the conductive layers 531 and 532. The insulating layer 515 covers the semiconductor layer 523. Here, the semiconductor layer 523 and the insulating layer 515 are etched using the same mask.

The conductive layer 530 is formed to surround, in the channel width direction, the region where the semiconductor layers 521 to 523 are stacked with the insulating layer 515 positioned therebetween (see FIG. 27C). Therefore, a gate electric field in a vertical direction and a gate electric field in a lateral direction are applied to this stack region. In the OS transistor 501, the gate electric field refers to an electric field generated by voltage applied to the conductive layer 530 (gate electrode layer). Accordingly, the whole stack region of the semiconductor layers 521 to 523 can be electrically surrounded by the gate electric fields, so that a channel is formed in the whole semiconductor layer 522 (bulk) in some cases. A device structure of a transistor in which, as in the OS transistor 501, a semiconductor layer where a channel is formed is electrically surrounded by electric fields of a gate electrode can be called a surrounded channel (s-channel) structure. With the s-channel structure, the OS transistor 501 can have high on-state current. Moreover, the s-channel structure can improve frequency characteristics of the OS transistor 501. Specifically, the s-channel structure can improve cutoff frequency.

The s-channel structure, because of its high on-state current, is suitable for a semiconductor device that needs a miniaturized transistor, such as a large scale integration (LSI) circuit. Since high on-state current can be obtained, the s-channel structure is suitable for a transistor that needs to operate at high frequency. A semiconductor device including the transistor can operate at high frequency.

Scaling down of the OS transistor can provide a small highly integrated semiconductor device. The OS transistor preferably has, for example, a region where the channel length is greater than or equal to 10 nm and less than 1 µm, preferably greater than or equal to 10 nm and less than 100 nm, further preferably greater than or equal to 10 nm and less than 70 nm, still further preferably greater than or equal to 10 nm and less than 60 nm, yet still further preferably greater than or equal to 10 nm and less than 30 nm. In addition, the OS transistor preferably has, for example, a region where the channel width is greater than or equal to 10 nm and less than 1 µm, preferably greater than or equal to 10 nm and less than 100 nm, further preferably greater than or equal to 10 nm and less than 70 nm, still further preferably greater than or equal to 10 nm and less than 60 nm, yet still further preferably greater than or equal to 10 nm and less than 30 nm.

An oxide semiconductor has lower thermal conductivity than silicon. Therefore, heat tends to persist inside the semiconductor region 520 of the OS transistor 501. As illustrated in FIGS. 27B and 27D, the conductive layer 531 and the conductive layer 532 are provided so as to overlap with the insulating layer 514 and the semiconductor region 520. This allows heat generated in the semiconductor region 520 (especially the semiconductor layer 522) to be radiated through the conductive layers 531 and 532.

<Insulating Layer>

The insulating layers 511 to 516 are each formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

In this specification, an oxynitride refers to a compound that includes more oxygen than nitrogen, and a nitride oxide refers to a compound that includes more nitrogen than oxygen. In this specification and the like, an oxide whose nitrogen concentration is lower than 1 atomic % is also used as an insulating material.

The insulating layers 514 and 515 each preferably contain an oxide because they are in contact with the semiconductor region 520. In particular, the insulating layers 514 and 515 each preferably contain an oxide material from which part of oxygen is released by heating. The insulating layers 514 and 515 each preferably contain an oxide containing oxygen more than that in the stoichiometric composition. Part of oxygen is released by heating from an oxide film containing oxygen more than that in the stoichiometric composition. Oxygen released from the insulating layers 514 and 515 is supplied to the semiconductor region 520 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis under the conditions where the temperature of the film surface is higher than or equal to 100° C. and lower than or equal to 700° C., for example. Note that the temperature of the film surface in the TDS analysis is preferably higher than or equal to 100° C. and lower than or equal to 700° C., or higher than or equal to 100° C. and lower than or equal to 500° C.

The insulating layer 513 has a passivation function for preventing oxygen contained in the insulating layer 514 from being bonded to metal contained in the conductive layer 533 and being decreased. The insulating layer 516 has a passivation function for preventing oxygen contained in the insulating layer 514 from being decreased.

The insulating layers 511, 513, and 516 each preferably have a function of blocking oxygen, hydrogen, water, an alkali metal, an alkaline earth metal, and the like. The insulating layers 511, 513, and 516 can prevent outward diffusion of oxygen from the semiconductor region 520 and entry of hydrogen, water, or the like into the semiconductor region 520 from the outside. The insulating layers 511, 513, and 516 may each be formed using, for example, at least one insulating film of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like so that they can have such a function.

<Conductive Layer>

Each of the conductive layers 530 to 533 preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr); an alloy of such a low-resistance material; or a compound containing such a material as its main component. It is particularly preferable to use a high-melting-point material that has heat resistance and conductivity, such as tungsten or molybdenum. Each of the conductive layers 530 to 533 is preferably formed using a low-resistance conductive material such as aluminum or copper. Each of the conductive layers 530 to 533 is particularly preferably formed using a Cu—Mn alloy because manganese oxide formed at the interface with an insulator containing oxygen has a function of preventing Cu diffusion.

The conductive layers 531 and 532 in the OS transistor 502 are formed using a hard mask used for forming the stack of the semiconductor layers 521 and 522. Therefore, the conductive layers 531 and 532 do not include regions in contact with the side surfaces of the semiconductor layers 521 and 522. For example, through the following steps, the semiconductor layers 521 and 522 and the conductive layers 531 and 532 can be formed. A two-layer oxide semiconductor film including the semiconductor layers 521 and 522 is formed. A single-layer or multi-layer conductive film is formed over the oxide semiconductor film. This conductive film is etched, so that a hard mask is formed. Using this hard mask, the two-layer oxide semiconductor film is etched to form the semiconductor layers 521 and 522. Then, the hard mask is etched to form the conductive layers 531 and 532.

<Semiconductor Layer>

The semiconductor layer 522 is an oxide semiconductor containing indium (In), for example. The semiconductor layer 522 can have high carrier mobility (electron mobility) by containing indium, for example. The semiconductor layer 522 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor layer 522 preferably contains zinc (Zn). When the oxide semiconductor contains zinc, the oxide semiconductor is easily to be crystallized in some cases.

The semiconductor layer 522 is not limited to the oxide semiconductor containing indium. The semiconductor layer 522 may be an oxide semiconductor which does not contain indium and contains zinc, gallium, or tin (e.g., a zinc tin oxide or a gallium tin oxide). For the semiconductor layer 522, an oxide with a wide energy gap is used, for example. The energy gap of the semiconductor layer 522 is, for example, greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. The semiconductor region 520 is preferably formed using a CAAC-OS to be described in Embodiment 4. At least the semiconductor layer 522 is preferably formed using a CAAC-OS.

For example, the semiconductor layers 521 and 523 include one or more, or two or more elements other than oxygen included in the semiconductor layer 522. Since the semiconductor layers 521 and 523 include one or more, or two or more elements other than oxygen included in the semiconductor layer 522, an interface state is less likely to be formed at an interface between the semiconductor layers 521 and 522 and an interface between the semiconductor layers 522 and 523.

In the case of using an In-M-Zn oxide as the semiconductor layer 521, when the total proportion of In and M is assumed to be 100 atomic %, the proportions of In and M are preferably set to be lower than 50 atomic % and higher than 50 atomic %, respectively, further preferably lower than 25 atomic % and higher than 75 atomic %, respectively. When the semiconductor layer 521 is formed by sputtering, a sputtering target with the above composition is preferably used. For example, In:M:Zn is preferably 1:3:2.

In the case of using an In-M-Zn oxide as the semiconductor layer 522, when the total proportion of In and M is assumed to be 100 atomic %, the proportions of In and M are preferably set to be higher than 25 atomic % and lower than 75 atomic %, respectively, further preferably higher than 34 atomic % and lower than 66 atomic %, respectively. When the semiconductor layer 522 is formed by sputtering, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the semiconductor layer 522 may become 4:2:3 or in the neighborhood of 4:2:3.

In the case of using an In-M-Zn oxide as the semiconductor layer 523, when the total proportion of In and M is assumed to be 100 atomic %, the proportions of In and M are preferably set to be lower than 50 atomic % and higher than 50 atomic %, respectively, further preferably lower than 25 atomic % and higher than 75 atomic %, respectively. The semiconductor layer 523 may be an oxide that is the same type as that of the semiconductor layer 521. Note that the semiconductor layer 521 and/or the semiconductor layer 523 does not necessarily contain indium in some cases. For example, the semiconductor layer 521 and/or the semiconductor layer 523 may be gallium oxide.

(Energy Band Structure)

Figure 28A:
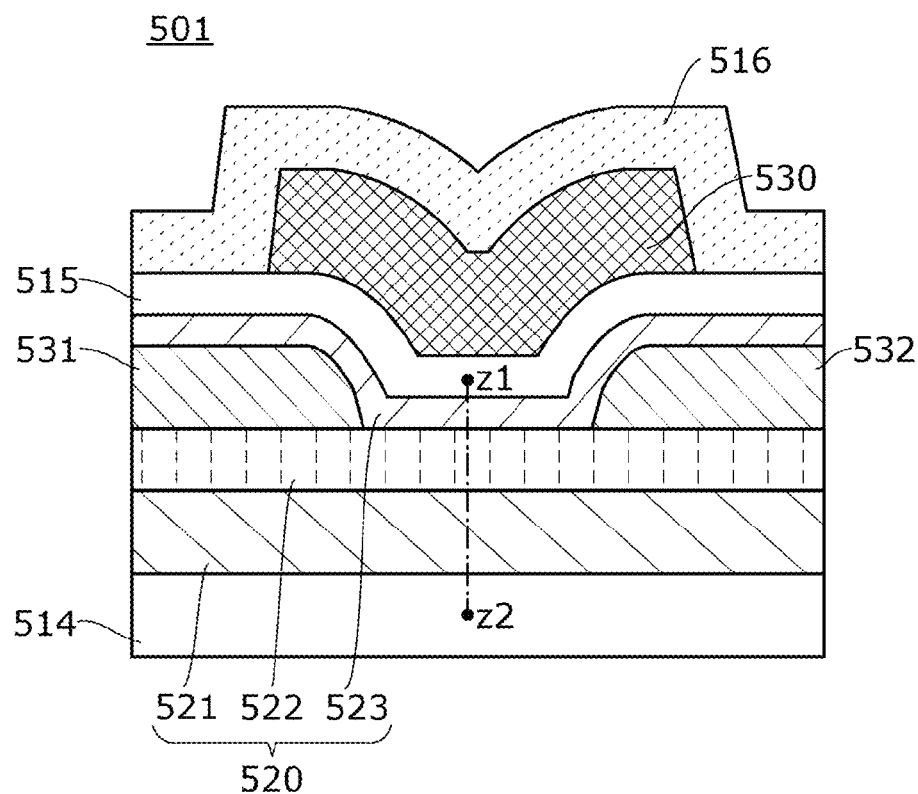
FIG. 28A is an enlarged view illustrating a portion in FIG. 27B.
Figure 28B:
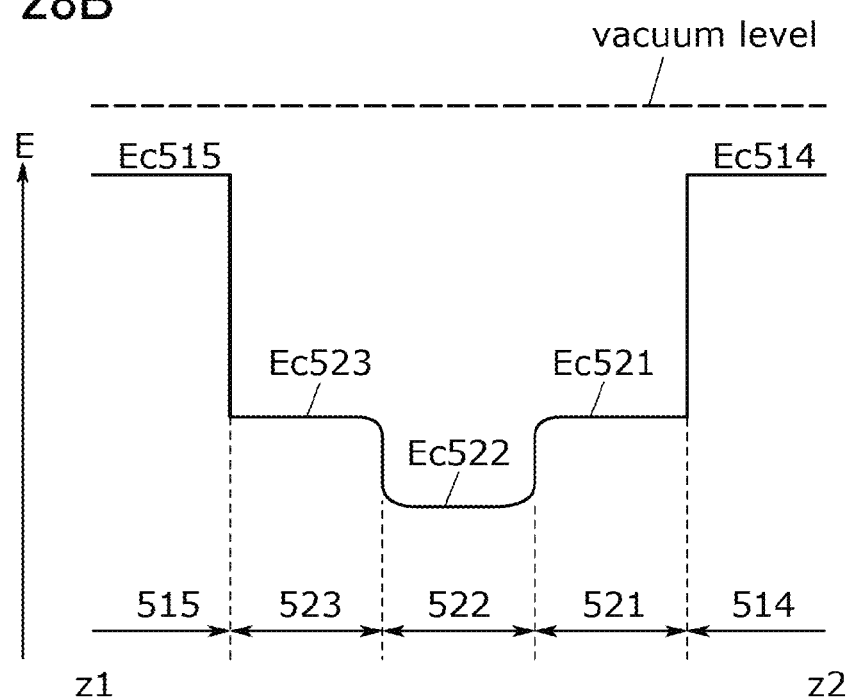
FIG. 28B is an energy band diagram of the OS transistor.

The function and effect of the semiconductor region 520 in which the semiconductor layers 521, 522, and 523 are stacked are described with reference to FIGS. 28A and 28B. FIG. 28A is a partial enlarged view of an active layer (channel region) of the OS transistor 501 in FIG. 27B. FIG. 28B shows an energy band structure of a portion taken along dotted line z1-z2 (the active layer of the OS transistor 501) in FIG. 28A.

In FIG. 28B, Ec514, Ec521, Ec522, Ec523, and Ec515 indicate the energy at the bottom of the conduction band of the insulating layer 514, the semiconductor layer 521, the semiconductor layer 522, the semiconductor layer 523, and the insulating layer 515, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer. The energy difference between the vacuum level and the top of the valence band can be measured using an ultraviolet photoelectron spectroscopy (UPS) device.

Since the insulating layer 514 and the insulating layer 515 are insulators, Ec514 and Ec515 are closer to the vacuum level than Ec521, Ec522, and Ec523 (i.e., the insulating layer 514 and the insulating layer 515 have a lower electron affinity than the semiconductor layers 521, 522, and 523).

The semiconductor layer 522 is an oxide layer having higher electron affinity than the semiconductor layers 521 and 523. For example, as the semiconductor layer 522, an oxide having an electron affinity higher than those of the semiconductor layers 521 and 523 by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that electron affinity is an energy gap between the vacuum level and the bottom of the conduction band.

An indium gallium oxide has low electron affinity and a high oxygen-blocking property. Therefore, the semiconductor layer 523 preferably includes an indium gallium oxide. The gallium atomic ratio [Ga/(In+Ga)] is, for example, higher than or equal to 70%, preferably higher than or equal to 80%, further preferably higher than or equal to 90%. At this time, when gate voltage is applied, a channel is formed in the semiconductor layer 522 having the highest electron affinity among the semiconductor layers 521 to 523.

In some cases, there is a mixed region of the semiconductor layers 521 and 522 between the semiconductor layers 521 and 522. Furthermore, in some cases, there is a mixed region of the semiconductor layers 522 and 523 between the semiconductor layers 522 and 523. Because the mixed region has low interface state density, a stack of the semiconductor layers 521 to 523 has a band structure where energy is changed continuously at each interface and in the vicinity of the interface (continuous junction).

At this time, electrons move mainly in the semiconductor layer 522, not in the semiconductor layers 521 and 523. As described above, when the interface state density at the interface between the semiconductor layers 521 and 522 and the interface state density at the interface between the semiconductor layers 522 and 523 are decreased, electron movement in the semiconductor layer 522 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to move efficiently. Electron movement is inhibited, for example, in the case where physical unevenness in a channel formation region is large. The electron movement is also inhibited, for example, in the case where the density of defect states is high in the channel formation region.

To increase the on-state current of the OS transistor 501, for example, the root mean square (RMS) roughness in a measurement area of 1 μm×1 μm of a top surface or a bottom surface of the semiconductor layer 522 (a formation surface; here, the semiconductor layer 521) is less than 1 nm, preferably less than 0.6 nm, further preferably less than 0.5 nm, still further preferably less than 0.4 nm. The average surface roughness (Ra) in the measurement area of 1 μm×1 μm is less than 1 nm, preferably less than 0.6 nm, further preferably less than 0.5 nm, still further preferably less than 0.4 nm. The maximum difference (P-V) in the measurement area of 1 μm×1 μm is less than 10 nm, preferably less than 9 nm, further preferably less than 8 nm, still further preferably less than 7 nm. The RMS roughness, Ra, and P-V can be measured using a scanning probe microscope.

For example, in the case where the semiconductor layer 522 contains oxygen vacancies (Vo), donor levels are formed by entry of hydrogen into oxygen vacancy sites in some cases. A state in which hydrogen enters oxygen vacancy sites is denoted by VoH in the following description in some cases. VoH is a factor of decreasing the on-state current of the transistor because VoH scatters electrons. Note that oxygen vacancy sites become more stable by entry of oxygen than by entry of hydrogen. Thus, by decreasing oxygen vacancies in the semiconductor layer 522, the on-state current of the transistor can be increased in some cases.

For example, at a certain depth in the semiconductor layer 522 or in a certain region of the semiconductor layer 522, the concentration of hydrogen measured by secondary ion mass spectrometry (SIMS) is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$.

To decrease oxygen vacancies in the semiconductor layer 522, for example, there is a method in which excess oxygen in the insulating layer 514 is moved to the semiconductor layer 522 through the semiconductor layer 521. In that case, the semiconductor layer 521 is preferably a layer having an oxygen-transmitting property (a layer through which oxygen passes or is transmitted).

In the case where the OS transistor 501 has an s-channel structure, a channel is formed in the entire semiconductor layer 522. Therefore, as the semiconductor layer 522 has larger thickness, a channel region becomes larger. In other words, the thicker the semiconductor layer 522 is, the larger the on-state current of the OS transistor 501 is.

Moreover, the thickness of the semiconductor layer 523 is preferably as small as possible to increase the on-state current of the OS transistor 501. For example, the semiconductor layer 523 has a region with a thickness of less than 10 nm, preferably less than or equal to 5 nm, further preferably less than or equal to 3 nm. Meanwhile, the semiconductor layer 523 has a function of blocking entry of elements other than oxygen (such as hydrogen and silicon) included in the adjacent insulator into the semiconductor layer 522 where a channel is formed. Thus, it is preferable that the semiconductor layer 523 have a certain thickness. For example, the semiconductor layer 523 may have a region with a thickness of greater than or equal to 0.3 nm, preferably greater than or equal to 1 nm, further preferably greater than or equal to 2 nm. The semiconductor layer 523 preferably has an oxygen blocking property to inhibit outward diffusion of oxygen released from the insulating layer 513 and the like.

To improve reliability of the OS transistor 501, preferably, the thickness of the semiconductor layer 521 is large and the thickness of the semiconductor layer 523 is small. For example, the semiconductor layer 521 has a region with a thickness of greater than or equal to 10 nm, preferably greater than or equal to 20 nm, further preferably greater than or equal to 40 nm, still further preferably greater than or equal to 60 nm. When the thickness of the semiconductor layer 521 is made large, the distance from an interface between the adjacent insulator and the semiconductor layer 521 to the semiconductor layer 522 in which a channel is formed can be large. Note that the semiconductor layer 521 has a region with a thickness of, for example, less than or equal to 200 nm, preferably less than or equal to 120 nm, further preferably less than or equal to 80 nm because the productivity of the semiconductor device might be decreased.

In order that the OS transistor 501 have stable electrical characteristics, it is effective to make the semiconductor layer 522 intrinsic or substantially intrinsic by reducing the concentration of impurities in the semiconductor region 520. Note that in this specification and the like, the carrier density of a substantially intrinsic oxide semiconductor film is higher than or equal to $1\times10^{-9}/cm^3$ and lower than $8\times10^{11}/cm^3$, preferably lower than $1\times10^{11}/cm^3$, further preferably lower than $1\times10^{10}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the semiconductor layers 521, 522, and 523 and at interfaces between the semiconductor layers.

For example, a region in which the concentration of silicon is higher than or equal to $1\times10^{16}$ atoms/cm$^3$ and lower than $1\times10^{19}$ atoms/cm$^3$ is provided between the semiconductor layers 521 and 522. The concentration of silicon is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the semiconductor layers 522 and 523. The concentration of silicon is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the semiconductor layers 521 and 523 in order to reduce the concentration of hydrogen in the semiconductor layer 522. The semiconductor layers 521 and 523 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$. The concentration of hydrogen can be measured by SIMS.

It is preferable to reduce the concentration of nitrogen in the semiconductor layers 521 and 523 in order to reduce the concentration of nitrogen in the semiconductor layer 522. The semiconductor layers 521 and 523 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, still further preferably higher than or equal to $1\times10^{16}$ atoms/cm$^3$ and lower than or equal to $5\times10^{17}$ atoms/cm$^3$. The concentration of nitrogen can be measured by SIMS.

A transistor in which the above highly purified oxide semiconductor is used for a channel formation region exhibits extremely low off-state current. When voltage between a source and a drain is set at about 0.1 V, 5 V, or 10 V, for example, the off-state current normalized by the channel width of the transistor can be as low as several yoctoamperes per micrometer to several zeptoamperes per micrometer.

FIGS. 27A to 27D illustrate an example in which the semiconductor region 520 includes three layers; however, one embodiment of the present invention is not limited thereto. For example, the semiconductor region 520 may have a two-layer structure without the semiconductor layer 521 or 523. Alternatively, the semiconductor region 520 can have a four-layer structure in which a semiconductor layer similar to the semiconductor layers 521 to 523 is provided over or below the semiconductor layer 521 or over or below the semiconductor layer 523. Alternatively, the semiconductor region 520 can have an n-layer structure (n is an integer of 5 or more) in which semiconductor layers similar to the semiconductor layers 521 to 523 are provided at two or more of the following positions: over the semiconductor layer 521, below the semiconductor layer 521, over the semiconductor layer 523, and below the semiconductor layer 523.

In the case where the OS transistor 501 has no back gate electrode, the conductive layer 533 is not necessarily provided. In that case, the insulating layers 512 and 513 are not provided, and the insulating layer 513 is formed over the insulating layer 511.

<Charge Trap Layer>

While the threshold voltage of a Si transistor can be easily controlled by channel doping, the threshold voltage of an OS transistor is difficult to change effectively by channel doping. In an OS transistor, the threshold voltage can be changed by injecting electrons into a charge trap layer. For example, the injection of electrons into the charge trap layer can be performed with the use of the tunnel effect. By applying a positive voltage to the conductive layer 533, tunnel electrons are injected into the charge trap layer.

In the OS transistor 501 in FIGS. 27A to 27D, a charge trap layer can be provided in the insulating layer 515. In the case where a back gate (the conductive layer 533) is provided, a charge trap layer is preferably provided in the insulating layer 512 or the insulating layer 513. For example, when the insulating layer 513 is formed using hafnium oxide, aluminum oxide, tantalum oxide, aluminum silicate, or the like, the insulating layer 513 can function as a charge trap layer.

<Substrate>

As the substrate 510, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate can be used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. The semiconductor substrate may be a bulk semiconductor substrate or may be a silicon on insulator (SOI) substrate in which a semiconductor layer is provided for a semiconductor substrate with an insulating region positioned therebetween. As the conductor substrate, a graphite substrate, a metal substrate, an alloy substrate, a conductive resin substrate, or the like can be used. A substrate including a metal nitride, a substrate including a metal oxide, or the like can be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. As the element provided over the substrate, a capacitor, a resistor, a switching element, a light-emitting element, a memory element, or the like can be used.

A flexible substrate may be used as the substrate 510. As a method for providing a transistor over a flexible substrate, there is a method in which a transistor is formed over a non-flexible substrate (e.g., a semiconductor substrate), and then the transistor is separated and transferred to the substrate 510 that is a flexible substrate. In that case, a separation layer is preferably provided between the non-flexible substrate and the transistor. As the substrate 510, a sheet, a film, or foil containing a fiber may be used. The substrate 510 may have elasticity. The substrate 510 may have a property of returning to its original shape when bending or pulling is stopped. Alternatively, the substrate 510 may have a property of not returning to its original shape. The thickness of the substrate 510 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 510 has small thickness, the weight of the semiconductor device can be reduced. When the substrate 510 has small thickness, even in the case of using glass or the like, the substrate 510 may have elasticity or a property of returning to its original shape when bending or pulling is stopped. Therefore, an impact applied to the semiconductor device over the substrate 510, which is caused by dropping or the like, can be reduced. That is, a durable semiconductor device can be provided.

For the flexible substrate 510, metal, an alloy, resin, glass, or fiber thereof can be used, for example. The flexible substrate preferably has a lower coefficient of linear expansion because deformation due to an environment is suppressed. The flexible substrate is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate because of its low coefficient of linear expansion.

<<Structure Example 2 of OS Transistor>>

Figure 29A:
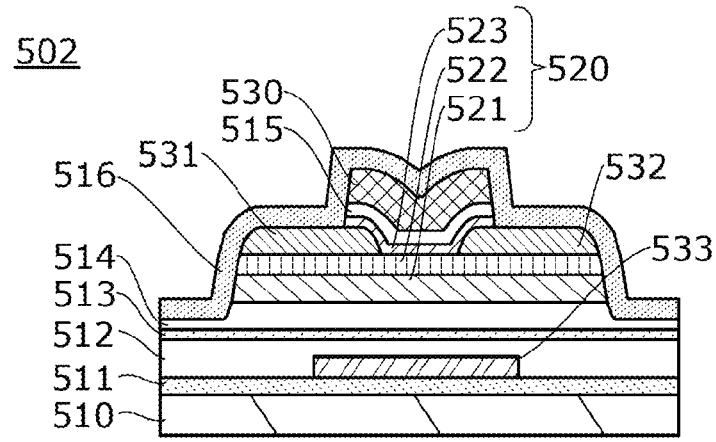
FIGS. 29A to 29C are cross-sectional views each illustrating a structure example of an OS transistor.

In the OS transistor 501 in FIGS. 27A to 27D, the semiconductor layer 523 and the insulating layer 515 can be etched using the conductive layer 530 as a mask. FIG. 29A illustrates a structure example of an OS transistor manufactured through such steps. In the OS transistor 502 in FIG. 29A, end portions of the semiconductor layer 523 and the insulating layer 515 are substantially aligned with an end portion of the conductive layer 530. The semiconductor layer 523 and the insulating layer 515 are provided only below the conductive layer 530.

<<Structure Example 3 of OS Transistor>>

Figure 29B:
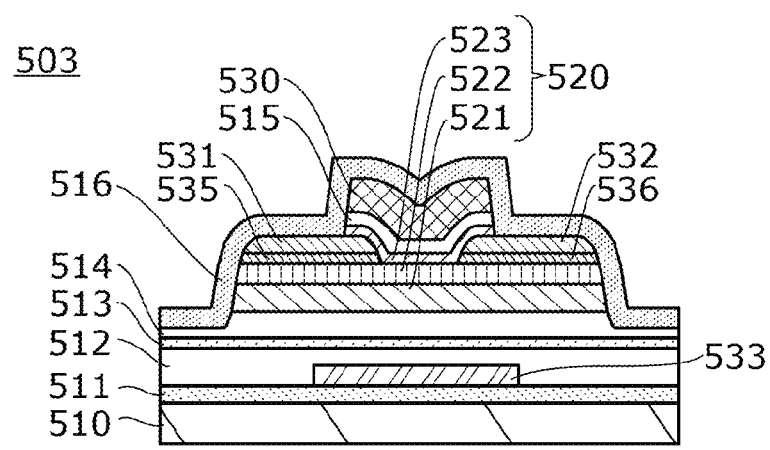

An OS transistor 503 in FIG. 29B has a device structure in which conductive layers 535 and 536 are added to the OS transistor 502. A pair of electrodes functioning as a source electrode and a drain electrode of the OS transistor 503 are formed using a stack of the conductive layers 531 and 535 and a stack of the conductive layers 532 and 536.

The conductive layers 535 and 536 are formed using a single-layer or multilayer conductor. The conductive layers 535 and 536 may be formed using a conductor containing, for example, one or more kinds of elements selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound may be used, for example, and a conductor containing aluminum, a conductor containing copper and titanium, a conductor containing copper and manganese, a conductor containing indium, tin, and oxygen, a conductor containing titanium and nitrogen, or the like may be used as the conductor.

The conductive layers 535 and 536 may have a property of transmitting visible light. Alternatively, the conductive layers 535 and 536 may have a property of not transmitting visible light, ultraviolet light, infrared light, or an X-ray by reflecting or absorbing it. In some cases, such a property can suppress a change in electrical characteristics of the OS transistor 503 due to stray light.

The conductive layers 535 and 536 may preferably be formed using a layer that does not form a Schottky barrier with the semiconductor layer 522 or the like. Accordingly, on-state characteristics of the OS transistor 503 can be improved.

The conductive layers 535 and 536 preferably have higher resistance than the conductive layers 531 and 532 according to circumstances. The conductive layers 535 and 536 preferably have lower resistance than the channel (the semiconductor layer 522) of the OS transistor 503 according to circumstances. For example, the conductive layers 535 and 536 may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive layers 535 and 536 having resistivity within the above range can reduce electric field concentration in a boundary portion between the channel and the drain. Therefore, a change in electrical characteristics of the OS transistor 503 can be suppressed. In addition, punch-through current generated by an electric field from the drain can be reduced. Thus, a transistor with small channel length can have favorable saturation characteristics. Note that in a circuit configuration where the source and the drain do not interchange, only one of the conductive layers 535 and 536 (e.g., the layer on the drain side) is preferably provided according to circumstances.

<<Structure Example 4 of OS Transistor>>

Figure 29C:
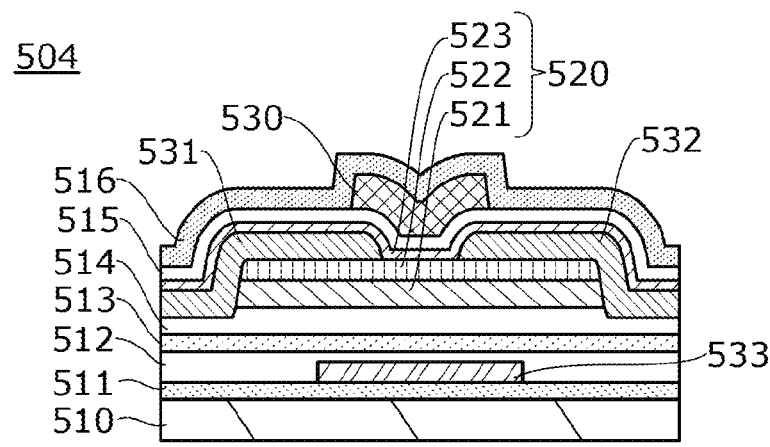

In the OS transistor 501 in FIGS. 27A to 27D, the conductive layers 531 and 532 may be in contact with side surfaces of the semiconductor layers 521 and 522. Such a structure example is illustrated in FIG. 29C. In an OS transistor 504 in FIG. 29C, the conductive layers 531 and 532 may be in contact with side surfaces of the semiconductor layers 521 and 522.

In a manufacturing process of a semiconductor device including an OS transistor, the insulators, the conductors, and the semiconductors can be formed by a sputtering method, a chemical vapor deposition (CVD) method, a molecular beam epitaxy (MBE) method, an atomic layer deposition (ALD) method, a pulsed laser deposition (PLD) method, or the like. A CVD method includes a thermal CVD method, a metal organic CVD (MOCVD) method, and a plasma enhanced CVD (PECVD) method. For example, it is preferable that an insulating film be formed by a CVD method, further preferably a PECVD method for improving coverage. In the case where an insulating film is formed by a CVD method, it is preferable to use a thermal CVD method, an MOCVD method, or an ALD method in order to reduce plasma damage.

<<Device Structure Example of Memory Device>>

An OS transistor can be stacked over an element layer in which a Si transistor and the like are formed. The memory device of Embodiment 1 can have a device structure in which a Si transistor and an OS transistor are stacked. Here, taking a memory cell array including the memory cell 11 (FIG. 1B) as an example, a device structure of such a memory device is described. FIG. 30, FIG. 31, FIG. 32, and FIG. 33 are drawings for describing the device structure of the memory device.

Figure 30:
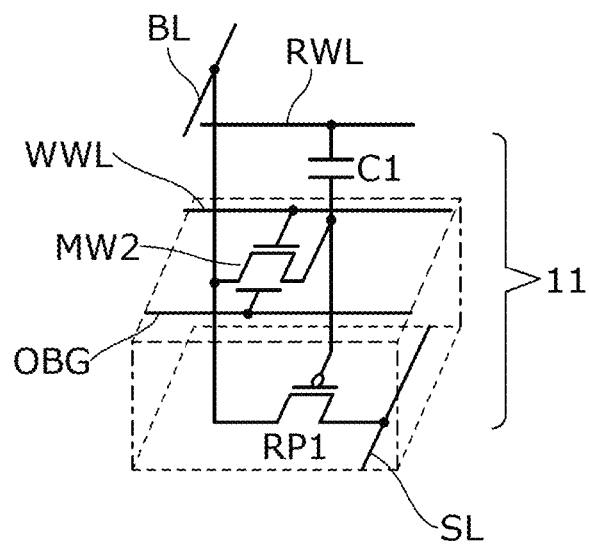
FIG. 30 is a circuit diagram schematically illustrating a device structure of a memory cell array.
Figure 33:
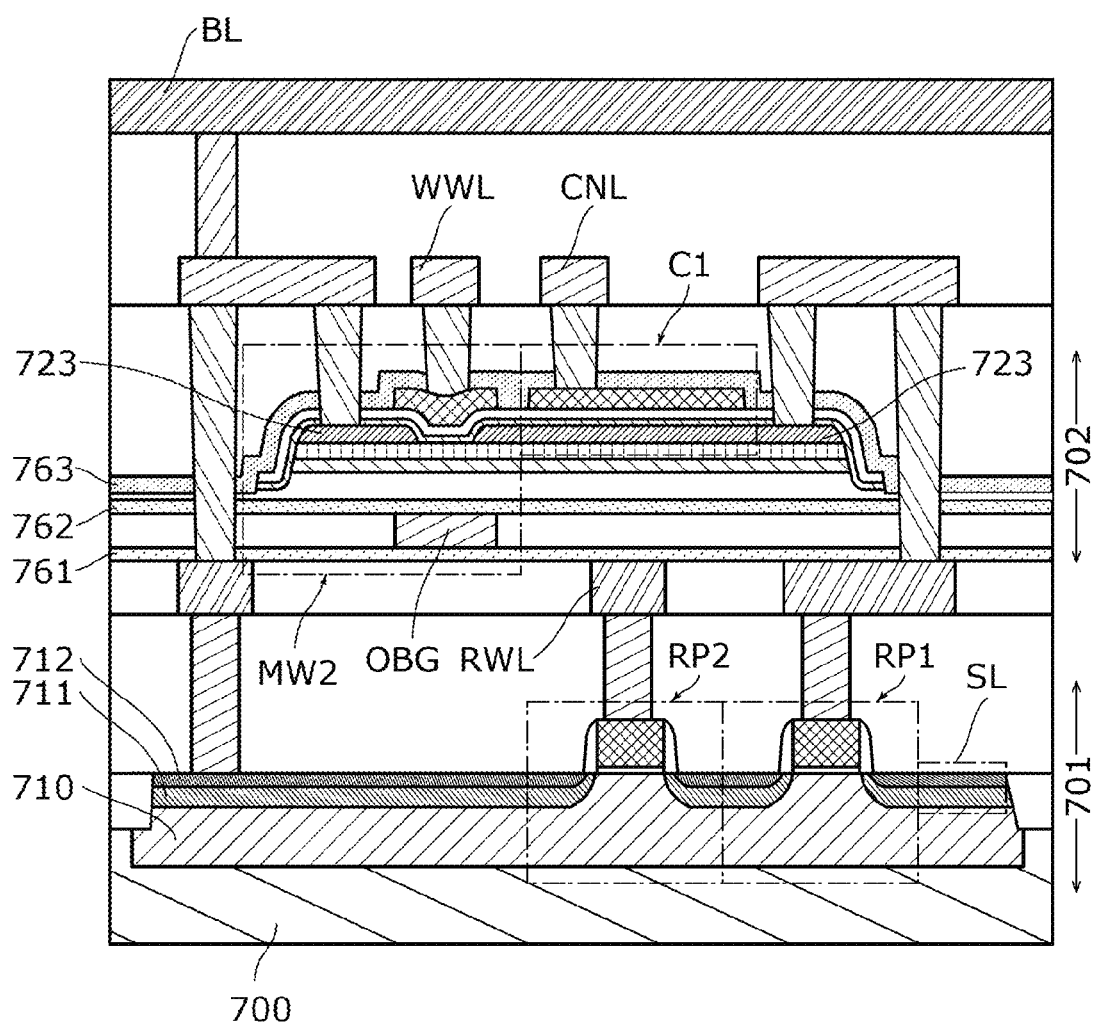
FIG. 33 is a cross-sectional view illustrating a device structure example of a memory cell array.

The device structure is described taking a memory cell array 312 including a plurality of memory cells 11 as an example. FIG. 30 is a circuit diagram schematically illustrating a device structure of the memory cell array 312. FIG. 33 illustrates one memory cell 11. As illustrated in FIG. 30, in the memory cell array 312, the transistor MW2 is stacked over the transistor RP1, and the capacitor C1 is stacked over the transistor MW2. The back gate of the transistor MW2 is electrically connected to the wiring OBG.

Figure 31:
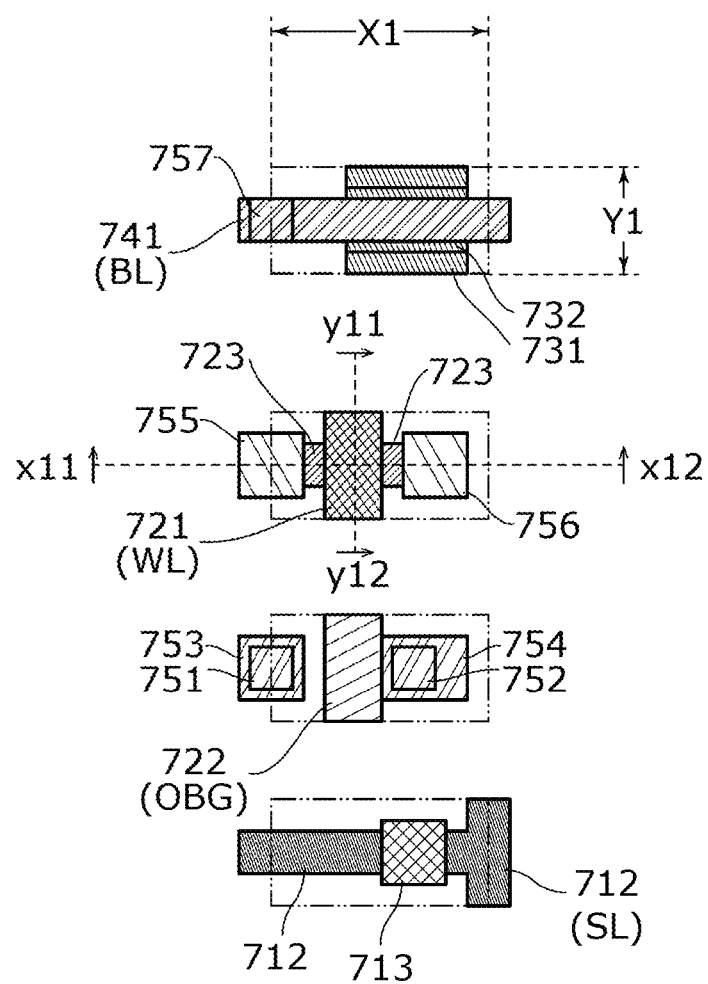
FIG. 31 is an exploded plan view illustrating a layout example of a memory cell array.
Figure 32:
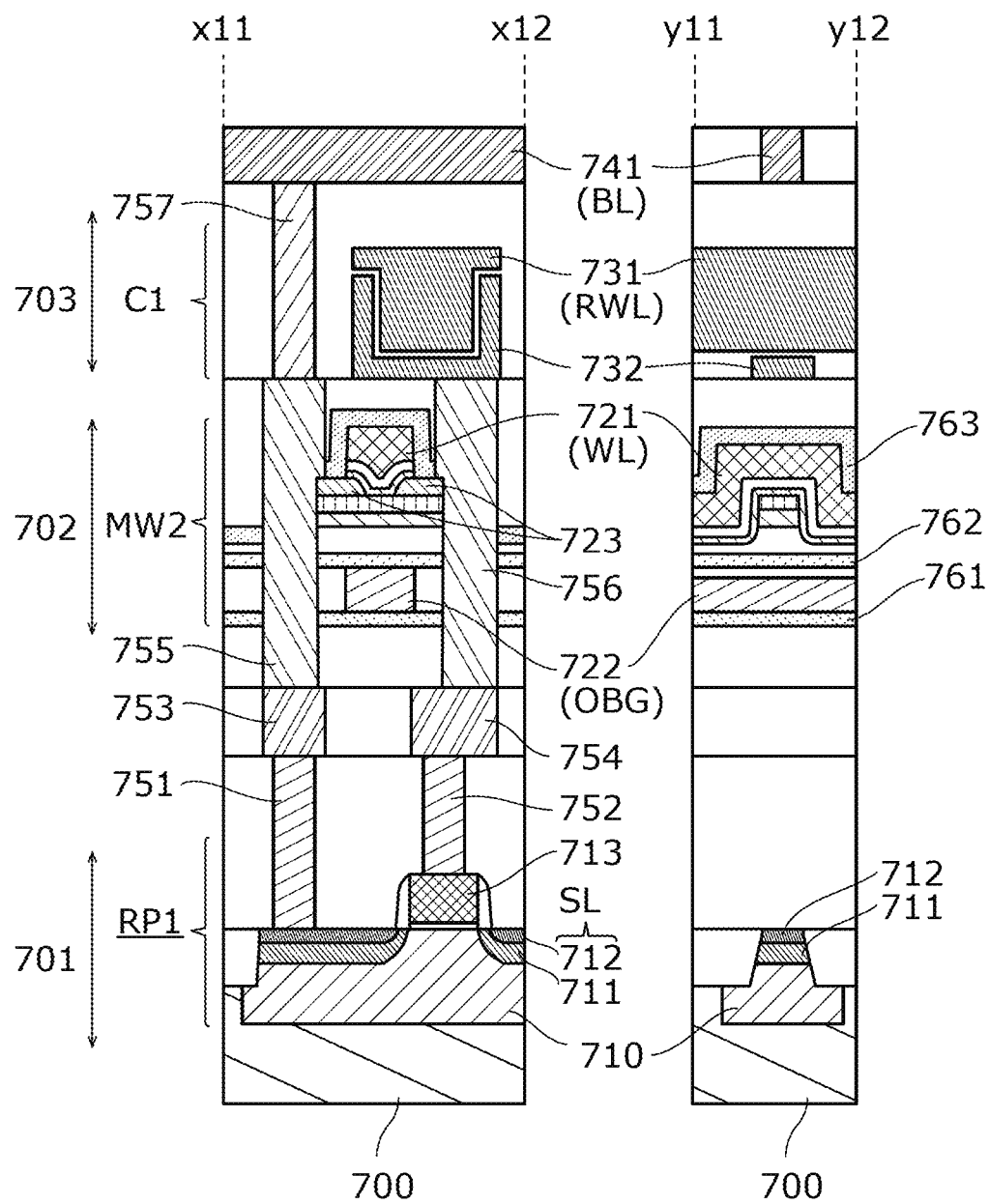
FIG. 32 is a cross-sectional view along a line x11-x12 and a line y11-y12 of FIG. 31.

FIG. 31 is an exploded plan view illustrating a layout example of the memory cell array 312. In FIG. 31, some components are not illustrated. FIG. 32 illustrates cross-sectional views along the line x11-x12 and the line y11-y12 of FIG. 31. The cross-sectional view along the line x11-x12 illustrates the transistor MW2 in the channel length direction, and the cross-sectional view along the line y11-y12 illustrates the transistor MW2 in the channel width direction. In FIG. 32, regions that are not denoted by reference numerals or are not hatched are regions formed of insulators. Reference numerals 761 to 763 each denote an insulating layer.

The memory cell array 312 is formed on a single crystal silicon wafer 700. Element layers 701 to 703 are formed over the single crystal silicon wafer 700. The element layers 701, 702, and 703 are layers in which a Si transistor, an OS transistor, and a capacitor are formed, respectively.

A p-type well 710 is formed on the single crystal silicon wafer 700. The transistor RP1 is formed on the p-type well 710. The transistor RP1 includes p-type impurity regions 711 and 712 and a conductor 713. The conductor 713 forms the gate electrode of the transistor RP1. The wiring SL is formed of the p-type impurity regions 711 and 712.

The device structure of the transistor MW2 is similar to that of the OS transistor 502 (FIG. 29A). A conductor 721 forms a gate electrode of the transistor MW2 and the wiring WL. A conductor 722 forms the back gate electrode of the transistor MW2 and the wiring OBG. A pair of conductors 723 form a source electrode and a drain electrode of the transistor MW2. The capacitor C1 includes a conductor 731 and a conductor 732. The conductor 731 forms the wiring RWL. A conductor 741 forms the wiring BL.

The transistors RP1 and MW2, the capacitor C1, and the wirings WWL, RWL, BL, and SL are electrically connected through conductors 751 to 757; thus, the memory cell array 312 is formed.

By forming the transistor MW2 and the capacitor C1 in different element layers, the size of the memory cell 11 can be reduced and in addition a capacitance for holding the voltage of the node SN can be obtained. For example, the size of the memory cell 11 can be 5.25 F (X1)×2.5 F (Y1); in this case, the area of the memory cell 11 becomes 13.25 $F^2$. Note that F is the minimum feature size. For example, in the case where the capacitance of the capacitor C1 is 0.1 fF, the area of the capacitor C1 is set at 60 nm×60 nm=360 $nm^2$, and the dielectric is made to have an equivalent oxide thickness of 10 nm.

In the memory cell array of Embodiment 1, the OS transistor and the storage capacitor may be formed in the same element layer. FIG. 33 illustrates an example of such a case. FIG. 33 illustrates a device structure example of the memory cell array 311 (FIG. 15). In FIG. 33, regions that are not denoted by reference numerals or are not hatched are formed of an insulator. Further, regions that are hatched but not denoted by reference numerals are formed of conductors and form wirings and electrodes. By these conductors, the memory cell 16 is electrically connected to the wirings WWL, RWL, BL, SL, CNL, and OBG.

The transistor MW2 has a device structure similar to that of the OS transistor 501 (FIGS. 27A to 27D). The capacitor C1 is formed in the same process as the transistor MW2, leading to a reduction in the number of manufacturing steps of the memory device including the memory cell array 311. One of the pair of electrodes of the capacitor C1 is formed of the conductor 723, and the other is formed of a conductor formed using the same layer as the gate electrode of the transistor MW2.

Embodiment 4

Structure of Oxide Semiconductor

In this embodiment, the structure of an oxide semiconductor will be described. In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°. In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<<CAAC-OS>>

First, a CAAC-OS will be described. The CAAC-OS is one of oxide semiconductors having a plurality of c-axis aligned crystal parts (also referred to as pellets).

A CAAC-OS observed by a transmission electron microscope (TEM) is described below. In a combined analysis image (also referred to as a high-resolution TEM image) of a bright-field image and a diffraction pattern of a CAAC-OS, which is obtained using a TEM, a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 34A:
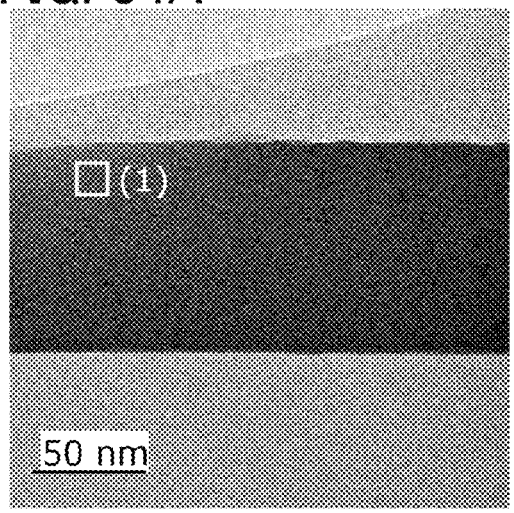
FIGS. 34A to 34C are Cs-corrected high-resolution TEM images of a cross section of a CAAC-OS.

FIG. 34A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 34B:
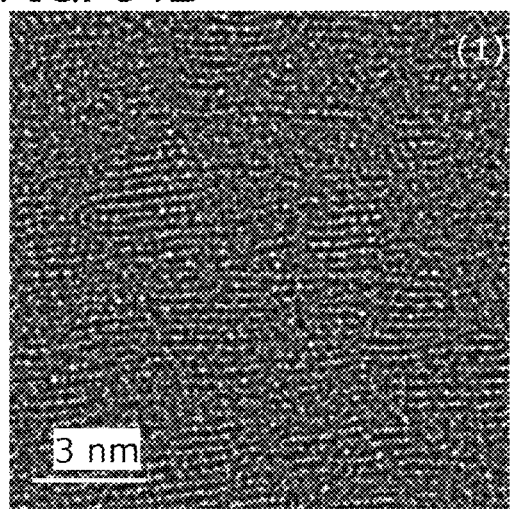

FIG. 34B is an enlarged Cs-corrected high-resolution TEM image of a region (1) in FIG. 34A. FIG. 34B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 34C:
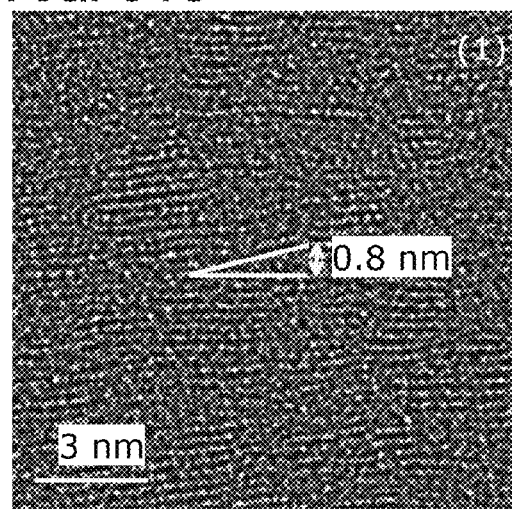

As shown in FIG. 34B, the CAAC-OS has a characteristic atomic arrangement. The characteristic atomic arrangement is denoted by an auxiliary line in FIG. 34C. FIGS. 34B and 34C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 34D:
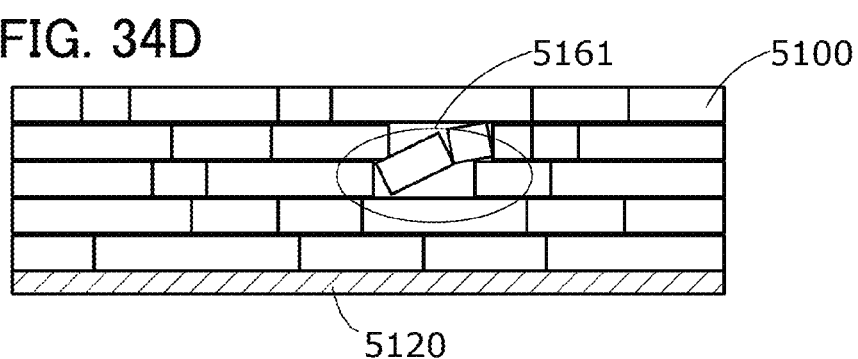
FIG. 34D is a schematic cross-sectional view of a CAAC-OS.

Here, according to the Cs-corrected high-resolution TEM images, the schematic arrangement of pellets 5100 of a CAAC-OS over a substrate 5120 is illustrated by such a structure in which bricks or blocks are stacked (see FIG. 34D). The part in which the pellets are tilted as observed in FIG. 34C corresponds to a region 5161 shown in FIG. 34D.

FIG. 35A shows a Cs-corrected high-resolution TEM image of a plane of the CAAC-OS observed from a direction substantially perpendicular to the sample surface. FIGS. 35B, 35C, and 35D are enlarged Cs-corrected high-resolution TEM images of regions (1), (2), and (3) in FIG. 35A, respectively. FIGS. 35B, 35C, and 35D indicate that metal atoms are arranged in a triangular, quadrangular, or hexagonal configuration in one pellet. There is no regularity of arrangement of metal atoms observed between different pellets.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31° as shown in FIG. 36A. This peak is attributed to the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

In structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 36B, a peak is not clearly observed. In contrast, in the case of a single crystal oxide semiconductor of $InGaZnO_4$, when φ scan is performed with 2θ fixed at around 56°, as shown in FIG. 36C, six peaks which are attributed to crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 37A can be obtained. In this diffraction pattern, spots attributed to the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 37B shows a diffraction pattern obtained in such a manner that an electron beam with a probe diameter of 300 nm is incident on the same sample in a direction perpendicular to the sample surface. As shown in FIG. 37B, a ring-like diffraction pattern is observed. Thus, the electron diffraction also indicates that the a-axes and b-axes of the pellets included in the CAAC-OS do not have regular alignment. The first ring in FIG. 37B is considered to be attributed to the (010) plane, the (100) plane, and the like of the InGaZnO$_4$ crystal. The second ring in FIG. 37B is considered to be attributed to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

The impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density. Specifically, an oxide semiconductor with a carrier density of lower than $8\times10^{11}/cm^3$, preferably lower than $1\times10^{11}/cm^3$, further preferably lower than $1\times10^{10}/cm^3$, and is higher than or equal to $1\times10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<<nc-OS>>

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<<a-Like OS>>

An a-like OS has a structure intermediate between those of the nc-OS and the amorphous oxide semiconductor. In a high-resolution TEM image of the a-like OS, a void may be observed. Furthermore, in the high-resolution TEM image, there are a region where a crystal part is clearly observed and a region where a crystal part is not observed. The a-like OS has an unstable structure because it contains a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 38:
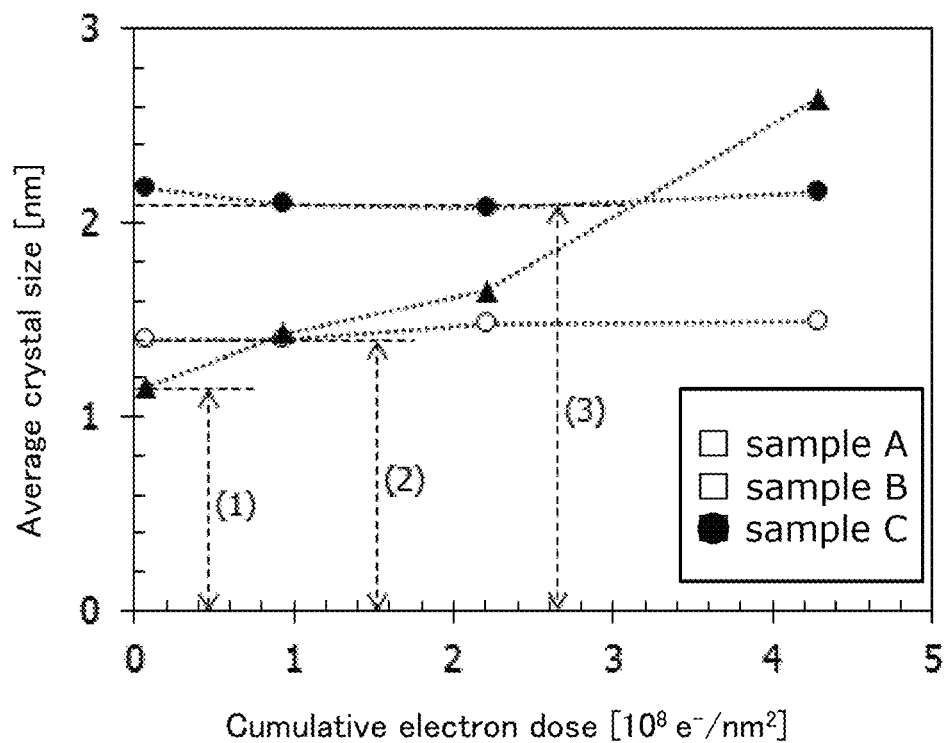
FIG. 38 shows a change of crystal parts of In—Ga—Zn oxides by electron irradiation.

FIG. 38 shows change in the average size of crystal parts (at 22 points to 45 points) in each sample. Note that the crystal part size corresponds to the length of a lattice fringe. FIG. 38 indicates that the crystal part size in the a-like OS increases with an increase in the cumulative electron dose. Specifically, as shown by (1) in FIG. 38, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 38, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

In each of the above Embodiments, one or a plurality of embodiments of the present invention are described; however, embodiments of the present invention are not limited to the above-described embodiments. In other words, since various embodiments of the invention are described in this specification and the like, one embodiment of the present invention is not limited to a particular embodiment. Although the example where the oxide semiconductor is included in the channel formation region, the source region, the drain region, and the like of the transistor is described as one embodiment of the present invention, one embodiment of the present invention is not limited to this example. Depending on the case or circumstances, a variety of semiconductors may be used for transistors in one embodiment of the present invention, the channel formation regions of the transistors, the source and drain regions of the transistors, and the like. Depending on the case or circumstances, transistors in one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the case or circumstances, transistors in one embodiment of the present invention, the channel formation regions of the transistors, the source and drain regions of the transistors, and the like do not necessarily include an oxide semiconductor. Furthermore, for example, the example where one memory cell includes one or more capacitors and two or more transistors is described as one embodiment of the present invention; however, one embodiment of the present invention is not limited to this example. Depending on the case or circumstances, a memory cell of one embodiment of the present invention may include various number of capacitors and various number of transistors. For example, depending on the case or circumstances, a memory cell of one embodiment of the present invention may include no capacitor and one transistor. Furthermore, depending on the case or circumstances, a memory cell of one embodiment of the present invention may be a flash memory, a NAND flash memory, or a NOR flash memory. Moreover, although an example where a transistor included in one memory cell does not have a floating gate is described as one embodiment of the present invention, one embodiment of the present invention is not limited to this example. Depending on the case or circumstances, a transistor included in one memory cell of one embodiment of the present invention may have a floating gate. In such a case, not a conductive layer or a semiconductor layer but an inorganic insulating film, e.g., a silicon nitride film, may be used as the floating gate.

This application is based on Japanese Patent Application serial no. 2014-250006 filed with Japan Patent Office on Dec. 10, 2014, the entire contents of which are hereby incorporated by reference.

What is claimed is:

1. A memory device comprising:
a memory cell; and
a circuit,
wherein the memory cell is configured to retain 1-bit data of "0" or "1",
wherein the memory cell is in any of four data states, the four data states being a state A_1, a state A_2, a state A_3, and a state A_4,
wherein V_1, V_2, and V_3 are voltages,
wherein a threshold level of the state A_1 is lower than V_1,
wherein a threshold level of the state A_2 is higher than V_1 and lower than V_2,
wherein a threshold level of the state A_3 is higher than V_2 and lower than V_3,
wherein a threshold level of the state A_4 is higher than V_3,
wherein the circuit is electrically connected to the memory cell so as to write 1-bit data into the memory cell and read out 1-bit data from the memory cell,
wherein the circuit is configured to:
bring the memory cell into the state A_1 at the time of writing "0" into the memory cell and bring the memory cell into the state A_4 at the time of writing "1" into the memory cell;
make a first determination whether a threshold of the memory cell is lower than V_1,
make a second determination whether the threshold of the memory cell is lower than V_2,
make a third determination whether the threshold of the memory cell is lower than V_3,
make the second determination and read out 1-bit data from the memory cell,
make the first to third determinations and, when the memory cell is in the state A_2, bring the memory cell into the state A_1, and
make the first to third determinations and, when the memory cell is in the state A_3, bring the memory cell into the state A_4.

2. The memory device according to claim 1,
wherein an interval between threshold distributions of the data states A_1 to A_4 is not constant.

3. The memory device according to claim 1,
wherein the memory cell comprises a storage node, a capacitor, and a first transistor,
wherein the capacitor is configured to hold a voltage of the storage node,
wherein the first transistor is configured to control charging and discharging of the storage node,
wherein an active layer of the first transistor comprises an oxide semiconductor, and
wherein the threshold of the memory cell is determined by the voltage of the storage node.

4. The memory device according to claim 1,
wherein the memory cell is electrically connected to a first wiring, a second wiring, a third wiring, and a fourth wiring,
wherein the memory cell comprises a storage node, a first transistor, a second transistor, and a capacitor,
wherein the threshold of the memory cell is determined by a voltage of the storage node,
wherein a gate of the first transistor is electrically connected to the first wiring,
wherein the capacitor capacitively couples the second wiring and the storage node to each other,
wherein a gate of the second transistor is electrically connected to the storage node,
wherein a first terminal of the second transistor is electrically connected to the third wiring,
wherein a second terminal of the second transistor is electrically connected to the fourth wiring,
wherein the first transistor is configured to control a conduction state between the fourth wiring and the storage node, and
wherein an active layer of the first transistor comprises an oxide semiconductor.

5. The memory device according to claim 1,
wherein the memory cell is electrically connected to a first wiring, a second wiring, a third wiring, a fourth wiring, and a fifth wiring,
wherein the memory cell comprises a storage node, a first transistor, a second transistor, a third transistor, and a capacitor,
wherein the threshold of the memory cell is determined by a voltage of the storage node,
wherein a gate of the first transistor is electrically connected to the first wiring,
wherein a gate of the second transistor is electrically connected to the storage node,
wherein a gate of the third transistor is electrically connected to the second wiring,
wherein a first terminal of the second transistor is electrically connected to the third wiring,
wherein the first transistor is configured to control a conduction state between the fourth wiring and the storage node,
wherein the third transistor is configured to control a conduction state between the fourth wiring and a second terminal of the second transistor,
wherein the capacitor capacitively couples the fifth wiring and the storage node to each other, and
wherein an active layer of the first transistor comprises an oxide semiconductor.

6. The memory device according to claim 5,
wherein the memory cell is electrically connected to a sixth wiring, and
wherein the third transistor is configured to control a conduction state between the sixth wiring and the second terminal of the second transistor.

7. A semiconductor device comprising:
the memory device according to claim 1; and
a processor core.

8. A semiconductor device comprising:
the memory device according to claim 1;
a control circuit; and
an antenna.

9. An electronic component comprising:
a chip; and
a lead,
wherein the chip comprises the memory device according to claim 1, and
wherein the lead is electrically connected to the chip.

10. An electronic device comprising:
the memory device according to claim 1; and
at least one of a housing, a microphone, a speaker, and an operation key.

11. A memory device comprising:
a memory cell; and
a circuit,
wherein the memory cell is configured to retain (N−1)-bit data, where N is an integer of more than or equal to 2,
wherein the memory cell has any of $2^N$ data states which are states $A\_1$ to $A\_2^N$,
wherein threshold levels of the states $A\_1$ to $A\_2^N$ are separated by $(2^N-1)$ voltages which are $V\_1$ to $V\_(2^N-1)$,
wherein the threshold level of the state $A\_1$ is lower than $V\_1$,
wherein the threshold level of a state $A\_h$ is higher than $V\_(h-1)$ and lower than $V\_h$, where h is an integer of more than or equal to 2 and less than or equal to $(2^N-1)$,
wherein the threshold level of the state $A\_2^N$ is higher than $V\_(2^N-1)$,
wherein the circuit is electrically connected to the memory cell so as to write the (N−1)-bit data into the memory cell and read out the (N−1)-bit data from the memory cell, and
wherein the circuit is configured to:
bring the memory cell into a state $A\_i$ corresponding to the (N−1)-bit data at the time of writing the (N−1)-bit data, where i is 1 or an even number of more than or equal to 4 and less than or equal to $2^N$;
make first to $(2^N-1)$-th determinations,
wherein in the j-th determination, whether a threshold of the memory cell is lower than $V\_j$ is determined, where j is an integer of more than or equal to 1 and less than or equal to $(2^N-1)$;
make the first to $(2^N-1)$-th determinations and, when the threshold of the memory cell is higher than $V\_1$ and lower than $V\_2$, bring the memory cell into the state $A\_1$; and
make the first to $(2^N-1)$-th determinations and, when the threshold of the memory cell is higher than $V\_k$ and lower than $V\_k+1$, bring the memory cell into the state $A\_(k+2)$, where k is an even number of more than or equal to 2 and less than or equal to $(2^N-2)$.

12. The memory device according to claim 11,
wherein an interval between threshold distributions of the data states $A\_1$ to $A\_2^N$ is not constant.

13. The memory device according to claim 11,
wherein the circuit is configured to make an even-numbered determination among the second to $(2^N-1)$-th determinations at the time of reading out the (N−1)-bit data.

14. The memory device according to claim 11,
wherein the memory cell comprises a storage node, a capacitor, and a first transistor,
wherein the capacitor is configured to hold a voltage of the storage node,
wherein the first transistor is configured to control charging and discharging of the storage node,
wherein an active layer of the first transistor comprises an oxide semiconductor, and
wherein the threshold of the memory cell is determined by the voltage of the storage node.

15. The memory device according to claim 11,
wherein the memory cell is electrically connected to a first wiring, a second wiring, a third wiring, and a fourth wiring,
wherein the memory cell comprises a storage node, a first transistor, a second transistor, and a capacitor,
wherein the threshold of the memory cell is determined by a voltage of the storage node,
wherein a gate of the first transistor is electrically connected to the first wiring,
wherein the capacitor capacitively couples the second wiring and the storage node to each other,
wherein a gate of the second transistor is electrically connected to the storage node,
wherein a first terminal of the second transistor is electrically connected to the third wiring,
wherein a second terminal of the second transistor is electrically connected to the fourth wiring,
wherein the first transistor is configured to control a conduction state between the fourth wiring and the storage node, and
wherein an active layer of the first transistor comprises an oxide semiconductor.

16. The memory device according to claim 11,
wherein the memory cell is electrically connected to a first wiring, a second wiring, a third wiring, a fourth wiring, and a fifth wiring,
wherein the memory cell comprises a storage node, a first transistor, a second transistor, a third transistor, and a capacitor,
wherein the threshold of the memory cell is determined by a voltage of the storage node,
wherein a gate of the first transistor is electrically connected to the first wiring,
wherein a gate of the second transistor is electrically connected to the storage node,
wherein a gate of the third transistor is electrically connected to the second wiring,
wherein a first terminal of the second transistor is electrically connected to the third wiring,
wherein the first transistor is configured to control a conduction state between the fourth wiring and the storage node,
wherein the third transistor is configured to control a conduction state between the fourth wiring and a second terminal of the second transistor,
wherein the capacitor capacitively couples the fifth wiring and the storage node to each other, and
wherein an active layer of the first transistor comprises an oxide semiconductor.

17. The memory device according to claim 16,
wherein the memory cell is electrically connected to a sixth wiring, and
wherein the third transistor is configured to control a conduction state between the sixth wiring and the second terminal of the second transistor.

18. A semiconductor device comprising:
the memory device according to claim 11; and
a processor core.

19. A semiconductor device comprising:
the memory device according to claim 11;
a control circuit; and
an antenna.

20. An electronic component comprising:
a chip; and
a lead,
wherein the chip comprises the memory device according to claim 11, and
wherein the lead is electrically connected to the chip.

21. An electronic device comprising:
the memory device according to claim 11; and
at least one of a housing, a microphone, a speaker, and an operation key.

22. A memory device comprising:
a memory cell; and
a circuit,
wherein the memory cell is configured to retain 1-bit data of "0" or "1",
wherein the memory cell is in any of three data states, the three data states being a state $A\_1$, a state $A\_2$, and a state $A\_3$,
wherein $V\_1$, $V\_2$, and $V\_3$ are voltages,
wherein a threshold level of the state $A\_1$ is lower than $V\_1$,
wherein a threshold level of the state $A\_2$ is higher than $V\_1$ and lower than $V\_2$,
wherein a threshold level of the state $A\_3$ is higher than $V\_2$, and
wherein the circuit is configured to bring the memory cell into the state $A\_3$ when the memory cell is in the state $A\_2$.

* * * * *